(12) United States Patent
Fujii et al.

(10) Patent No.: US 8,987,807 B2
(45) Date of Patent: *Mar. 24, 2015

(54) NONVOLATILE SEMICONDUCTOR MEMORY DEVICE AND METHOD OF MANUFACTURING THE SAME

(71) Applicant: Kabushiki Kaisha Toshiba, Tokyo (JP)

(72) Inventors: Shosuke Fujii, Yokohama (JP); Kiwamu Sakuma, Yokohama (JP); Jun Fujiki, Yokohama (JP); Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

This patent is subject to a terminal disclaimer.

(21) Appl. No.: 13/622,612

(22) Filed: Sep. 19, 2012

(65) Prior Publication Data

US 2013/0015519 A1 Jan. 17, 2013

Related U.S. Application Data

(63) Continuation of application No. PCT/JP2010/054771, filed on Mar. 19, 2010.

(51) Int. Cl.
*H01L 29/792* (2006.01)
*H01L 27/115* (2006.01)

(52) U.S. Cl.
CPC .... *H01L 27/11551* (2013.01); *H01L 27/11521* (2013.01); *H01L 27/11578* (2013.01); *H01L 27/11519* (2013.01); *H01L 27/11565* (2013.01)
USPC ..... 257/326; 257/324; 257/325; 257/E21.219

(58) Field of Classification Search
CPC .............. H01L 27/11551; H01L 27/11565; H01L 27/11519; H01L 27/11578; H01L 27/11521; H01L 27/1157; H01L 27/11568; H01L 27/11563

USPC ........................... 257/324, 325, 326, E21.219
See application file for complete search history.

(56) References Cited

U.S. PATENT DOCUMENTS 7,352,018 B2 * 4/2008 Specht et al. ................. 257/204
7,842,994 B2 11/2010 Yin et al.

(Continued)

FOREIGN PATENT DOCUMENTS

JP 2004-152893 5/2004
JP 2006-128390 5/2006

(Continued)

OTHER PUBLICATIONS

English translation of the International Preliminary Report on Patentability issued Nov. 1, 2012 in PCT/JP2010/054771 filed Mar. 19, 2010.

(Continued)

*Primary Examiner* — Jarrett Stark
(74) *Attorney, Agent, or Firm* — Oblon, McClelland, Maier & Neustadt, L.L.P.

(57) ABSTRACT

According to one embodiment, a nonvolatile semiconductor memory device includes first to n-th semiconductor layers which are stacked in a first direction perpendicular to a surface of a semiconductor substrate and which extend in a second direction parallel to the surface of the semiconductor substrate, an electrode which extends in the first direction along side surfaces of the first to n-th semiconductor layers, the side surfaces of the first to n-th semiconductor layers exposing in a third direction perpendicular to the first and second directions, and first to n-th charge storage layers located between the first to n-th semiconductor layers and the electrode respectively. The first to n-th charge storage layers are separated from each other in areas between the first to n-th semiconductor layers.

16 Claims, 61 Drawing Sheets

(56) References Cited

U.S. PATENT DOCUMENTS

| | | |
|---|---|---|
| 7,969,789 B2 | 6/2011 | Katsumata et al. |
| 8,008,732 B2 | 8/2011 | Kiyotoshi et al. |
| 8,017,993 B2 | 9/2011 | Kidoh et al. |
| 8,247,857 B2 | 8/2012 | Ozawa et al. |
| 8,710,580 B2 * | 4/2014 | Sakuma et al. ............... 257/324 |
| 2006/0091556 A1 | 5/2006 | Shigeoka |
| 2007/0290223 A1 | 12/2007 | Yagishita |
| 2008/0258203 A1 | 10/2008 | Happ et al. |
| 2011/0272745 A1 | 11/2011 | Kiyotoshi et al. |
| 2011/0284946 A1 | 11/2011 | Kiyotoshi |
| 2012/0139030 A1 * | 6/2012 | Sakuma et al. ............... 257/326 |
| 2012/0280303 A1 | 11/2012 | Kiyotoshi et al. |

FOREIGN PATENT DOCUMENTS

| | | |
|---|---|---|
| JP | 2007-317920 | 12/2007 |
| JP | 2008-078404 | 4/2008 |
| JP | 2008-199013 | 8/2008 |
| JP | 2009-027136 | 2/2009 |
| JP | 2009-238874 | 10/2009 |
| JP | 2009-295617 | 12/2009 |
| JP | 2009-295837 | 12/2009 |
| JP | 2010-010596 | 1/2010 |
| JP | 2010-021191 | 1/2010 |
| JP | 2010-040122 | 2/2010 |
| WO | WO 2009/119527 | 10/2009 |

OTHER PUBLICATIONS

English translation of the Written Opinion of the International Searching Authority issued Jun. 22, 2010 in PCT/JP2010/054771 filed Mar. 19, 2010.
U.S. Appl. No. 13/547,567, filed Jul. 12, 2012, Sakuma et al.
International Search Report issued Jun. 22, 2010 in PCT/JP2010/054771 filed Mar. 19, 2010.
U.S. Appl. No. 13/895,660, filed May 16, 2013, Sakuma, et al.

* cited by examiner

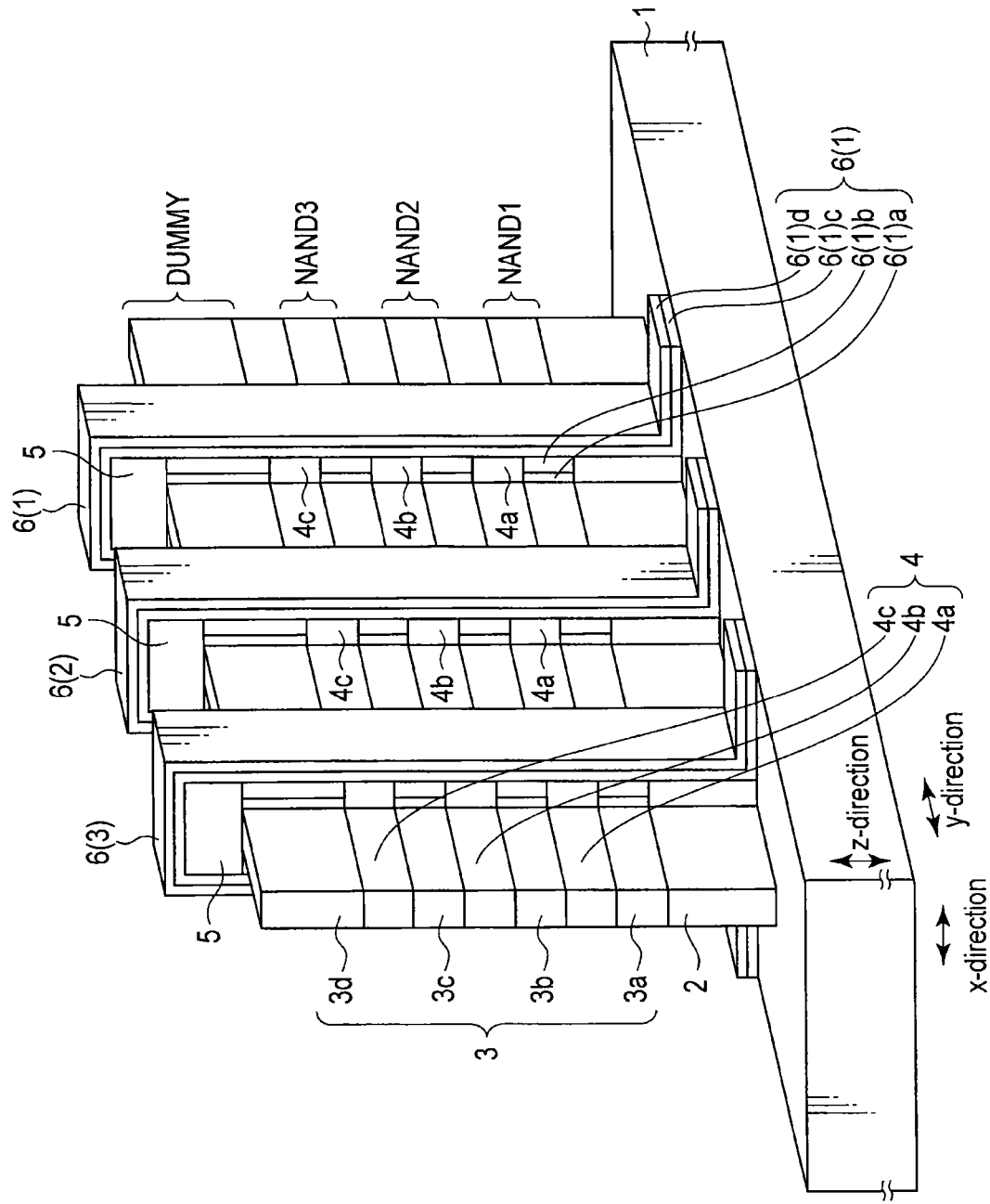
F I G. 3

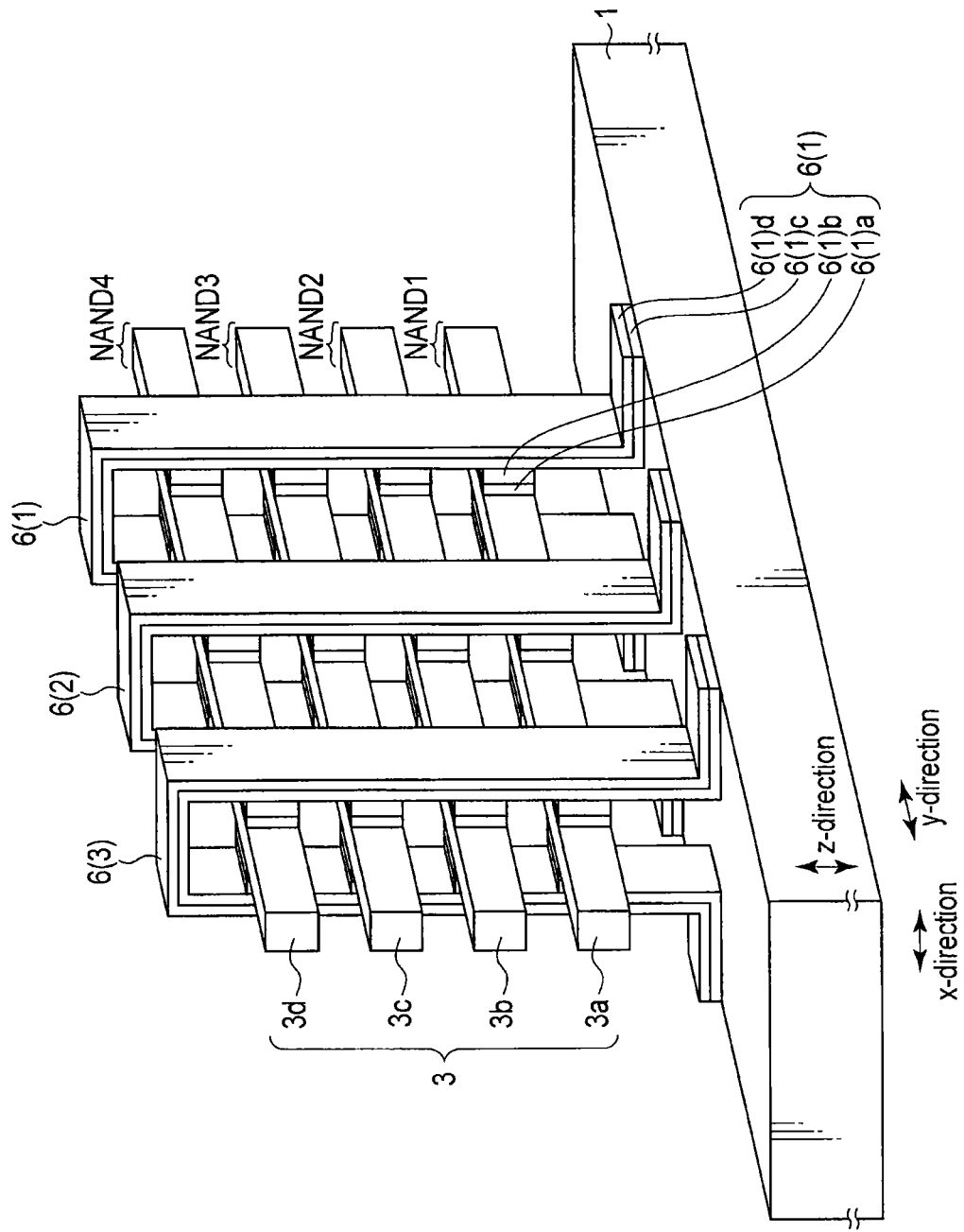
F I G. 4

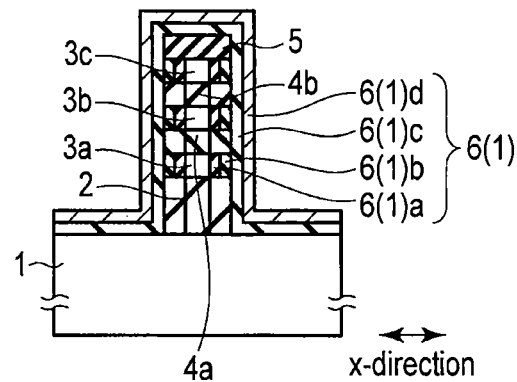
F I G. 7
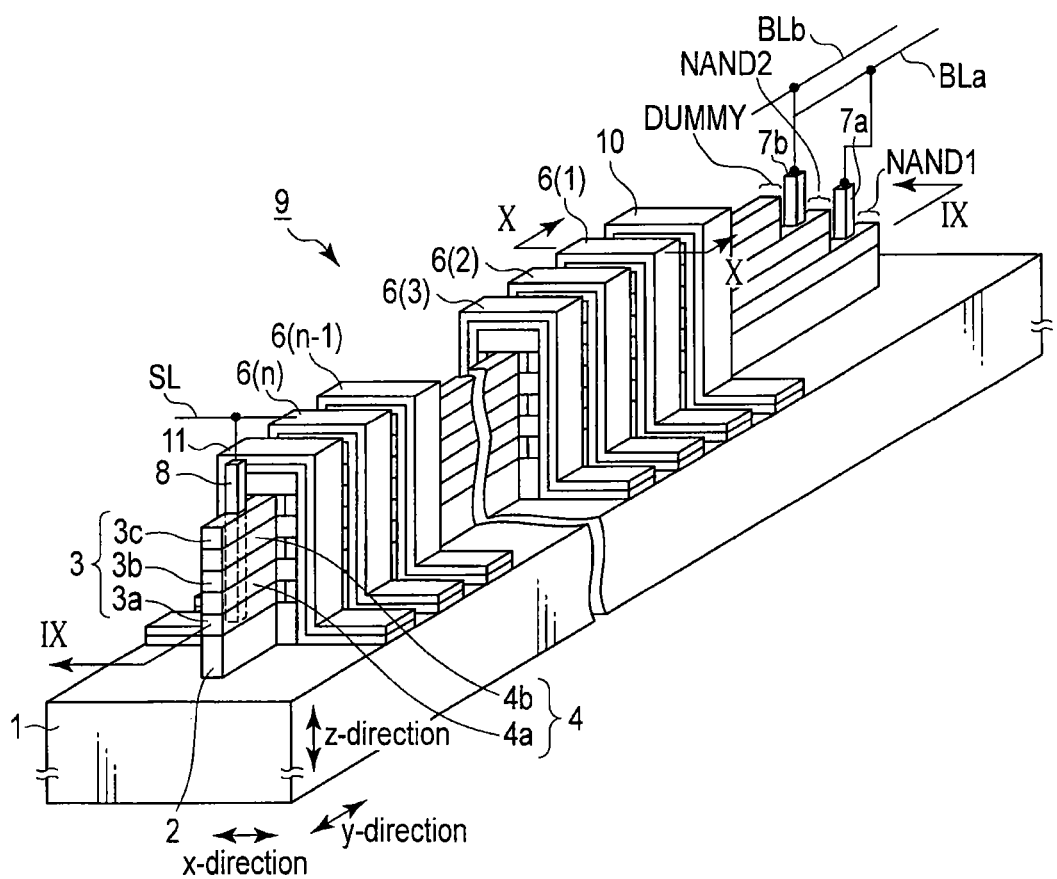
F I G. 8

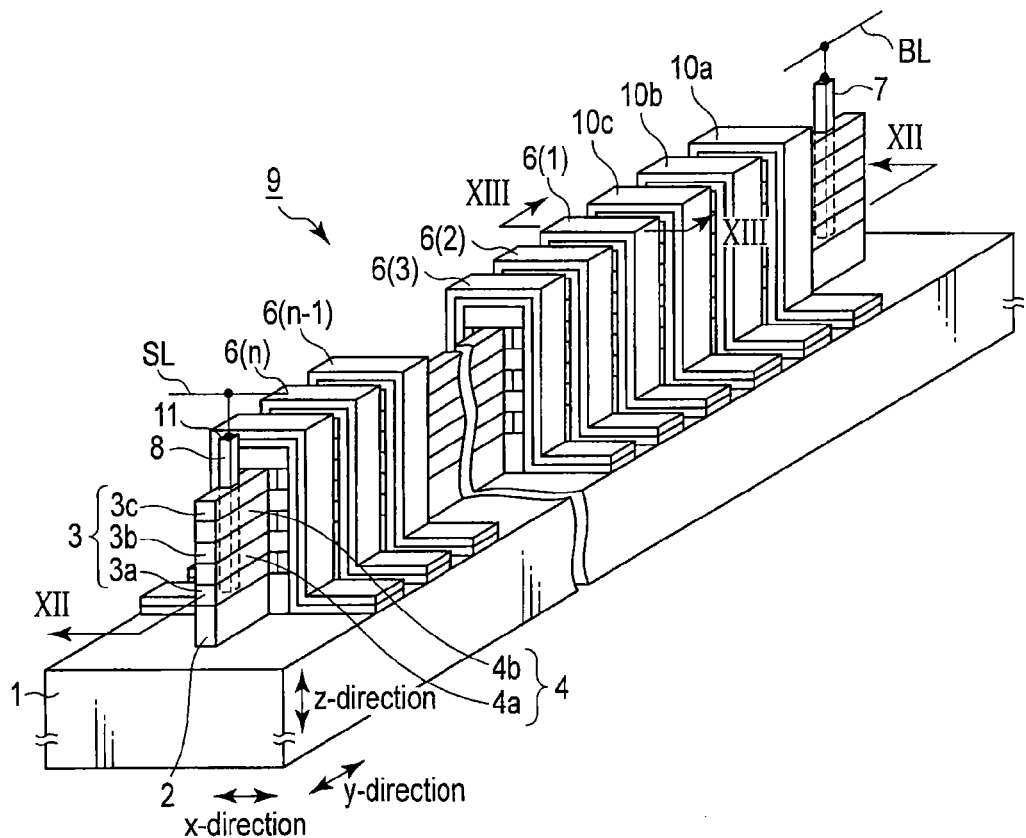
F I G. 11
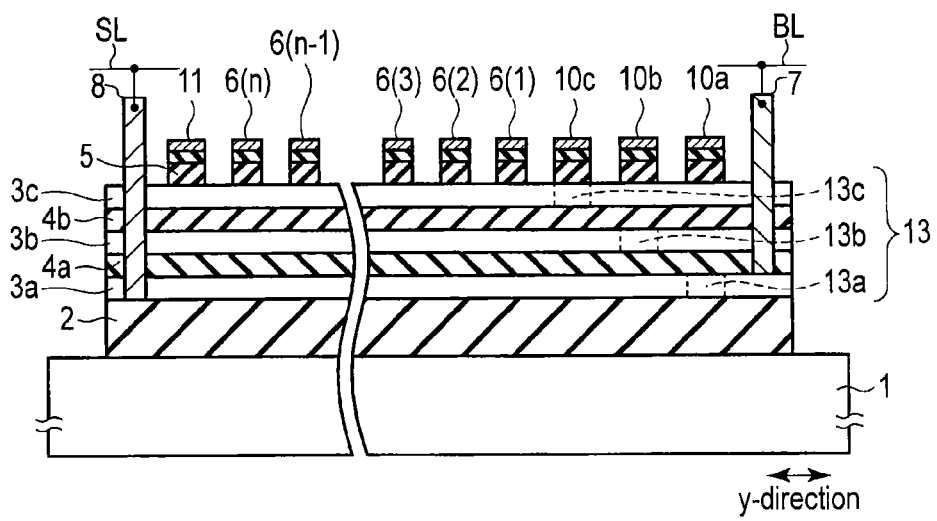
F I G. 12

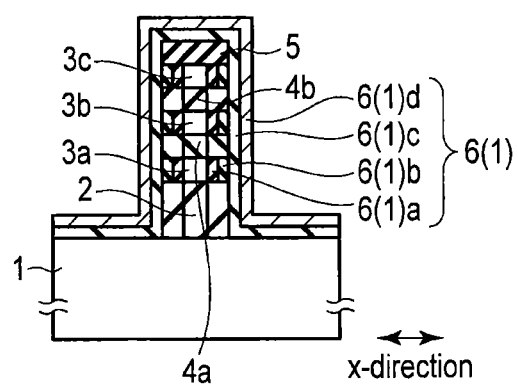
F I G. 1 3

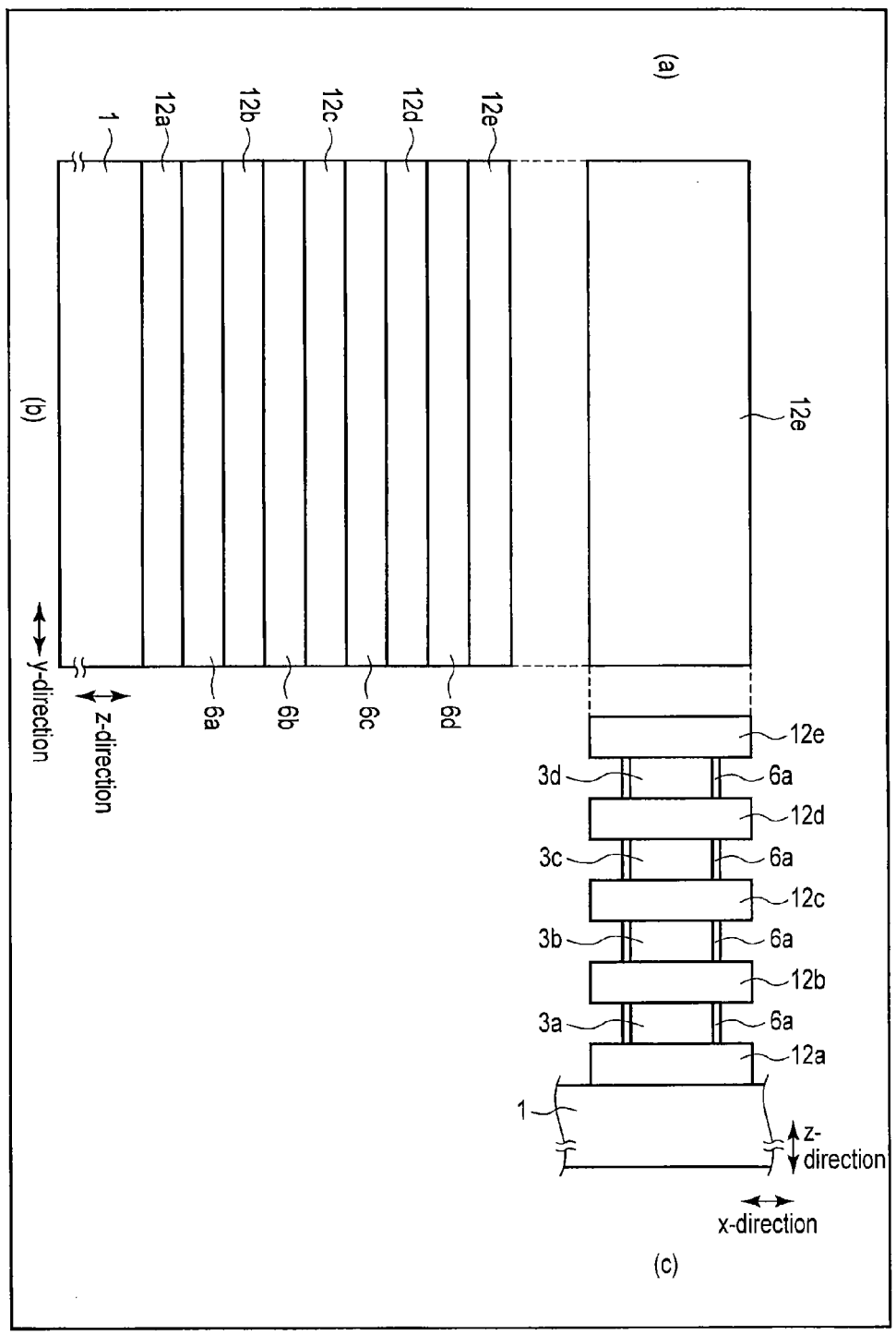
F I G. 15 C

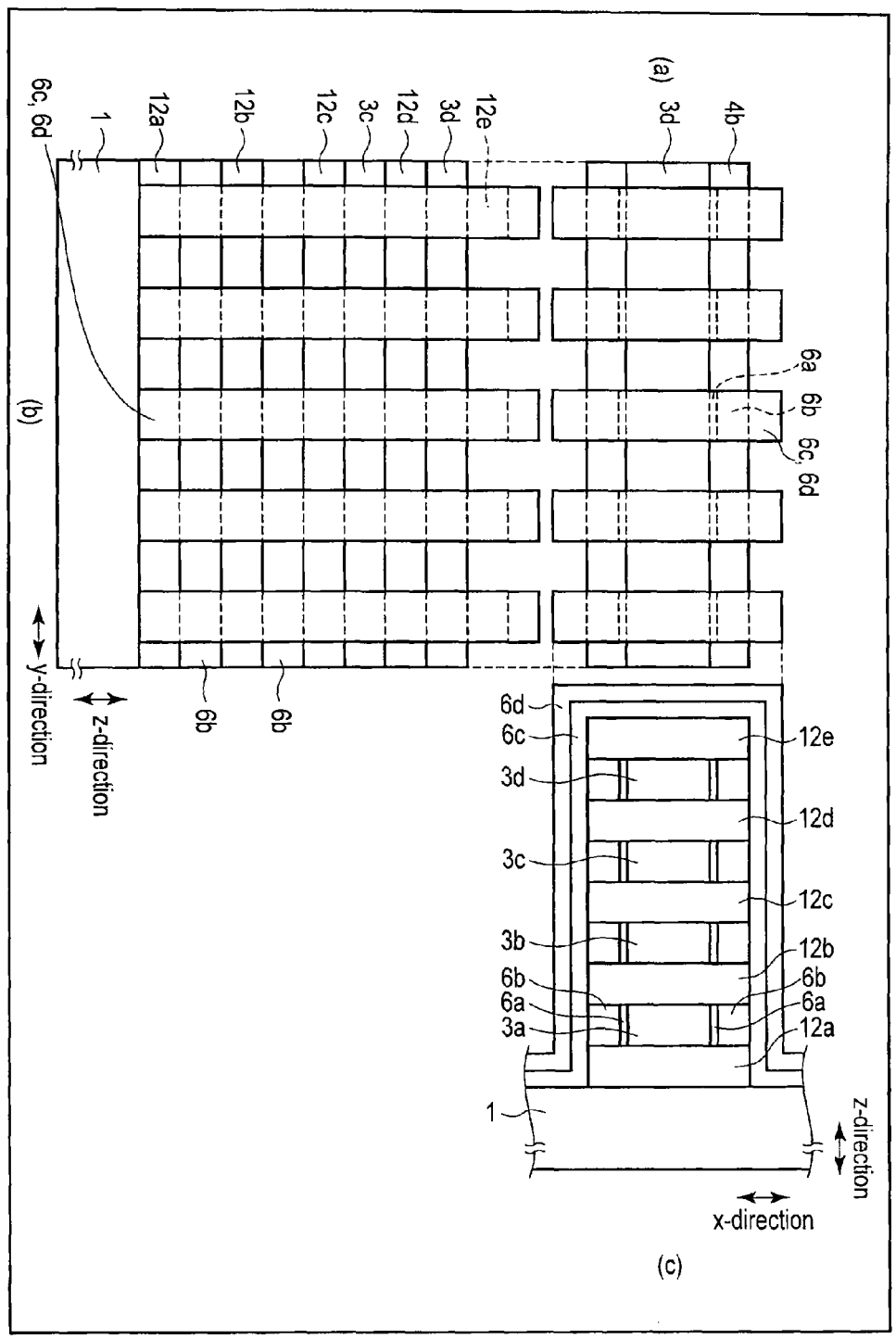
F I G. 15 K

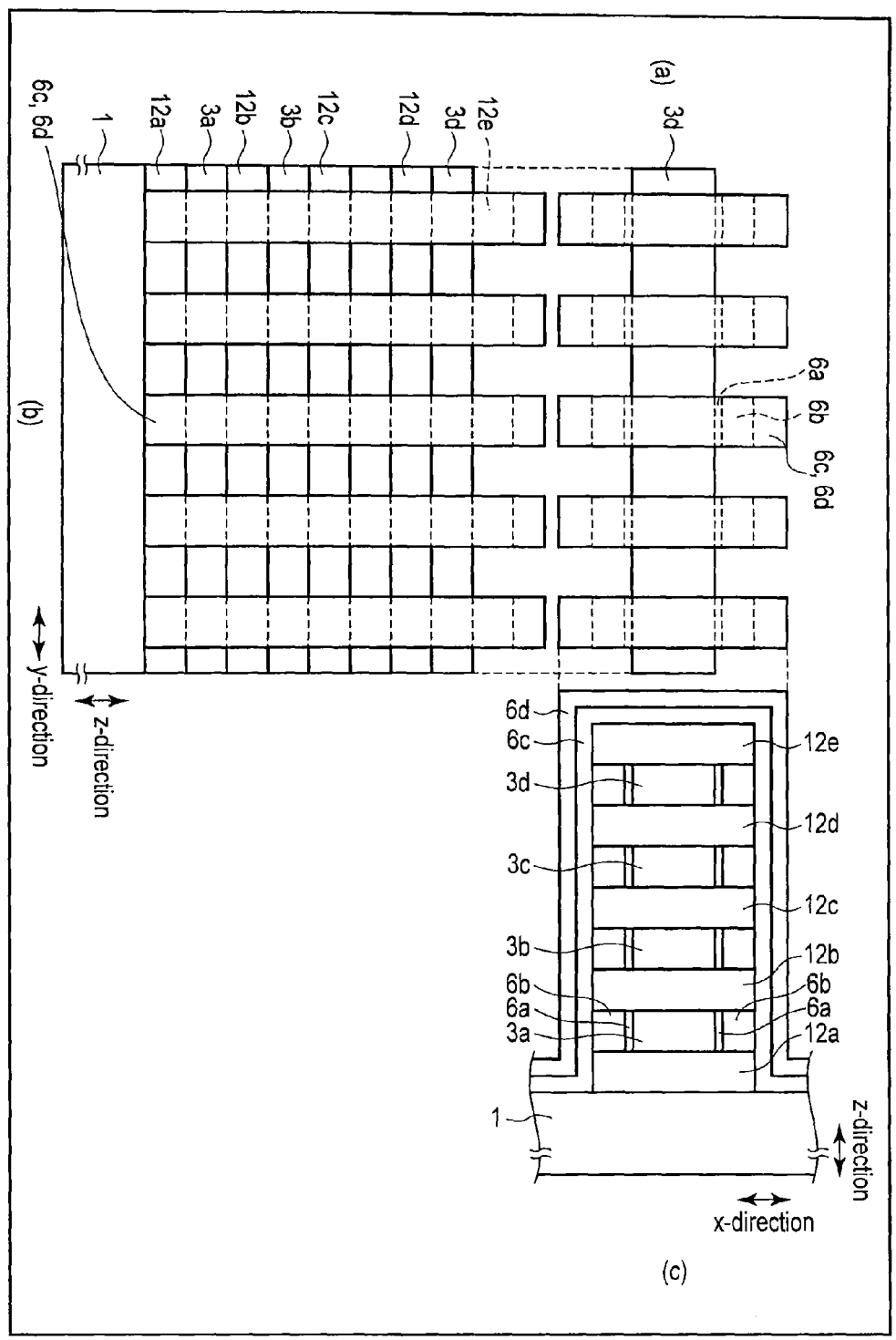
F I G. 15 L

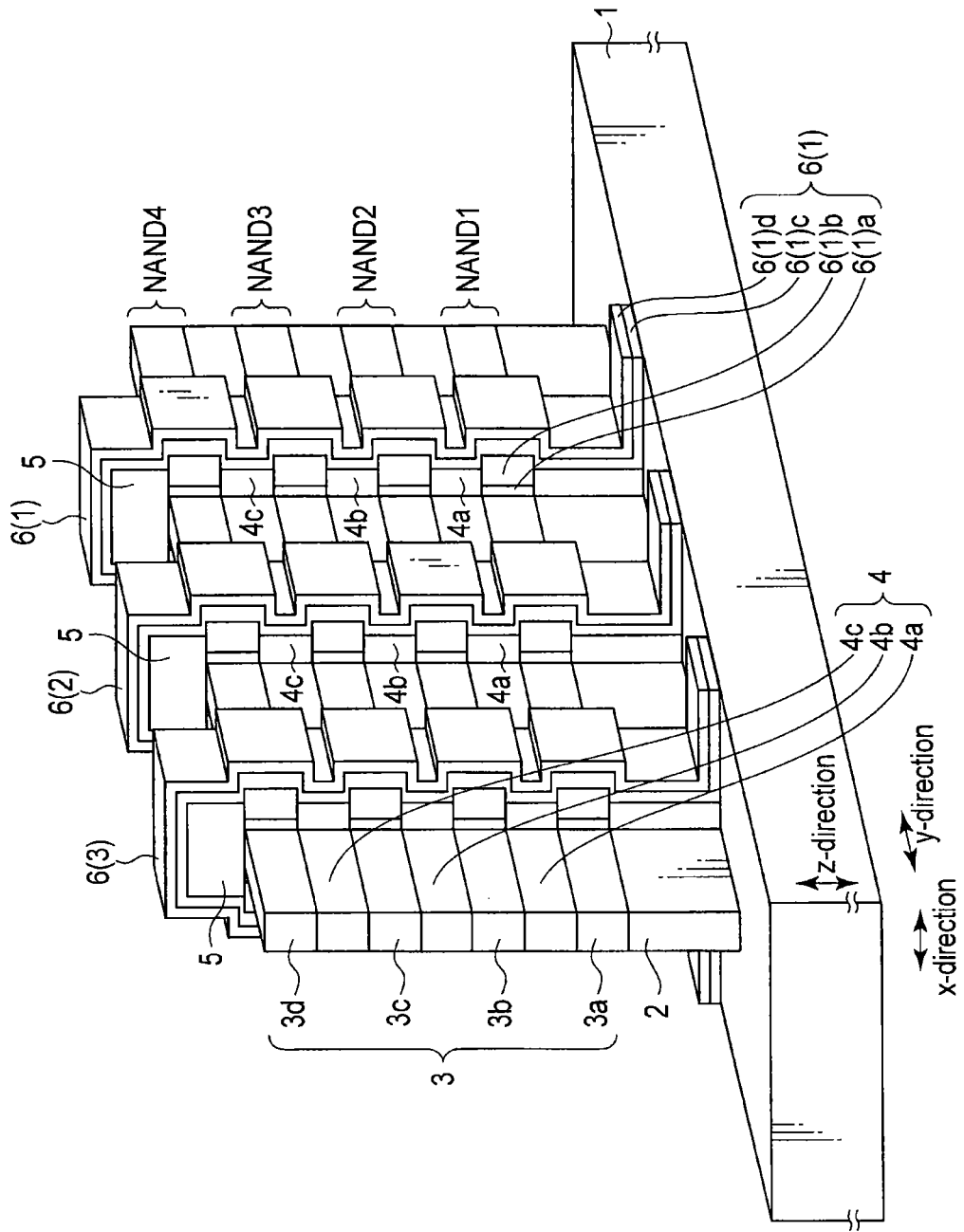
F I G. 20

US 8,987,807 B2

NONVOLATILE SEMICONDUCTOR MEMORY DEVICE AND METHOD OF MANUFACTURING THE SAME

CROSS REFERENCE TO RELATED APPLICATIONS

This application is a Continuation Application of PCT Application No. PCT/JP2010/054771, filed Mar. 19, 2010, the entire contents of which are incorporated herein by reference.

FIELD

Embodiments described herein relate generally to a nonvolatile semiconductor memory device and a method of manufacturing the same.

BACKGROUND

A NAND-type flash memory is widespread as a storage device for a large volume of data. At present, memory cells are miniaturized for cost reduction and capacity increase per bit. Further miniaturization in the future is demanded. However, further miniaturization of the flash memory involves many problems to be solved, such as the development of lithography technology, a short channel effect, inter-element interference, and the inhibition of inter-element variations. Therefore, there is a strong possibility that future continuous improvement of storage density only by the development of simple in-plane miniaturization technology is difficult.

Accordingly, there has been suggested a three-dimensional stacked layer type semiconductor memory as a new technique for increasing capacity that does not rely on the miniaturization of the lithography technology. The advantage of this three-dimensional stacked layer type semiconductor memory is that memory cells can be formed into a three-dimensional configuration without a substantial increase of processes and that a high memory capacity can be obtained at low cost.

A memory cell of the three-dimensional stacked layer type semiconductor memory that is generally used is a silicon/oxide/nitride/oxide/silicon (SONOS) type. The problems in putting the SONOS type memory cell into practical use include the improvement of writing/erasing characteristics and cycling resistance. That is, improving the writing/erasing characteristics and the cycling resistance is important in putting the three-dimensional stacked layer type semiconductor memory that uses the SONOS type memory cell into practical use.

Our intensive studies on this point have proved that in order to improve the above-mentioned characteristics, the composition of silicon nitride, when used as a charge storage layer, is preferably closer to the excess of silicon (silicon-rich SiN) than a stoichiometric composition.

However, silicon-rich SiN is said to have a relatively shallow in-film trap level, and it is known that trapped electrons are apt to diffuse because of, for example, hopping conduction between trap levels. In the meantime, charge storage layers of memory cells are physically combined in the three-dimensional stacked layer type semiconductor memory.

Therefore, the problem caused when the three-dimensional stacked layer type semiconductor memory is formed by the SONOS type memory cells that use silicon-rich SiN for the charge storage layers is the loss of data because of the diffusion of electrons injected into the charge storage layer of a memory cell to the charge storage layer of another adjacent memory cell.

This can be prevented by the charge storage layers structured to be independent for the respective memory cells in a memory cell array of the three-dimensional stacked layer type semiconductor memory.

If such a new device structure and a manufacturing method to obtain this structure are developed, the three-dimensional stacked layer type semiconductor memory can use, as the charge storage layer, an insulator such as silicon-rich SiN that is expected to be improved in characteristics, and can also use, as the charge storage layer, a conductor as an electrically floating gate.

BRIEF DESCRIPTION OF THE DRAWINGS

FIG. 3 is a view showing a first modification of the first embodiment;
FIG. 4 is a view showing a second modification of the first embodiment;
FIG. 7 is a view taken along the line VII-VII of FIG. 5;
FIG. 8 is a view showing a second example of a NAND cell unit structure;
FIG. 11 is a view showing a third example of a NAND cell unit structure;
FIG. 12 is a view taken along the line XII-XII of FIG. 11;
FIG. 13 is a view taken along the line XIII-XIII of FIG. 11;
FIG. 20 is a view showing an overall structure of a third embodiment;
FIGS. 24A to 24M are diagrams, each showing a manufacturing method of the third embodiment.

DETAILED DESCRIPTION

Figure 1:
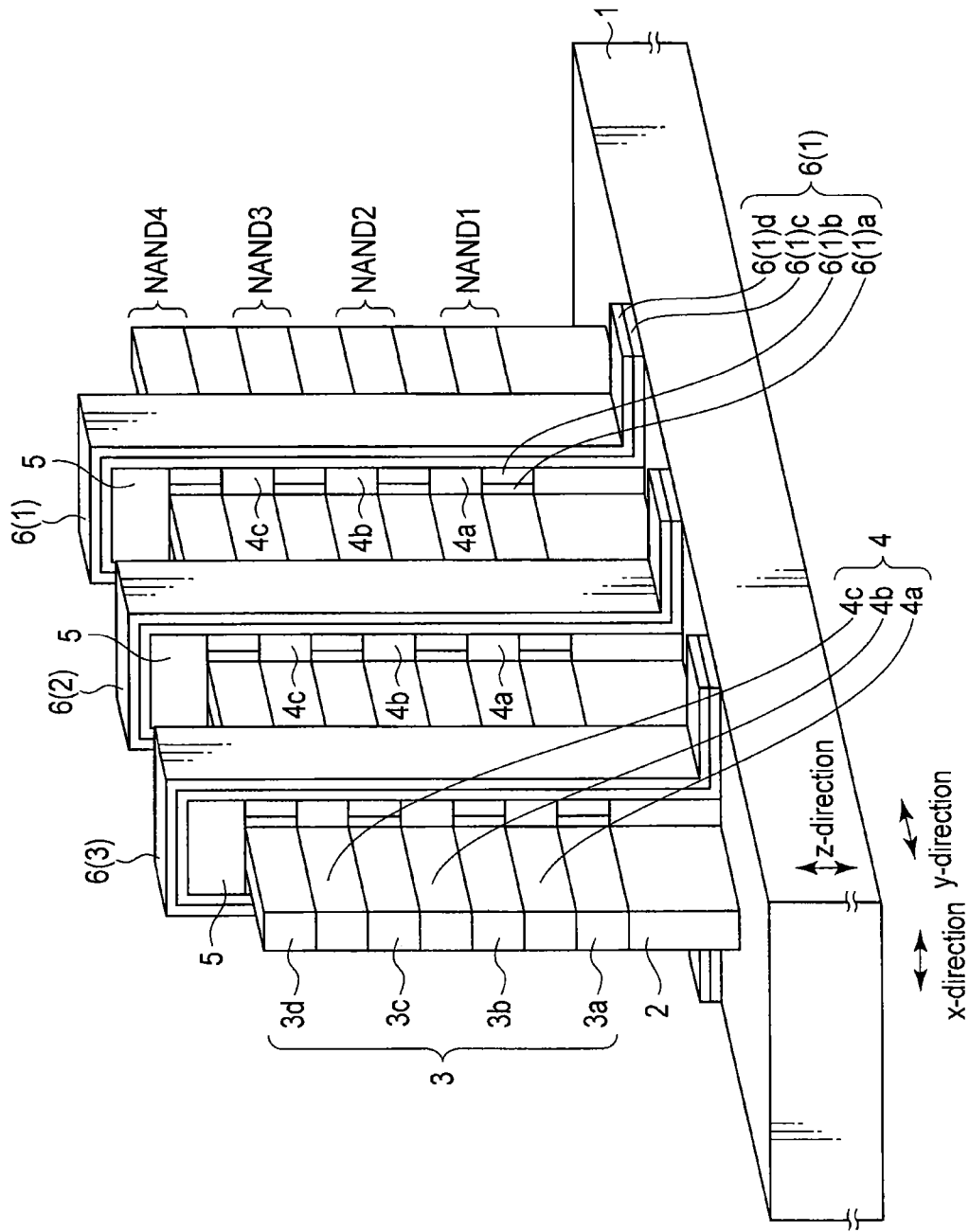
FIG. 1 is a view showing an overall structure of a first embodiment.

In general, according to one embodiment, a nonvolatile semiconductor memory device comprises: a semiconductor substrate; first to n-th semiconductor layers (n is a natural number equal to or more than 2) which are stacked in a first direction perpendicular to a surface of the semiconductor substrate and which extend in a second direction parallel to the surface of the semiconductor substrate; an electrode which extends in the first direction along side surfaces of the first to n-th semiconductor layers, the side surfaces of the first to n-th semiconductor layers exposing in a third direction perpendicular to the first and second directions; and first to n-th charge storage layers located between the first to n-th semiconductor layers and the electrode respectively, wherein the first to n-th charge storage layers are separated from each other in areas between the first to n-th semiconductor layers.

Hereinafter, embodiments will be described in detail with reference to the drawings.

1. Basic Concept

According to the basic concept of the embodiment, a three-dimensional stacked layer type semiconductor memory comprises first to n-th semiconductor layers (n is a natural number equal to or more than 2) which are stacked to be isolated from one another in a first direction perpendicular to the surface of a semiconductor substrate and which extend in a second direction parallel to the surface of the semiconductor substrate, an electrode which extends in the first direction along the side surfaces of the first to n-th semiconductor layers in a third direction intersecting at right angles with the first and second directions, and first to n-th charge storage layers located between the first to n-th semiconductor layers and the electrode, wherein the first to n-th charge storage layers are independent of one another for the improvement of writing/erasing characteristics and cycling resistance.

Here, that the first to n-th charge storage layers are independent means that the first to n-th charge storage layers are physically separated, more specifically, that elements different from the elements comprising the first to n-th charge storage layers are present between the charge storage layers.

In general, the first to n-th charge storage layers are physically combined in a conventional three-dimensional stacked layer type semiconductor memory. However, this causes a problem of the loss of data because of the diffusion of electrons injected into the charge storage layer of a memory cell to the charge storage layer of another adjacent memory cell.

Thus, according to the embodiment, in the three-dimensional stacked layer type semiconductor memory, the first to n-th charge storage layers are independent of one another for the improvement of writing/erasing characteristics and cycling resistance.

In the meantime, the independence of the charge storage layers according to the embodiment cannot be accomplished simply by converting the independence of the charge storage layers used in a conventional two-dimensional NAND flash memory. This is because a two-dimensionally structured memory cell cannot be directly used as a three-dimensionally structured memory cell.

Therefore, from the viewpoint of the memory cell characteristics and the prevention of the increased complexity of the number of manufacturing processes, the independence of the charge storage layers according to the embodiment is accomplished by using one of elements between the first to n-th semiconductor layers and the oxide of a material comprising the first to n-th charge storage layers to physically separate the first to n-th charge storage layers.

A specific manufacturing method to obtain the three-dimensional stacked layer type semiconductor memory according to the embodiment is described in detail in the following embodiments.

The embodiment suggests a structure in which charge storage layers are independent for the respective memory cells, and is therefore applicable not only to a SONOS type memory cell that uses silicon-rich SiN as a charge storage layer but also to a floating gate type memory cell that uses, as a charge storage layer, a conductor serving as an electrically floating gate.

2. Embodiments

(1) First Embodiment

A. Structure

Figure 2:
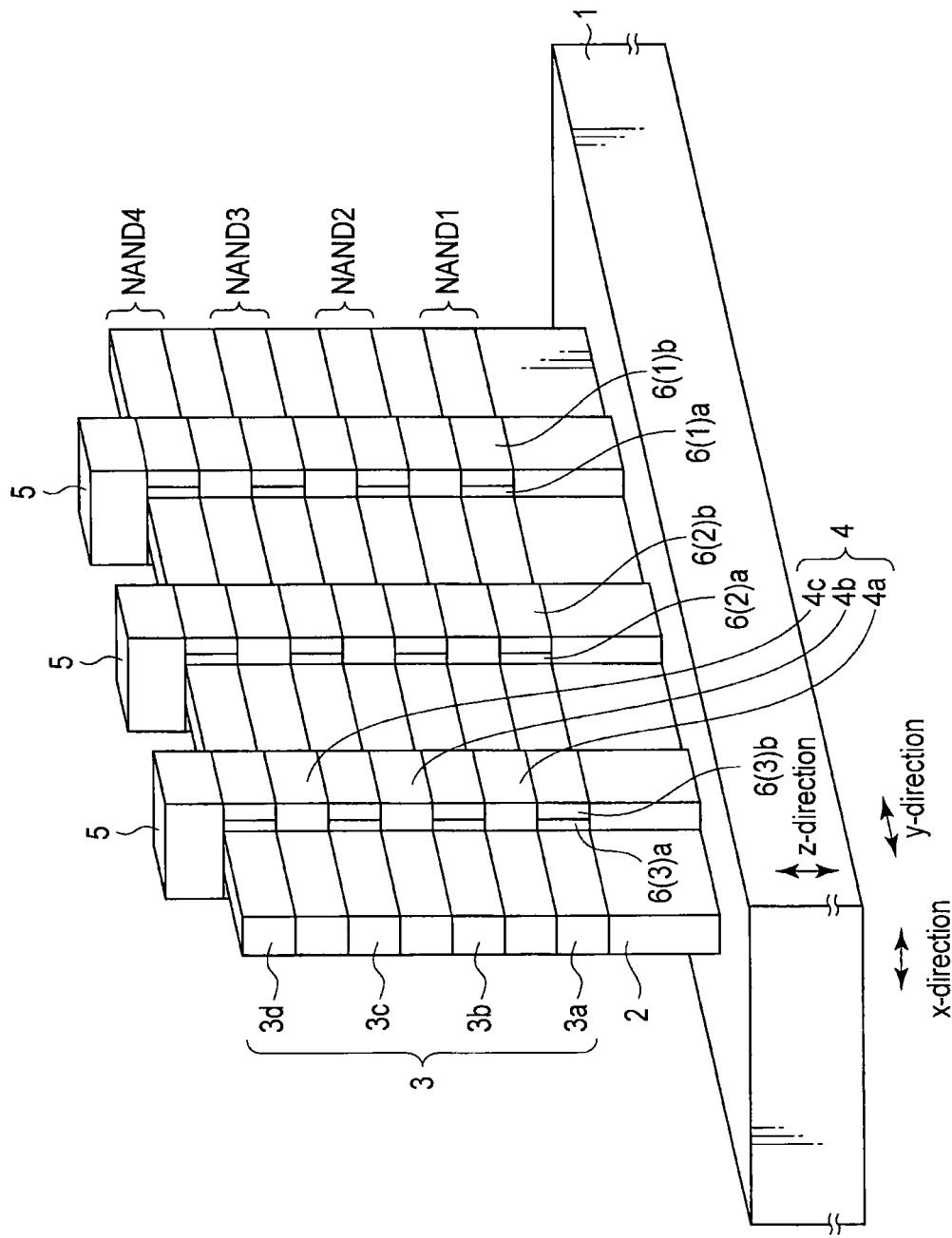
FIG. 2 is a view showing the structure of the first embodiment.

FIG. 1 shows a nonvolatile semiconductor memory device as the first embodiment. FIG. 2 shows a structure in which second gate insulating layer 6(1)c and control gate electrode 6(1)d are eliminated from the structure shown in FIG. 1.

Semiconductor substrate 1 is, for example, a silicon substrate. A fin-type stacked layer structure extending in a y-direction parallel to the surface of semiconductor substrate 1 is disposed on semiconductor substrate 1.

This fin-type stacked layer structure comprises first insulating layer 2, first semiconductor layer 3a, second insulating layer 4a, second semiconductor layer 3b, third insulating layer 4b, third semiconductor layer 3c, fourth insulating layer 4c, fourth semiconductor layer 3d, and fifth insulating layer 5 that are stacked in a z-direction perpendicular to the surface of semiconductor substrate 1.

First to fifth insulating layers 2, 4a to 4c, and 5 may be made of any insulator, and silicon oxide, for example, can be used. First to fourth semiconductor layers 3a to 3d are made of, for example, silicon.

On the x-direction side of first to fourth semiconductor layers 3 (3a, 3b, 3c, and 3d), stacked layer structure 6(1) in which first gate insulating layer 6(1)a, charge storage layer 6(1)b, second gate insulating layer 6(1)c, and control gate electrode 6(1)d are stacked in order in the x-direction is disposed.

First gate insulating layer 6(1)a is a tunnel insulating layer through which a tunnel current runs, and is made of, for example, silicon oxide. Charge storage layer 6(1)b is a layer for storing a charge, and its charge amount is controlled by the tunnel current.

Charge storage layer 6(1)b is made of an insulator or a conductor. When charge storage layer 6(1)b is an insulator (e.g., silicon nitride), a memory cell is a SONOS type. When charge storage layer 6(1)b is a conductor (e.g., conductive polysilicon), a memory cell is a floating gate type.

Charge storage layers 6(1)b are independent for the respective memory cells. In particular, four charge storage layers 6(1)b, . . . arranged in the z-direction are physically separated from one another by elements between first to fourth semiconductor layers 3 (3a, 3b, 3c, and 3d), in the present embodiment, by second to fourth insulating layers 4 (4a, 4b, and 4c).

Second gate insulating layer 6(1)c prevents a leakage current between charge storage layer 6(1)b and control gate electrode 6(1)d. Second gate insulating layer 6(1)c comprises, for example, a stacked layer structure or a material having a high dielectric constant to increase the coupling ratio of the memory cells and improve writing/erasing characteristics.

When the memory cell is the SONOS type, second gate insulating layer 6(1)c is generally called a block insulating layer. When the memory cell is the floating gate type, second gate insulating layer 6(1)c is generally called an inter-electrode insulating layer.

Control gate electrode 6(1)d functions as a word line, and extends in the x-direction on the z-direction side of fifth insulating layer 5 and extends in the z-direction on the x-direction side of first to fourth semiconductor layers 3 (3a, 3b, 3c, and 3d).

That is, control gate electrode 6(1)d covers four charge storage layers 6(1)b, . . . , and extends across the fin-type stacked layer structure in the x-direction.

Stacked layer structures 6(2) and 6(3) have the same structure as stacked layer structure 6(1).

By the device structure described above, a string of memory cells connected in series in the y-direction, that is, a NAND string is formed in each of first to fourth semiconductor layers 3 (3a, 3b, 3c, and 3d). Here, the NAND string formed in first semiconductor layer 3a is NAND1, the NAND string formed in second semiconductor layer 3b is NAND2, the NAND string formed in third semiconductor layer 3c is NAND3, and the NAND string formed in fourth semiconductor layer 3d is NAND4.

Charge storage layers 6(1)b of the memory cells that constitute these NAND strings are independent for the respective memory cells. That is, charge storage layers 6(1)b, . . . are physically separated from one another by second to fourth insulating layers 4 (4a, 4b, and 4c). Therefore, the reliability of the three-dimensional stacked layer type semiconductor memory can be improved.

B. Material Examples

Materials best suited to the generations of the semiconductor memories can be properly selected as the materials that constitute the elements of the device structure shown in FIG. 1 and FIG. 2.

For example, first gate insulating layer 6(1)a can be $SiO_2$, charge storage layer 6(1)b can be $Si_3N_4$, second gate insulating layer 6(1)c can be $Al_2O_3$, and control gate electrode 6(1)d can be NiSi.

First gate insulating layer 6(1)a may be silicon oxynitride, or a stacked layer structure of silicon oxide and silicon nitride. First gate insulating layer 6(1)a may include silicon nanoparticles, metal ions, or the like.

Charge storage layer 6(1)b may be made of at least one of the materials selected from the group consisting of $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

Charge storage layer 6(1)b may otherwise be made of impurity-added polysilicon or a conductor such as a metal.

Second gate insulating layer 6(1)c may be made of at least one of the materials selected from the group consisting of silicon oxide ($SiO_2$), silicon oxynitride (SiON), aluminum oxide ($Al_2O_3$), aluminum oxynitride (AlON), hafnia ($HfO_2$), hafnium aluminate. ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

Control gate electrode 6(1)d can be made of a metal compound such as tantalum nitride (TaN), tantalum carbide (TaC), or titanium nitride (TiN), or an electrically conductive metallic material such as V, Cr, Mn, Y, Mo, Ru, Rh, Hf, Ta, W, Ir, Co, Ti, Er, Pt, Pd, Zr, Gd, Dy, and Ho, and silicides of these substances.

C. First Modification

FIG. 3 shows a first modification of the first embodiment.

The first modification is characterized in that the uppermost layer among first to fourth semiconductor layers 3 (3a, 3b, 3c, and 3d), that is, fourth semiconductor layer 3d is dummy layer DUMMY in which dummy cells as non-memory cells are formed.

Fourth semiconductor layer 3d as the uppermost layer is used as an etching mask in one step of first and second manufacturing methods described later, and therefore tends to be damaged. Thus, the NAND string formed in fourth semiconductor layer 3d is not used as a memory cell, and is a dummy cell as a non-memory cell.

In this case, in order to improve the function of fourth semiconductor layer 3d as a mask, the width of fourth semiconductor layer 3d in the z-direction is preferably greater than the width of first to third semiconductor layers 3a, 3b, and 3c in the z-direction.

D. Second Modification

FIG. 4 shows a second modification of the first embodiment.

The second modification is characterized in that four charge storage layers 6(1)b, . . . arranged in the z-direction are physically separated from one another by cavities (e.g., air gaps). That is, in the second modification, the elements between first to fourth semiconductor layers 3 (3a, 3b, 3c, and 3d) are cavities.

When the memory cell is miniaturized, a parasitic capacitance generated between charge storage layers 6(1)b is increased, and wrong operation is caused by mutual interference. To prevent this, the space between charge storage layers 6(1)b is preferably a cavity having a low dielectric constant.

Although all of first to fifth insulating layers 2, 4a to 4c, and 5 in the first embodiment (FIG. 1 and FIG. 2) are changed to cavities in this modification, some of the insulating layers may be only changed to cavities. The cavity is preferably a complete cavity, but the insulator may partly remain in the cavity.

The cavity can be changed to a porous insulator.

G. First Example of NAND Cell Unit

Figure 5:
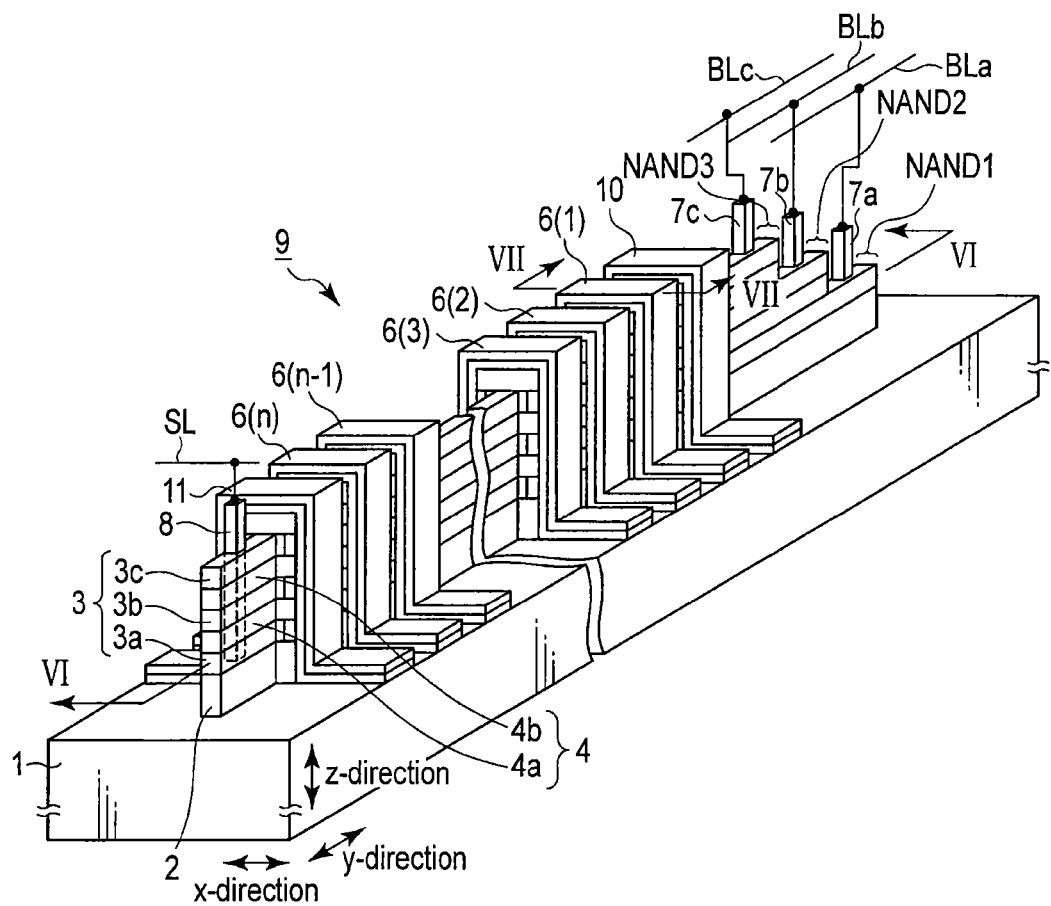
FIG. 5 is a view showing a first example of a NAND cell unit structure.
Figure 6:
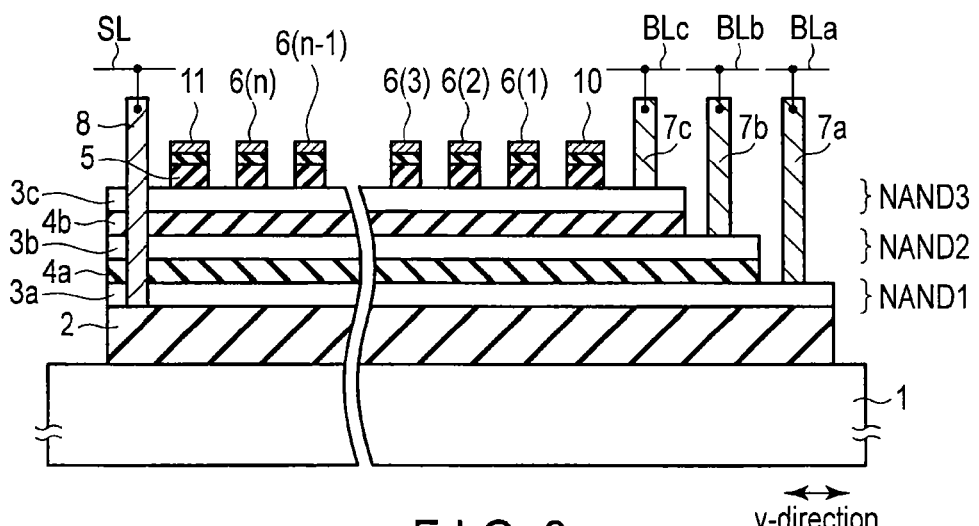
FIG. 6 is a view taken along the line VI-VI of FIG. 5.

FIG. 5 shows a first example of a NAND cell unit structure. FIG. 6 is a sectional view taken along the line VI-VI of FIG. 5. FIG. 7 is a sectional view taken along the line VII-VII of FIG. 5.

This example shows the NAND cell unit structure as an application of the first embodiment (FIG. 1 and FIG. 2). Therefore, the same elements as those in the first embodiment are provided with the same reference marks. This example is different from the first embodiment in that the number of NAND strings NAND1, NAND2, and NAND3 is three.

Fin-type stacked layer structure 9 comprises first insulating layer 2, first semiconductor layer 3a, second insulating layer 4a, second semiconductor layer 3b, third insulating layer 4b, third semiconductor layer 3c, and fifth insulating layer 5 that are stacked on semiconductor substrate 1 in the z-direction.

One end of fin-type stacked layer structure 9 in the y-direction has a stepped structure. At one end of fin-type stacked layer structure 9 in the y-direction, the side surfaces of first to third semiconductor layers 3 (3a, 3b, and 3c) in the z-direction are exposed. Contact plugs 7a, 7b, and 7c contact the side surfaces of first to third semiconductor layers 3 (3a, 3b, and 3c) in the z-direction, respectively.

Contact plugs 7a, 7b, and 7c connect bit lines BLa, BLb, and BLc and NAND strings NAND1, NAND2, and NAND3, respectively.

At the other end of fin-type stacked layer structure 9 in the y-direction, contact plug 8 passes through and contacts first to third semiconductor layers 3 (3a, 3b, and 3c). Contact plug 8 connects source line SL and NAND strings NAND1, NAND2, and NAND3.

Each of stacked layer structures 6(1), ... 6(n−1), and 6(n) constitutes a memory cell.

Stacked layer structure 6(1) comprises first gate insulating layer 6(1)*a*, charge storage layer 6(1)*b*, second gate insulating layer 6(1)*c*, and control gate electrode 6(1)*d*. Other stacked layer structures 6(2), ... 6(n−1), and 6(n) have the same structure as stacked layer structure 6(1).

Stacked layer structures 10 and 11 also have the same structure as stacked layer structure 6(1).

Each of stacked layer structures 10 and 11 constitutes a select transistor. Stacked layer structure 10 constitutes a drain-side select transistor, and stacked layer structure 11 constitutes a source-side select transistor.

As described above, the NAND strings according to the first embodiment can be used to constitute a NAND cell unit, so that a highly reliable three-dimensional NAND flash memory can be obtained.

F. Second Example of NAND Cell Unit

Figure 9:
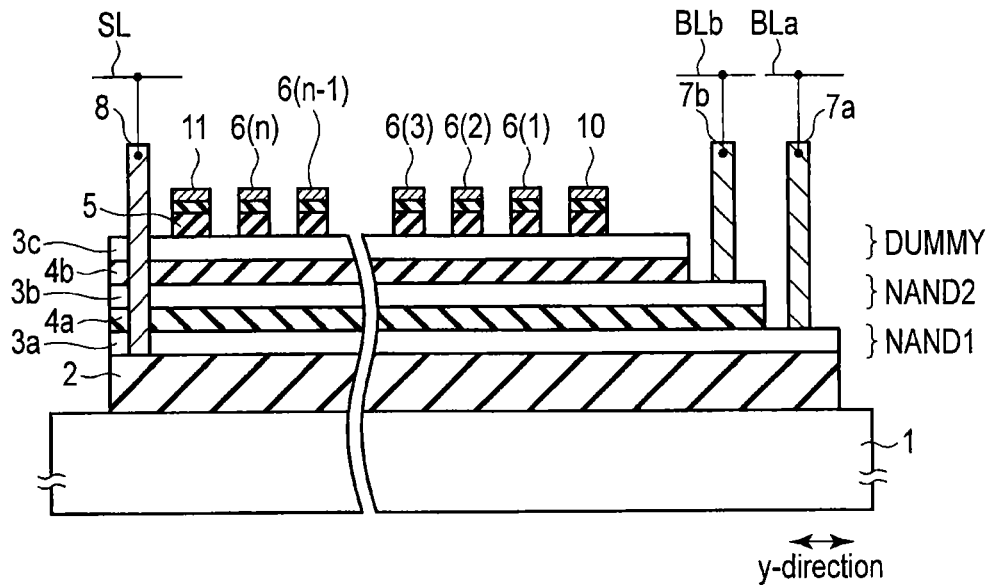
FIG. 9 is a view taken along the line IX-IX of FIG. 8.
Figure 10:
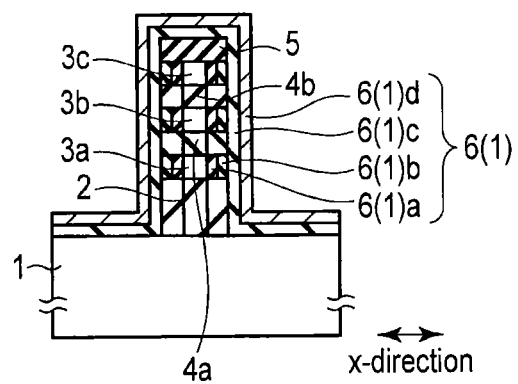
FIG. 10 is a view taken along the line X-X of FIG. 8.

FIG. 8 shows a second example of a NAND cell unit structure. FIG. 9 is a sectional view taken along the line IX-IX of FIG. 8. FIG. 10 is a sectional view taken along the line X-X of FIG. 8.

This example shows the NAND cell unit structure as an application of the first modification (FIG. 3). Therefore, the same elements as those in the first embodiment are provided with the same reference marks. This example is different from the first modification in that the number of NAND strings NAND1, NAND2, and NAND3 is three.

Fin-type stacked layer structure 9 comprises first insulating layer 2, first semiconductor layer 3*a*, second insulating layer 4*a*, second semiconductor layer 3*b*, third insulating layer 4*b*, third semiconductor layer 3*c*, and fifth insulating layer 5 that are stacked on semiconductor substrate 1 in the z-direction.

One end of fin-type stacked layer structure 9 in the y-direction has a stepped structure. At one end of fin-type stacked layer structure 9 in the y-direction, the side surfaces of first to third semiconductor layers 3 (3*a*, 3*b*, and 3*c*) in the z-direction are exposed. Contact plugs 7*a* and 7*b* contact the side surfaces of first and second semiconductor layers 3*a* and 3*b* in the z-direction, respectively.

Contact plugs 7*a* and 7*b* connect bit lines BLa and BLb and NAND strings NAND1 and NAND2, respectively.

As third semiconductor layer 3*c* is dummy layer DUMMY, no contact plug is connected to third semiconductor layer 3*c*.

At the other end of fin-type stacked layer structure 9 in the y-direction, contact plug 8 passes through and contacts first to third semiconductor layers 3 (3*a*, 3*b*, and 3*c*). Contact plug 8 connects source line SL and NAND strings NAND1, NAND2, and NAND3.

Each of stacked layer structures 6(1), ... 6(n−1), and 6(n) constitutes a memory cell. However, the dummy cell formed in third semiconductor layer 3*c* as dummy layer DUMMY is an exception.

Stacked layer structure 6(1) comprises first gate insulating layer 6(1)*a*, charge storage layer 6(1)*b*, second gate insulating layer 6(1)*c*, and control gate electrode 6(1)*d*. Other stacked layer structures 6(2), ... 6(n−1), and 6(n) have the same structure as stacked layer structure 6(1).

Stacked layer structures 10 and 11 also have the same structure as stacked layer structure 6(1).

Each of stacked layer structures 10 and 11 constitutes a select transistor. However, a dummy transistor formed in third semiconductor layer 3*c* as dummy layer DUMMY is an exception. Stacked layer structure 10 constitutes a drain-side select transistor, and stacked layer structure 11 constitutes a source-side select transistor.

As described above, the NAND strings according to the first modification can be used to constitute a NAND cell unit, so that a highly reliable three-dimensional NAND flash memory can be obtained.

G. Third Example of NAND Cell Unit

FIG. 11 shows a third example of a NAND cell unit structure. FIG. 12 is a sectional view taken along the line XII-XII of FIG. 11. FIG. 13 is a sectional view taken along the line XIII-XIII of FIG. 11.

This example is a modification of the first example of the NAND cell unit structure. Therefore, the same elements as those in FIG. 5 to FIG. 7 are provided with the same reference marks.

This example is different from the first example of the NAND cell unit structure in that a drain-side select transistor comprises three transistors connected in series. More specifically, stacked layer structure 10 comprises three stacked layer structures 10*a*, 10*b*, and 10*c*. Stacked layer structures 10*a*, 10*b*, and 10*c* have the same structure as stacked layer structure 10 in FIG. 5 to FIG. 7.

Impurity region 13*a* is provided in a part of first semiconductor layer 3*a* covered with stacked layer structures 10*a* so that the drain-side select transistor is always on (normally on).

Similarly, impurity region 13*b* is provided in a part of second semiconductor layer 3*b* covered with stacked layer structures 10*b* so that the drain-side select transistor is normally on. Impurity region 13*c* is provided in a part of second semiconductor layer 3*c* covered with stacked layer structures 10*c* so that the drain-side select transistor is normally on.

Such a structure allows contact plug 7 to be also shared at one end of fin-type stacked layer structure 9 in the y-direction. That is, contact plug 7 passes through and contacts first to third semiconductor layers 3 (3*a*, 3*b*, and 3*c*).

Contact plug 7 connects bit line BL and NAND strings NAND1, NAND2, and NAND3.

Details of the third example of the NAND cell unit structure are described, for example, in International Patent Application (PCT/JP2009/060803).

H. Other Examples of NAND Cell Unit

Stacked layer structures 10*a*, 10*b*, and 10*c* shown in FIG. 11 to FIG. 13 can be used in the first embodiment (FIG. 1 and FIG. 2).

Stacked layer structures 10*a*, 10*b*, and 10*c* shown in FIG. 11 to FIG. 13 can be used in the first modification (FIG. 3).

The cell unit structure shown in FIG. 5 to FIG. 7, the cell unit structure shown in FIG. 8 to FIG. 10, and stacked layer structures 10*a*, 10*b*, and 10*c* shown in FIG. 11 to FIG. 13 can be used in the second modification (FIG. 4).

It is also possible to use a combination of these structures.

I. First Manufacturing Method

A method of manufacturing the structures according to the first embodiment (FIG. 1 and FIG. 2) and the first modification (FIG. 3) is described below with reference to FIG. 14A to FIG. 14L. In each of these drawings, (a) is a plan view, (b) is a side view from the x-direction, and (c) is a side view from the y-direction.

Figure 14A:
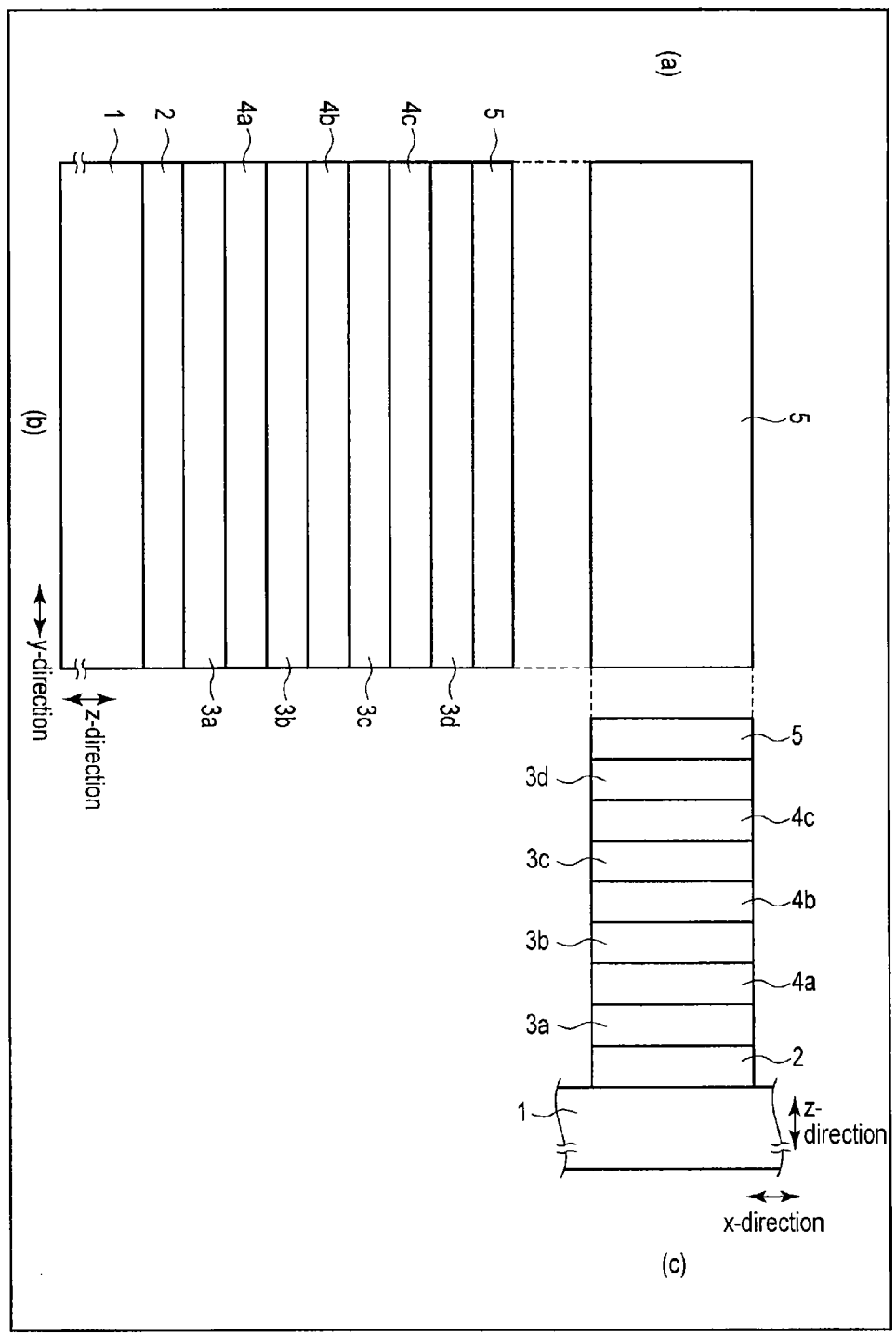
FIGS. 14A to 14L are diagrams, each showing a first example of a manufacturing method of the first embodiment.

First, as shown in FIG. 14A, first insulating layer 2, first semiconductor layer 3*a*, second insulating layer 4*a*, second semiconductor layer 3*b*, third insulating layer 4*b*, third semiconductor layer 3*c*, fourth insulating layer 4*c*, fourth semiconductor layer 3*d*, and fifth insulating layer 5 are sequentially formed in the z-direction perpendicular to the surface of semiconductor substrate 1.

Here, semiconductor substrate 1 is, for example, a p-type silicon substrate having a plane direction (100) and a specific resistance of 10 to 20 Ωcm. First to fifth insulating layers 2, 4*a* to 4c, and 5 are made of silicon oxide. First to fourth semiconductor layers 3a to 3d are made of silicon.

First to fifth insulating layers 2, 4a to 4c, and 5 and first to fourth semiconductor layers 3a to 3d are then fabricated by a photo engraving process (PEP) and anisotropic dry etching, and a fin-type stacked layer structure extending in the y-direction parallel to the surface of semiconductor substrate 1 is formed.

Figure 14B:
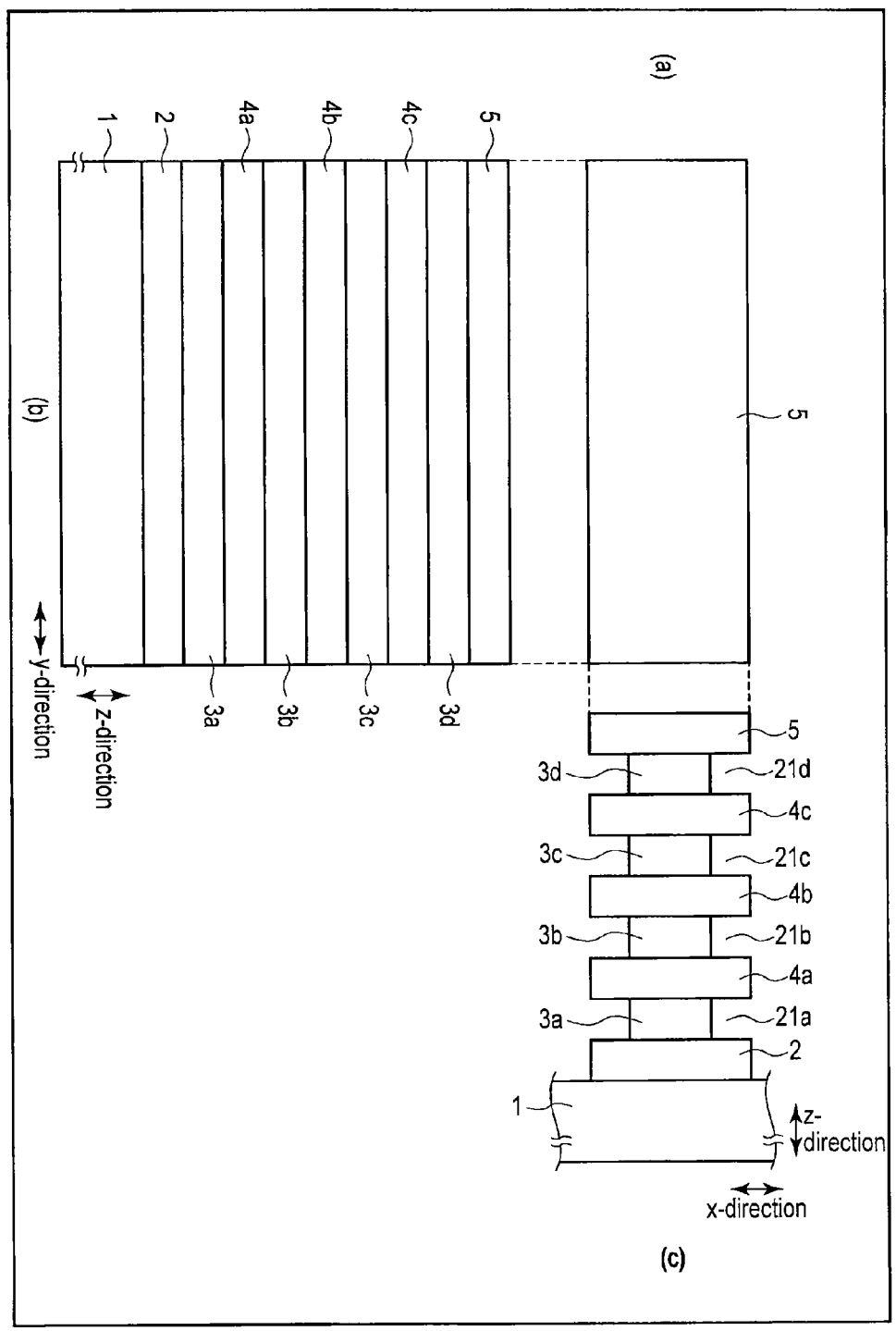

As shown in FIG. 14B, the side surfaces of first to fourth semiconductor layers 3a to 3d in the x-direction are then selectively etched in the x-direction by isotropic dry etching. As a result, the side surfaces of first to fourth semiconductor layers 3a to 3d in the x-direction are set back, and first to fourth recesses 21a to 21d extending in the y-direction are formed.

Figure 14C:
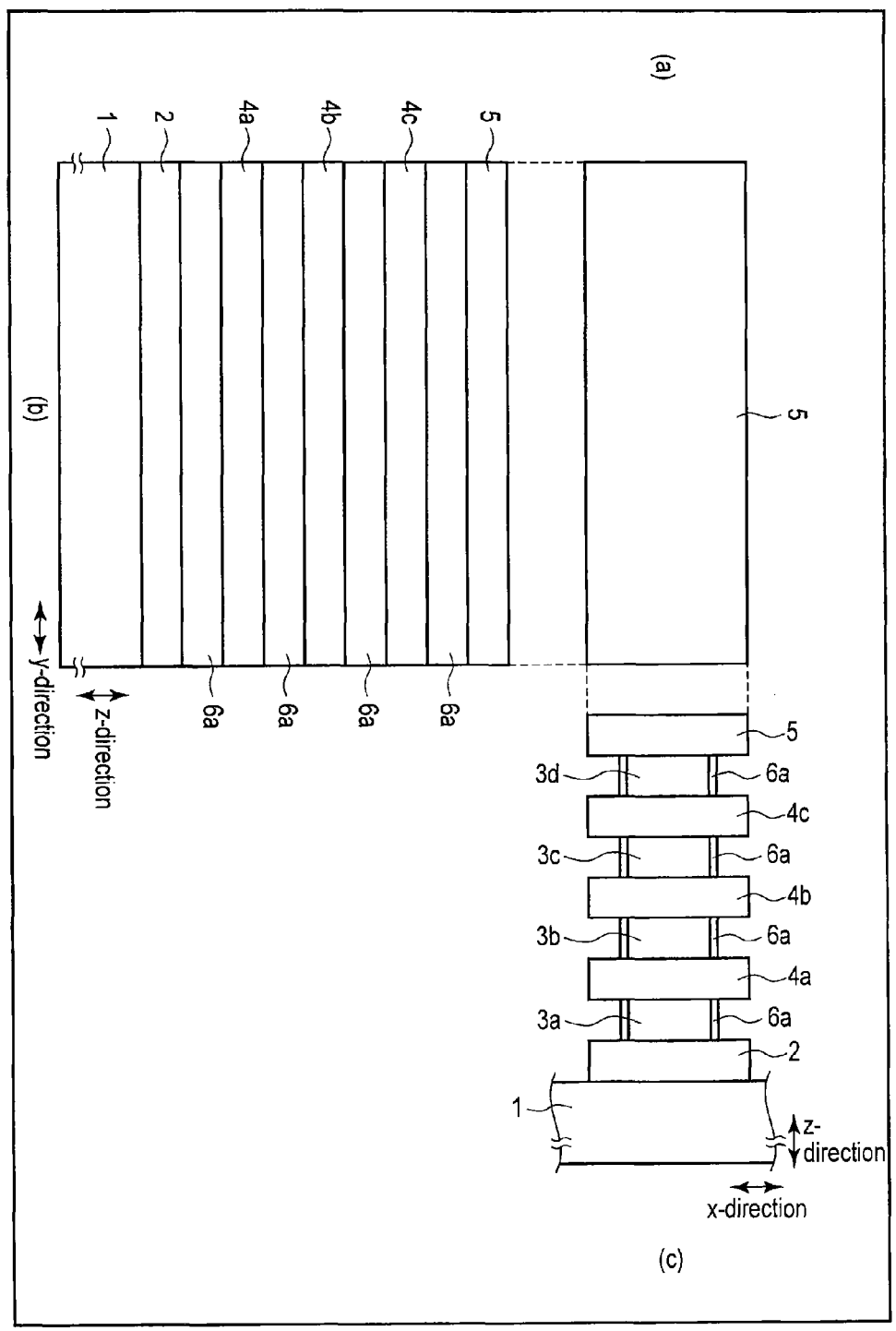

As shown in FIG. 14C, the side surfaces of first to fourth semiconductor layers 3a to 3d in the x-direction are then thermally oxidized, and first gate insulating layers (e.g., silicon oxide) 6a are formed on the side surfaces of first to fourth semiconductor layers 3a to 3d in the x-direction.

Figure 14D:
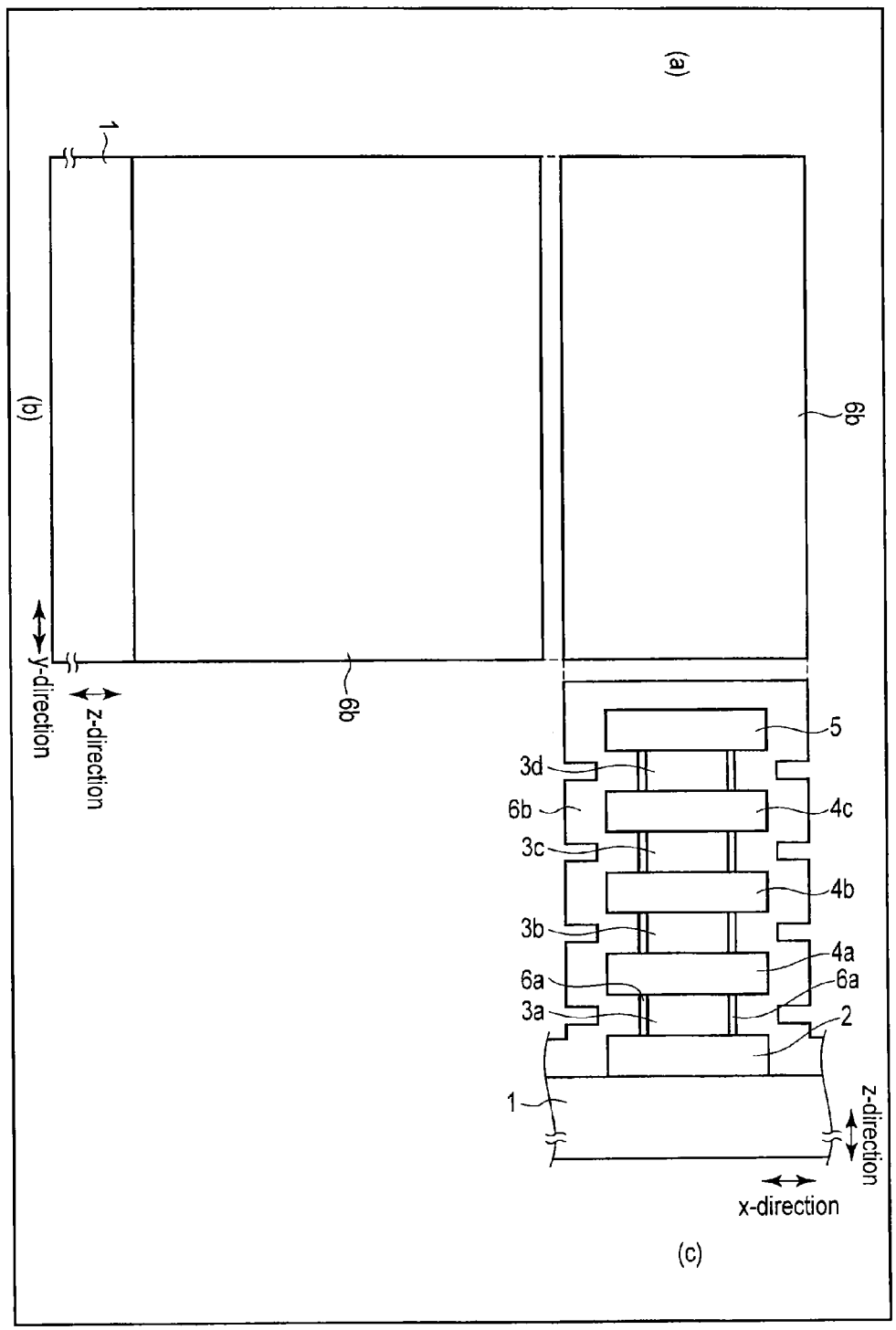

As shown in FIG. 14D, charge storage layer 6b covering the fin-type stacked layer structure is then formed. A material such as silicon nitride or conductive polysilicon can be used as charge storage layer 6b.

Figure 14E:
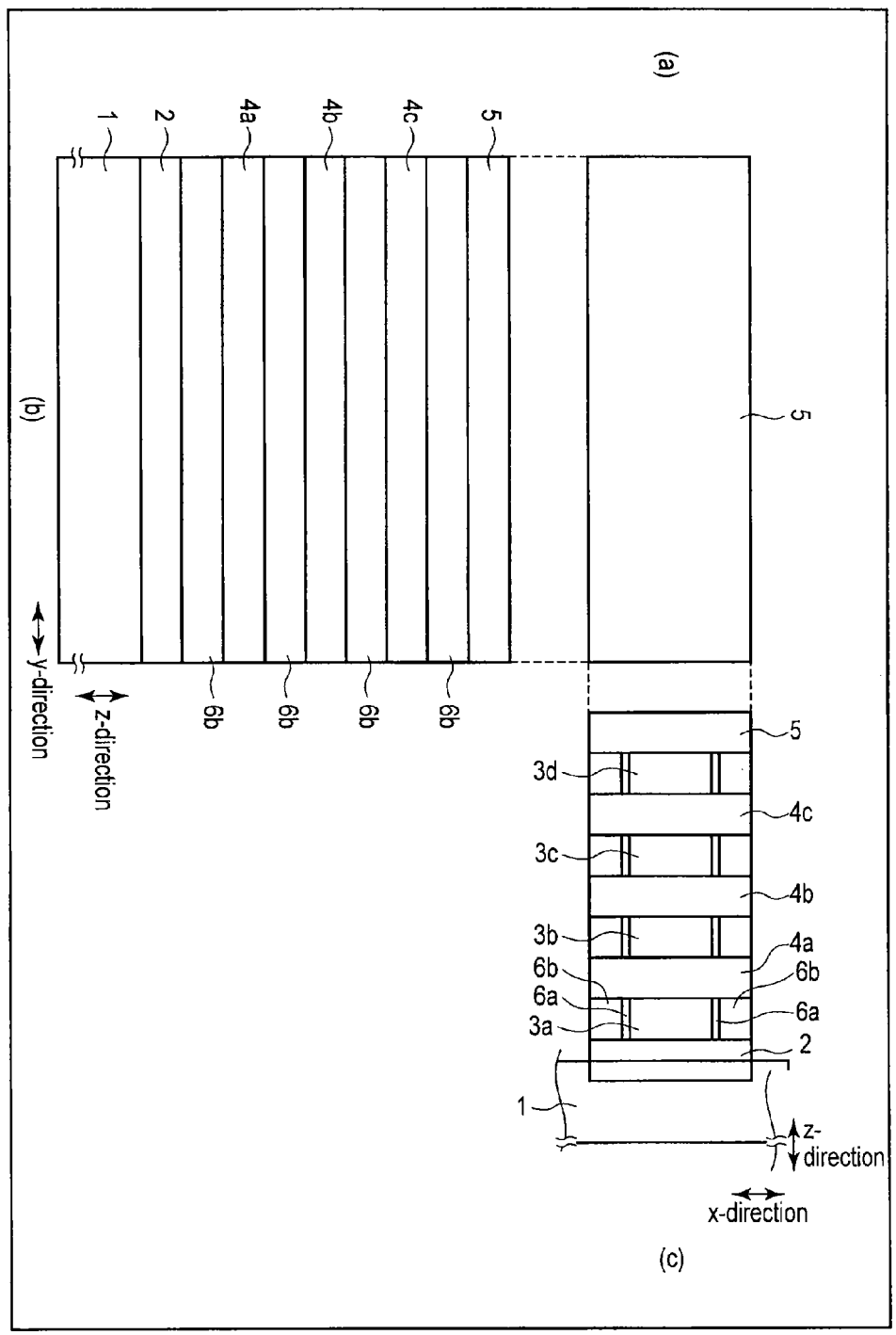

As shown in FIG. 14E, charge storage layer 6b is then selectively etched by anisotropic dry etching. As a result, charge storage layer 6b only remains in first to fourth recesses 21a to 21d on the side surfaces of first to fourth semiconductor layers 3a to 3d in the x-direction.

That is, fifth insulating layer 5 is exposed when uppermost charge storage layer 6b is removed. Therefore, fifth insulating layer 5 is used as a mask to further etch charge storage layer 6b, and first to fourth charge storage layers 6b are then formed in first to fourth recesses 21a to 21d, respectively.

Here, as fifth insulating layer 5 functions as a mask for etching charge storage layer 6b, the width of fifth insulating layer 5 in the z-direction may be greater than the width of each of first to fourth insulating layers 2, 4a to 4c in the z-direction.

If the function of fifth insulating layer 5 as the mask is regarded as important, fifth insulating layer 5 may be formed by a method and a material different from first to fourth insulating layers 2, 4a to 4c (e.g., a stacked layer structure of different insulating layers).

At this point, first to fourth charge storage layers 6b are separated in the z-direction.

Figure 14F:
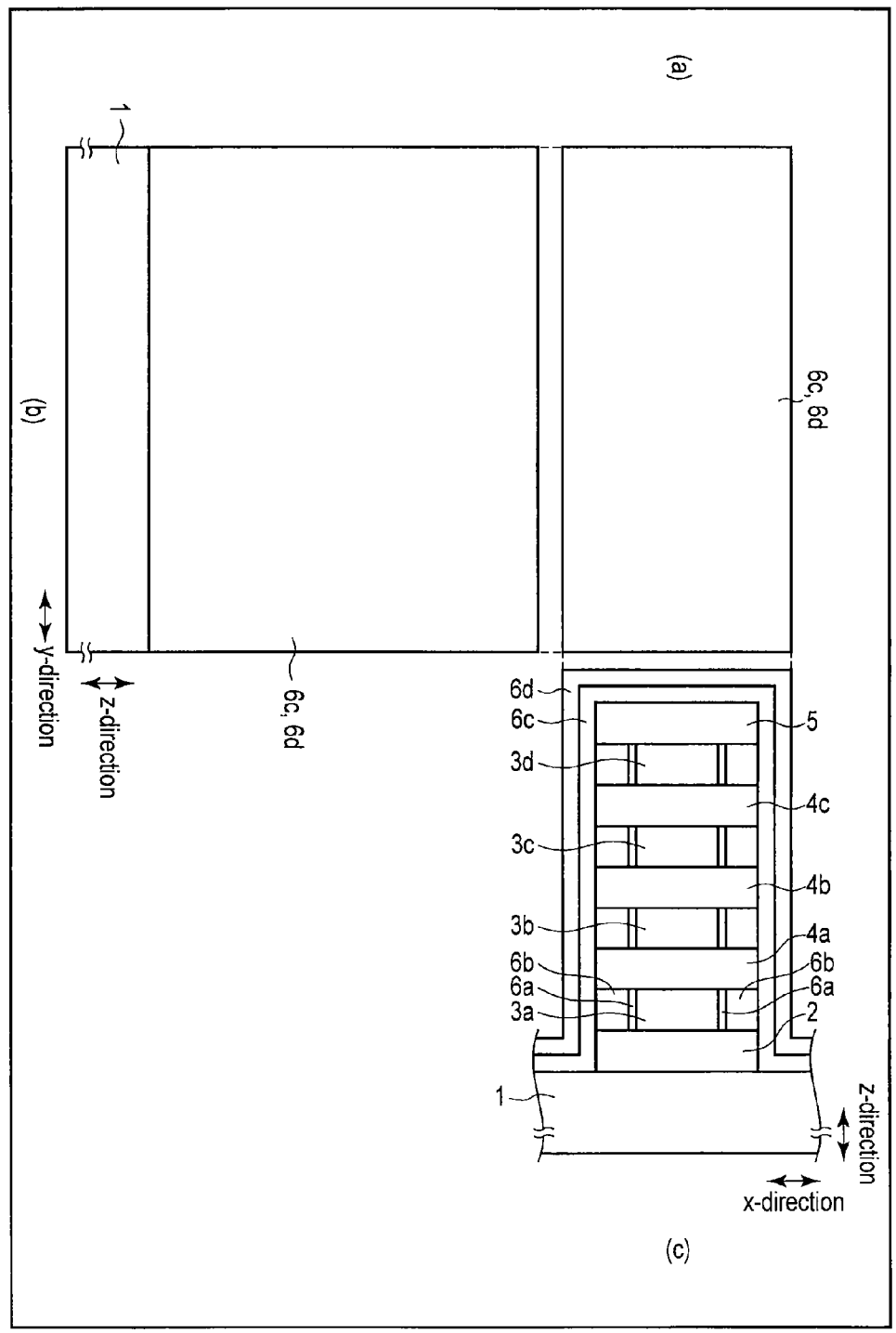

As shown in FIG. 14F, second gate insulating layer 6c and control gate electrode 6d that cover the fin-type stacked layer structure (including first to fourth charge storage layers 6b) are then formed. A material such as aluminum oxide can be used as second gate insulating layer 6c, and a material such as nickel silicide can be used as control gate electrode 6d.

Figure 14G:
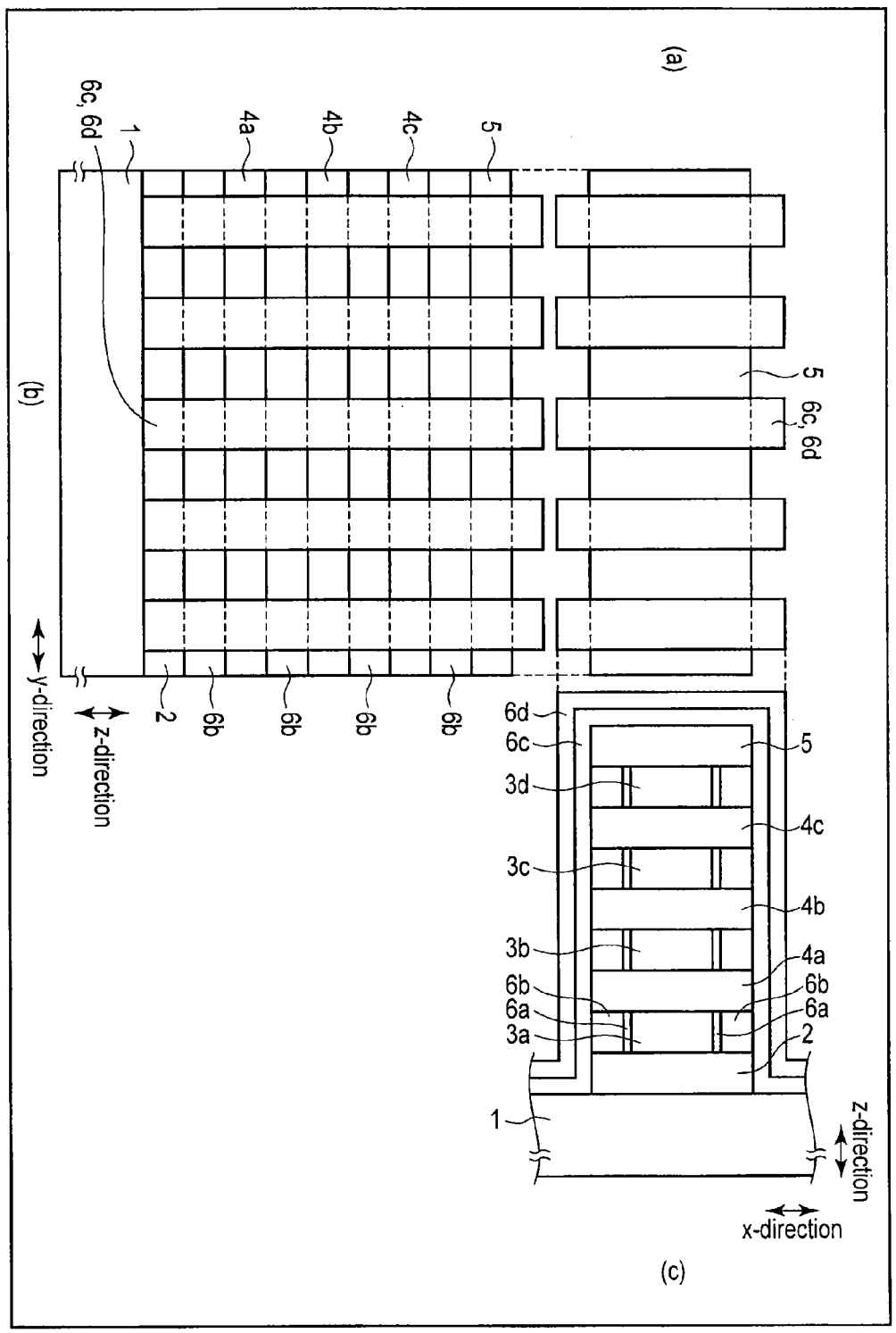

As shown in FIG. 14G, second gate insulating layer 6c and control gate electrode 6d are fabricated by the PEP and anisotropic dry etching, and control gate electrodes (word lines) 6d, . . . are formed. Control gate electrodes (word lines) 6d, . . . extend in the x-direction on the z-direction side of fifth insulating layer 5, and extend in the z-direction on the x-direction side of first to fourth charge storage layers 6b.

Figure 14H:
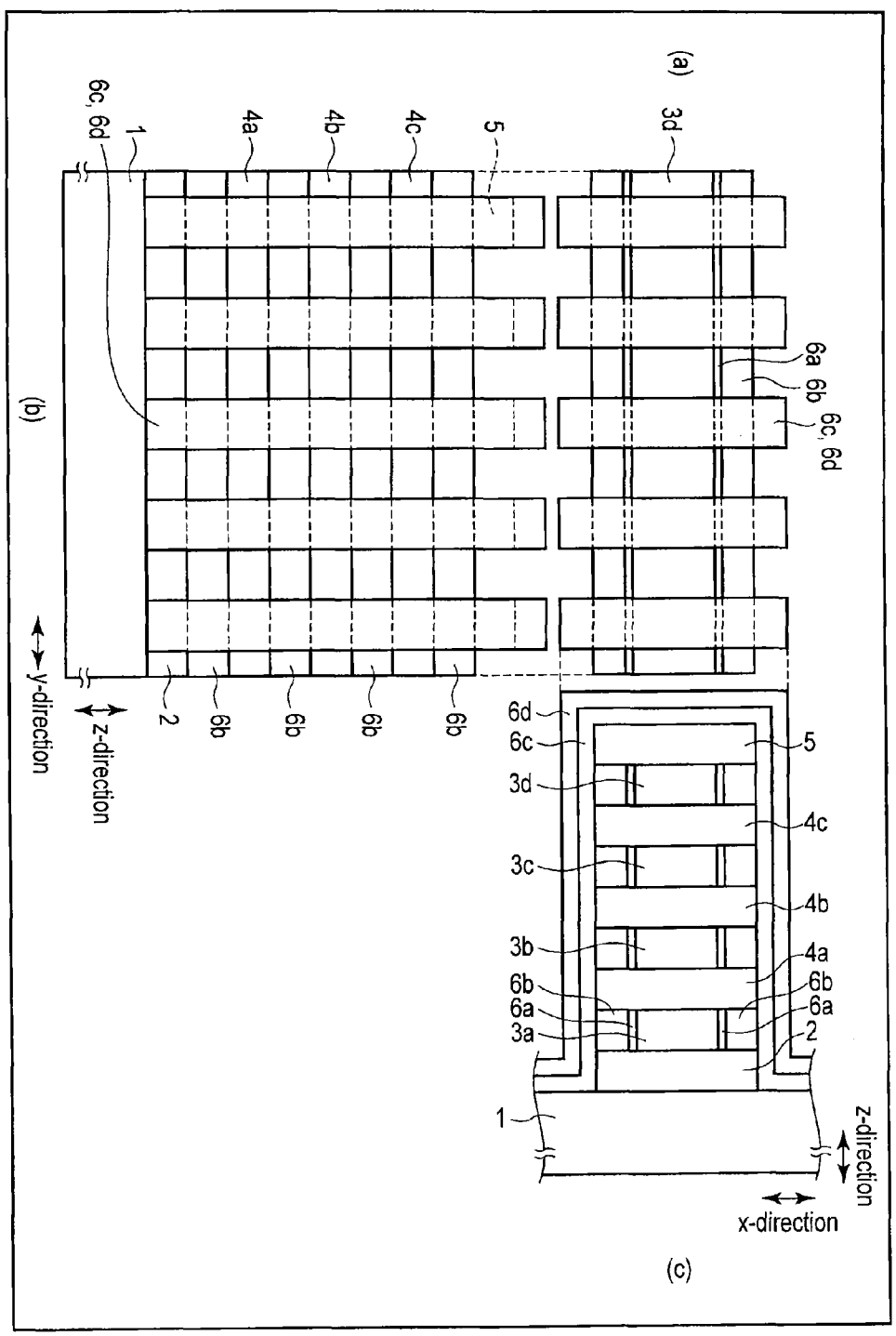

As shown in FIG. 14H, fifth insulating layer 5 is then selectively etched by anisotropic dry etching. At the same time, control gate electrodes 6d, . . . function as masks for the anisotropic dry etching. Therefore, in parts that are not covered by control gate electrodes 6d, . . . , fifth insulating layer 5 is selectively removed, and the side surfaces of fourth semiconductor layer 3d and fourth charge storage layer 6b in the z-direction are exposed.

Figure 14I:
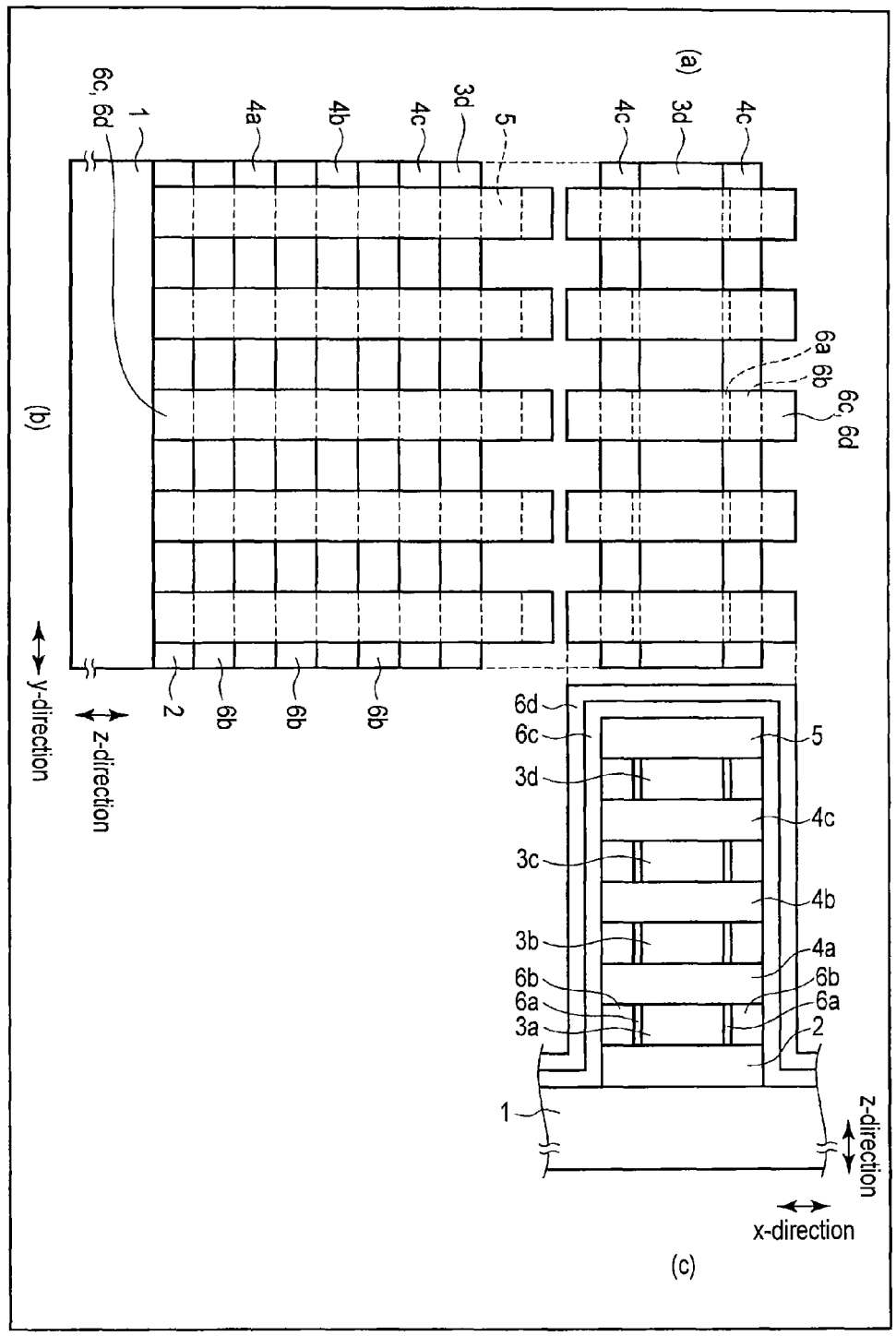

As shown in FIG. 14I, fourth charge storage layer 6b is then selectively etched by anisotropic dry etching. At the same time, control gate electrodes 6d, . . . and fourth semiconductor layer 3d function as masks for the anisotropic dry etching.

Therefore, as the part of fourth charge storage layer 6b that is not covered by control gate electrodes 6d, . . . is selectively removed, fourth charge storage layers 6b, . . . separated in the y-direction are formed on the x-direction side of fourth semiconductor layer 3d.

Figure 14J:
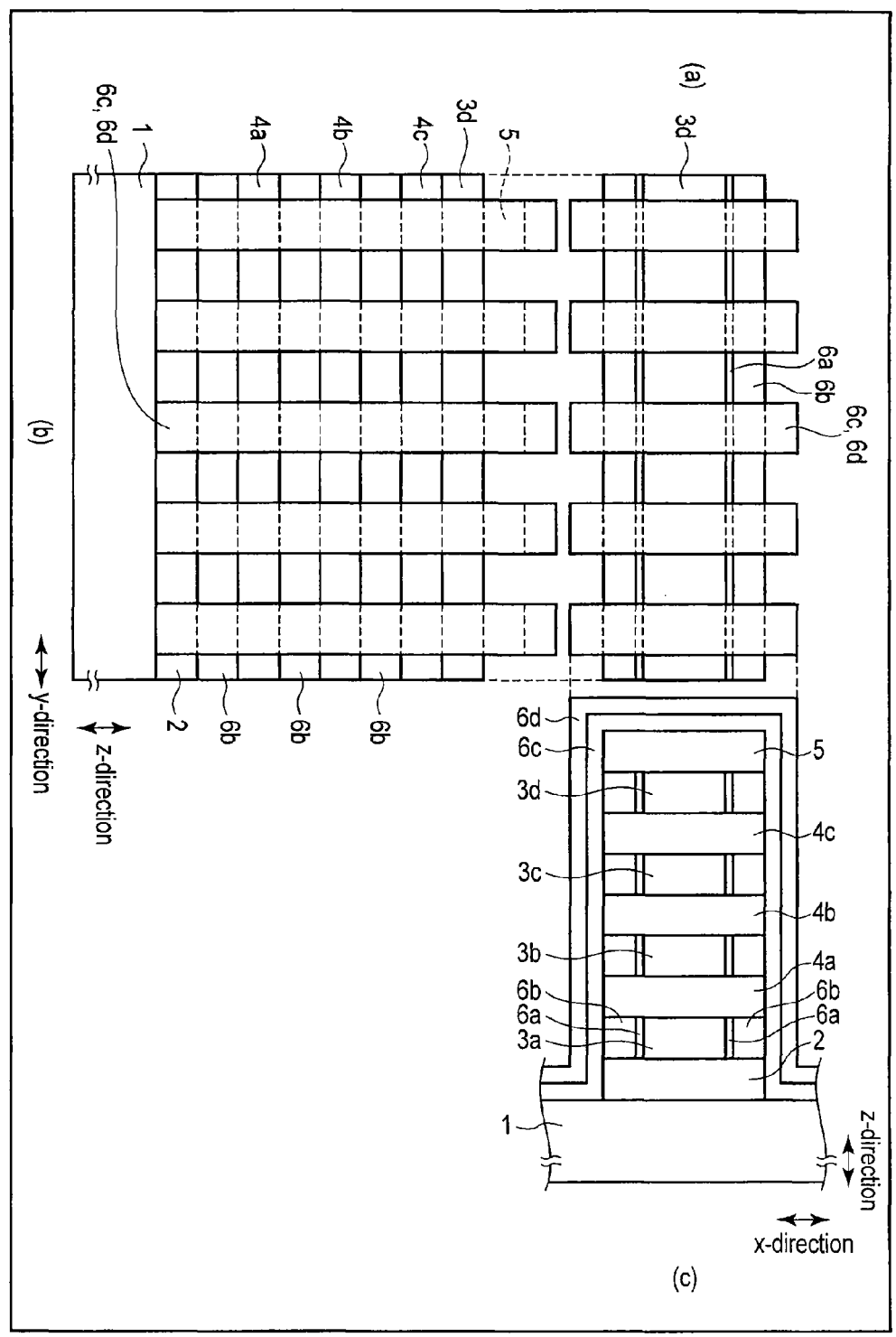

As shown in FIG. 14J, fourth insulating layer 4c is then selectively etched by anisotropic dry etching. At the same time, control gate electrodes 6d, . . . and fourth semiconductor layer 3d function as masks for the anisotropic dry etching.

Therefore, in parts that are not covered by control gate electrodes 6d, . . . and fourth semiconductor layer 3d, fourth insulating layer 4c is selectively removed, and the side surface of third charge storage layer 6b in the z-direction is exposed.

Figure 14K:
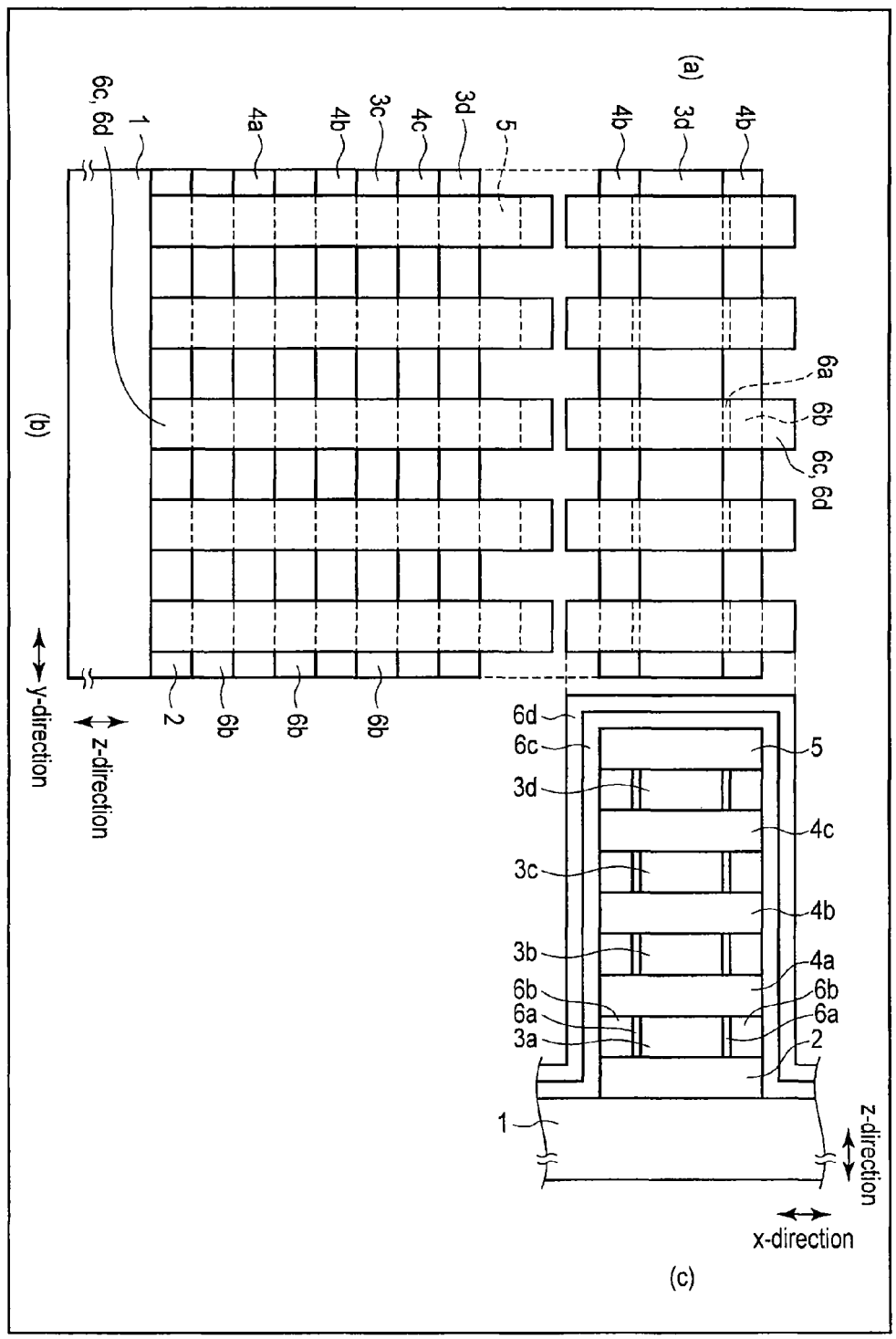

As shown in FIG. 14K, third charge storage layer 6b is then selectively etched by anisotropic dry etching. At the same time, control gate electrodes 6d, . . . and fourth semiconductor layer 3d function as masks for the anisotropic dry etching.

Therefore, as the part of third charge storage layer 6b that is not covered by control gate electrodes 6d, . . . is selectively removed, third charge storage layers 6b, . . . separated in the y-direction are formed on the x-direction side of third semiconductor layer 3c.

Similarly, second charge storage layers 6b, . . . separated in the y-direction are formed on the x-direction side of second semiconductor layer 3b, and first charge storage layers 6b, . . . separated in the y-direction are formed on the x-direction side of first semiconductor layer 3a.

Figure 14L:
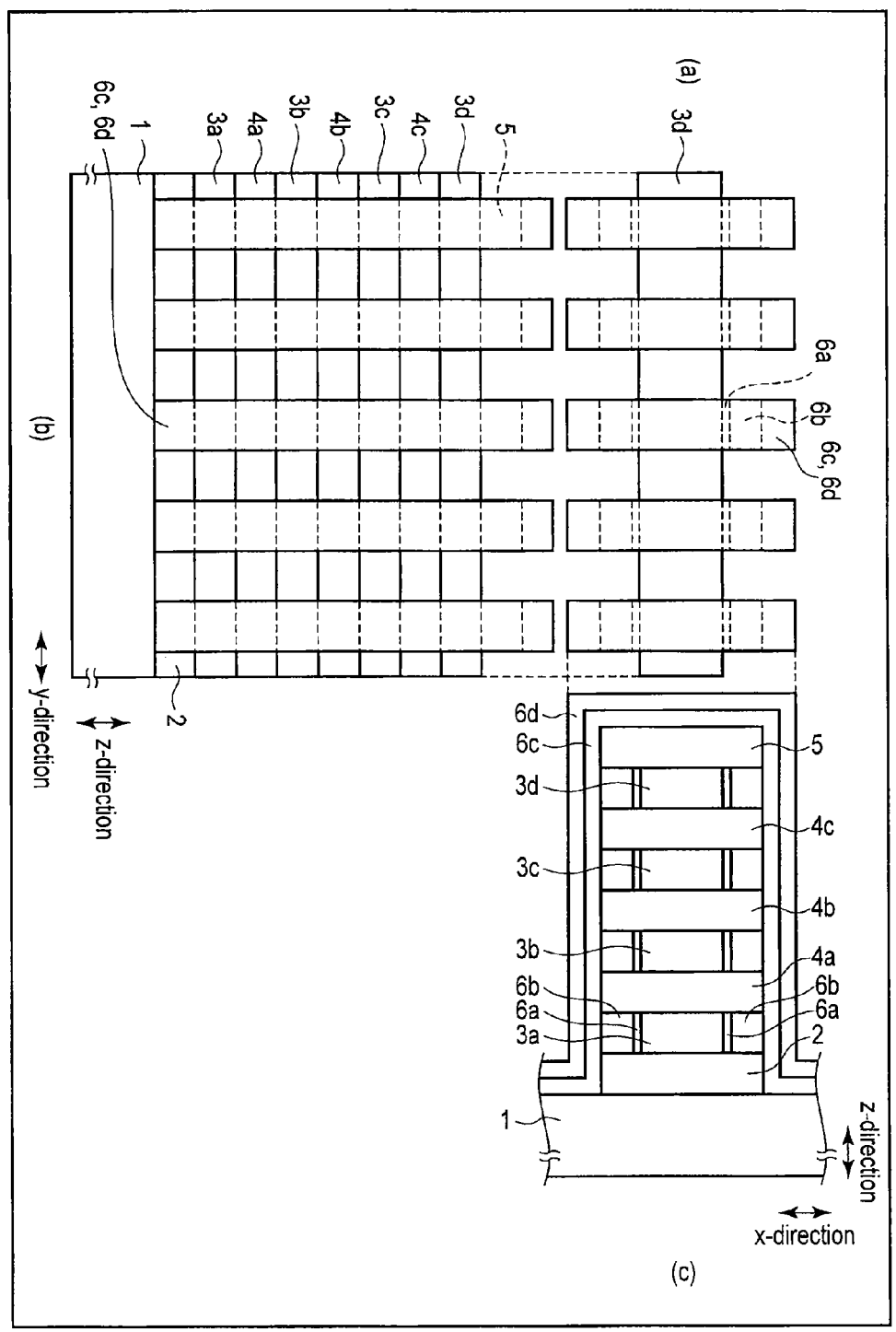

As shown in FIG. 14L, charge storage layers 6b, . . . physically separated for the respective memory cells are formed by the process described above. This prevents a situation where a charge in a charge storage layer moves to another charge storage layer in first to fourth charge storage layers 6b, . . . , so that satisfactory data retention characteristics can be obtained.

In the manufacturing method according to the present embodiment, as apparent from FIG. 14I to FIG. 14K, uppermost fourth semiconductor layer 3d functions as the etching mask during the etching to accomplish the independence of the charge storage layers.

Therefore, it is preferable that fourth semiconductor layer 3d is a dummy layer and that the width of fourth semiconductor layer 3d in the z-direction is greater than the width of each of first to third semiconductor layers 3a to 3c in the z-direction.

J. Second Manufacturing Method

A method of manufacturing the structure according to the second modification (FIG. 4) is described below with reference to FIG. 15A to FIG. 15N. In each of these drawings, (a) is a plan view, (b) is a side view from the x-direction, and (c) is a side view from the y-direction.

Figure 15A:
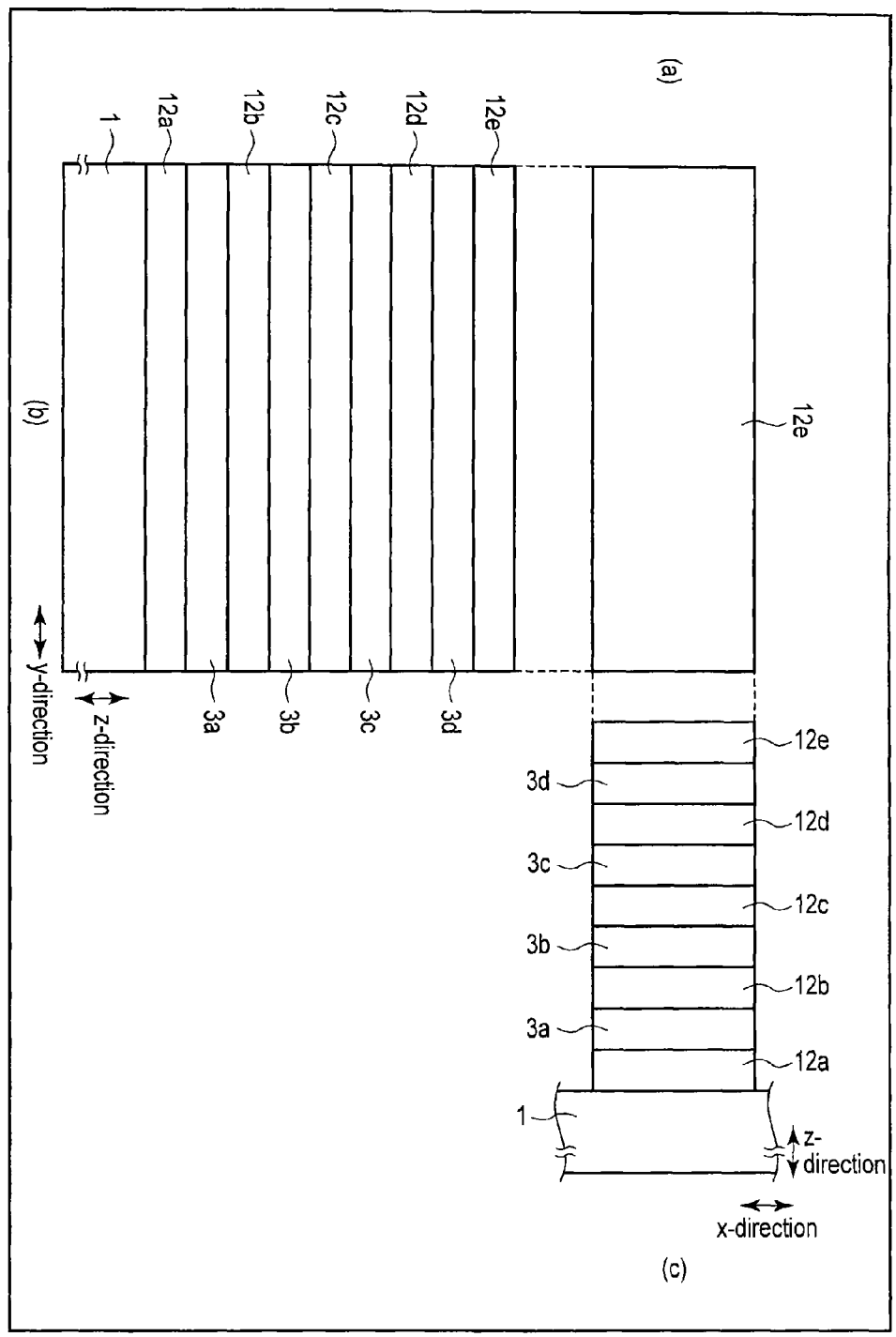
FIGS. 15A to 15N are diagrams, each showing a second example of a manufacturing method of the first embodiment.

First, as shown in FIG. 15A, first temporary layer 12a, first semiconductor layer 3a, second temporary layer 12b, second semiconductor layer 3b, third temporary layer 12c, third semiconductor layer 3c, fourth temporary layer 12d, fourth semiconductor layer 3d, and fifth temporary layer 12e are sequentially formed in the z-direction perpendicular to the surface of semiconductor substrate 1.

Here, semiconductor substrate 1 is, for example, a p-type silicon substrate having a plane direction (100) and a specific resistance of 10 to 20 Ωcm. First to fifth temporary layers 12a to 12e are made of silicon germanium. First to fourth semiconductor layers 3a to 3d are made of silicon.

In the case of a stacked layer structure of silicon and silicon germanium, these materials are alternately stacked by epitaxial growth, and monocrystalline silicon can be obtained. Thus, characteristic variations among first to fourth semiconductor layers (silicon channels) $3a$ to $3d$ are reduced, and the channel mobility of the silicon channels can be improved.

First to fifth temporary layers $12a$ to $12e$ and first to fourth semiconductor layers $3a$ to $3d$ are then fabricated by the PEP and anisotropic dry etching, and a fin-type stacked layer structure extending in the y-direction parallel to the surface of semiconductor substrate 1 is formed.

Figure 15B:
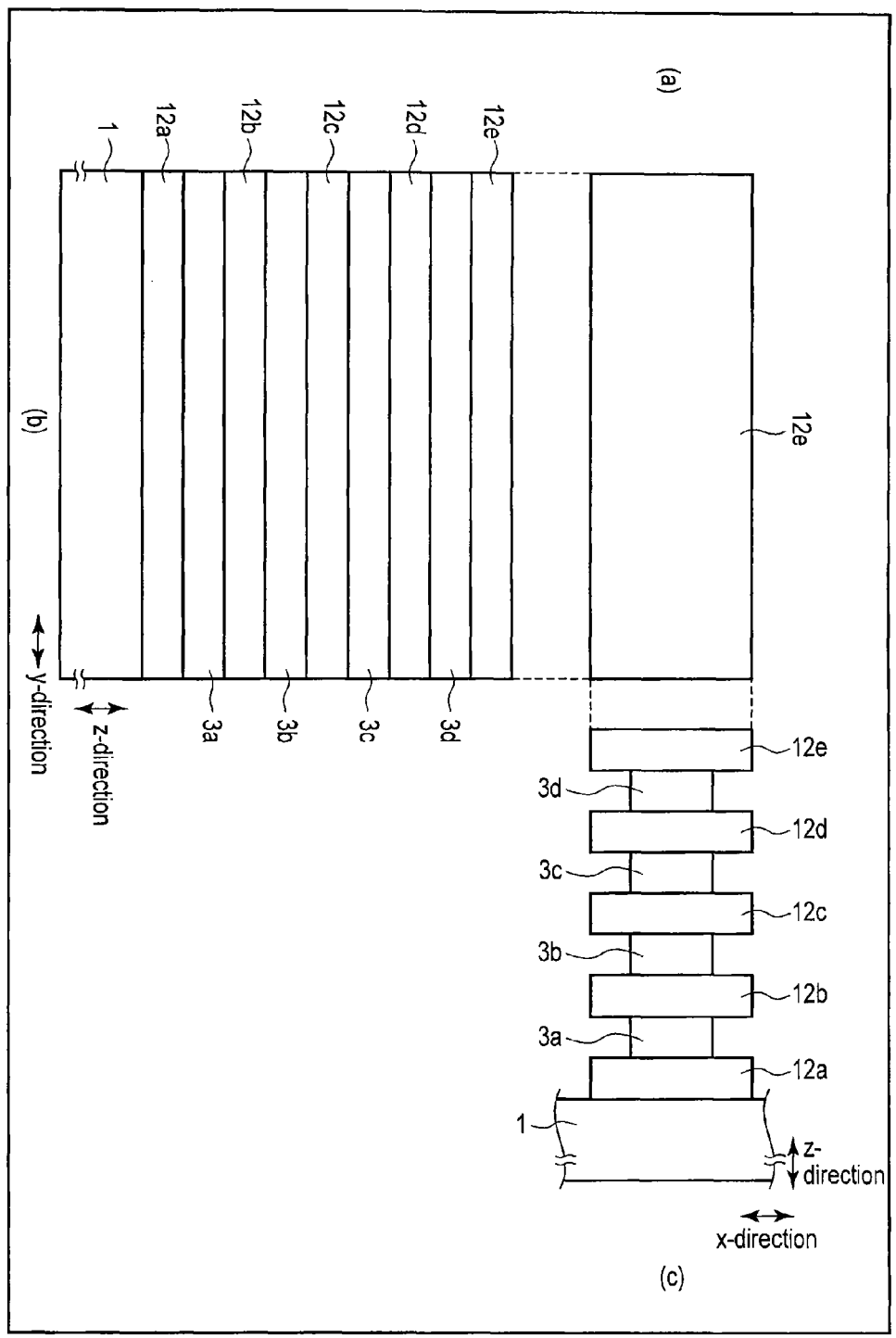

As shown in FIG. 15B, the side surfaces of first to fourth semiconductor layers $3a$ to $3d$ in the x-direction are then selectively etched by the isotropic dry etching. As a result, the side surfaces of first to fourth semiconductor layers $3a$ to $3d$ in the x-direction are set back, and first to fourth recesses $21a$ to $21d$ extending in the y-direction are formed.

As shown in FIG. 15C, the side surfaces of first to fourth semiconductor layers $3a$ to $3d$ in the x-direction are then thermally oxidized, and first gate insulating layers (e.g., silicon oxide) $6a$ are formed on the side surfaces of first to fourth semiconductor layers $3a$ to $3d$ in the x-direction.

Figure 15D:
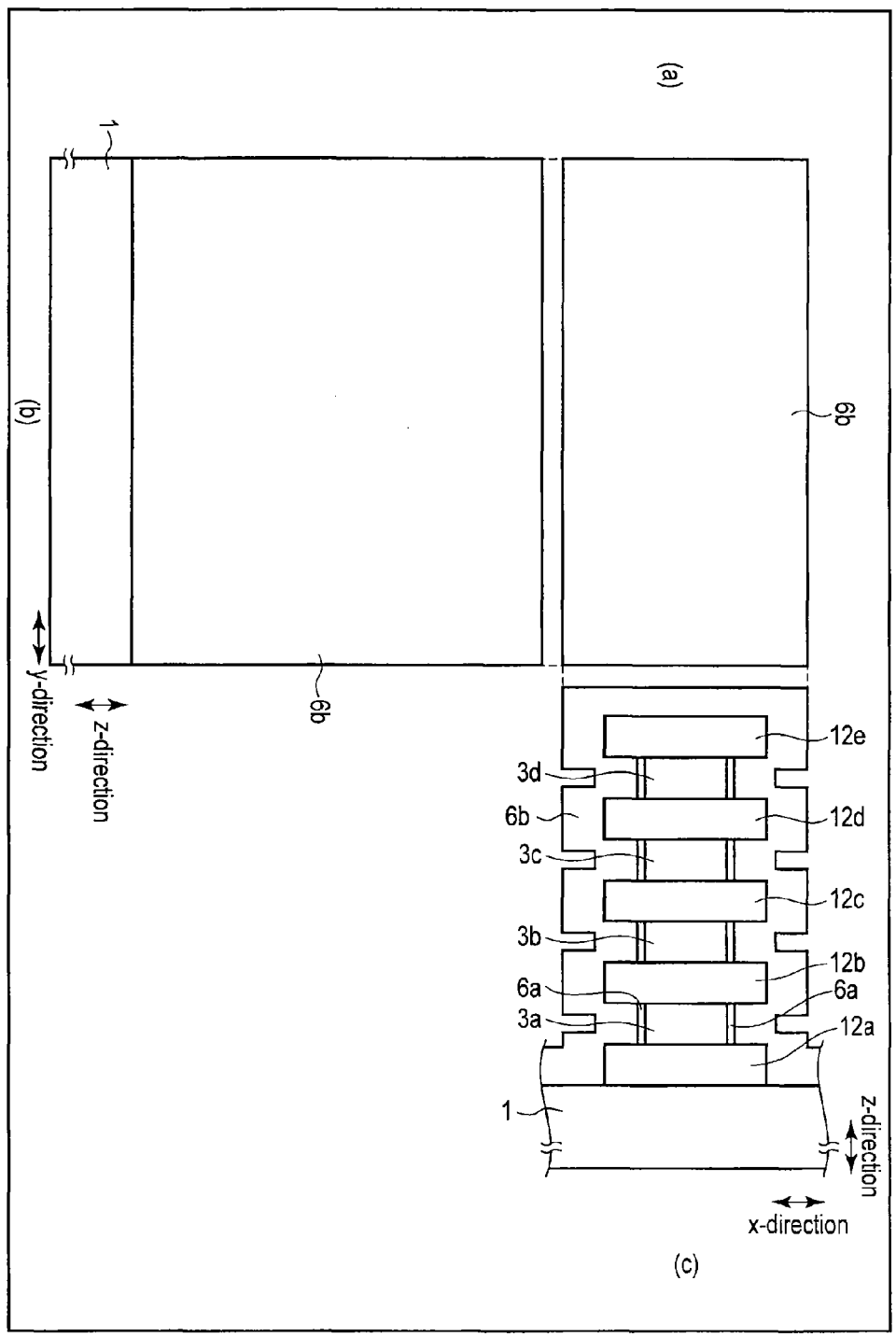

As shown in FIG. 15D, charge storage layer $6b$ covering the fin-type stacked layer structure is then formed. A material such as silicon nitride or conductive polysilicon can be used as charge storage layer $6b$.

Figure 15E:
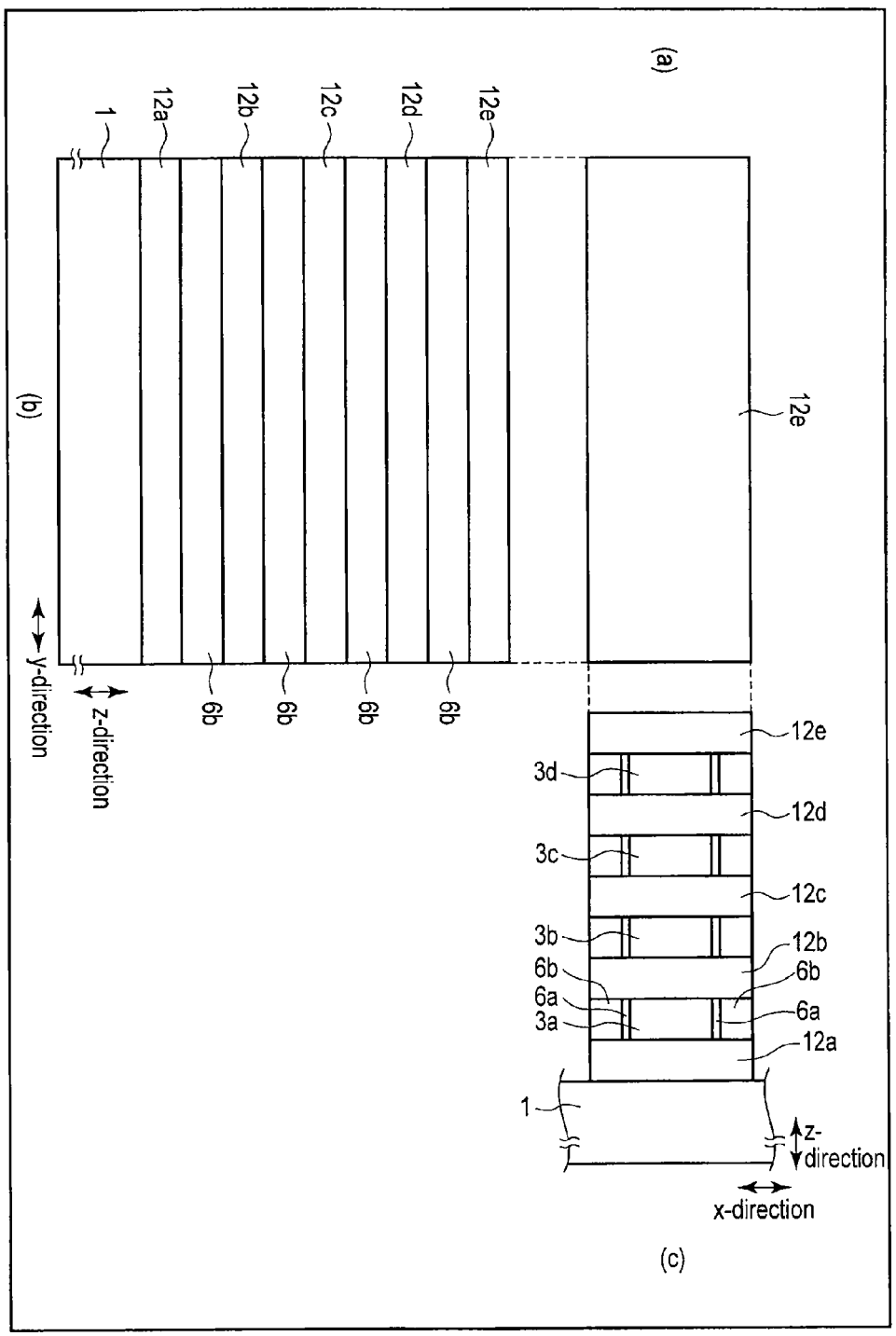

As shown in FIG. 15E, charge storage layer $6b$ is then selectively etched by anisotropic dry etching. As a result, charge storage layer $6b$ only remains in first to fourth recesses $21a$ to $21d$ on the side surfaces of first to fourth semiconductor layers $3a$ to $3d$ in the x-direction.

That is, fifth temporary layer $12e$ is exposed when uppermost charge storage layer $6b$ is removed. Therefore, fifth temporary layer $12e$ is used as a mask to further etch charge storage layer $6b$, and first to fourth charge storage layers $6b$ are then formed in first to fourth recesses $21a$ to $21d$, respectively.

Here, as fifth temporary layer $12e$ functions as a mask for etching charge storage layer $6b$, the width of fifth temporary layer $12e$ in the z-direction may be greater than the width of each of first to fourth temporary layers $12a$ to $12d$ in the z-direction.

If the function of fifth temporary layer $12e$ as the mask is regarded as important, fifth temporary layer $12e$ may be formed by a method and a material different from first to fourth temporary layers $12a$ to $12d$.

At this point, first to fourth charge storage layers $6b$ are separated in the z-direction.

Figure 15F:
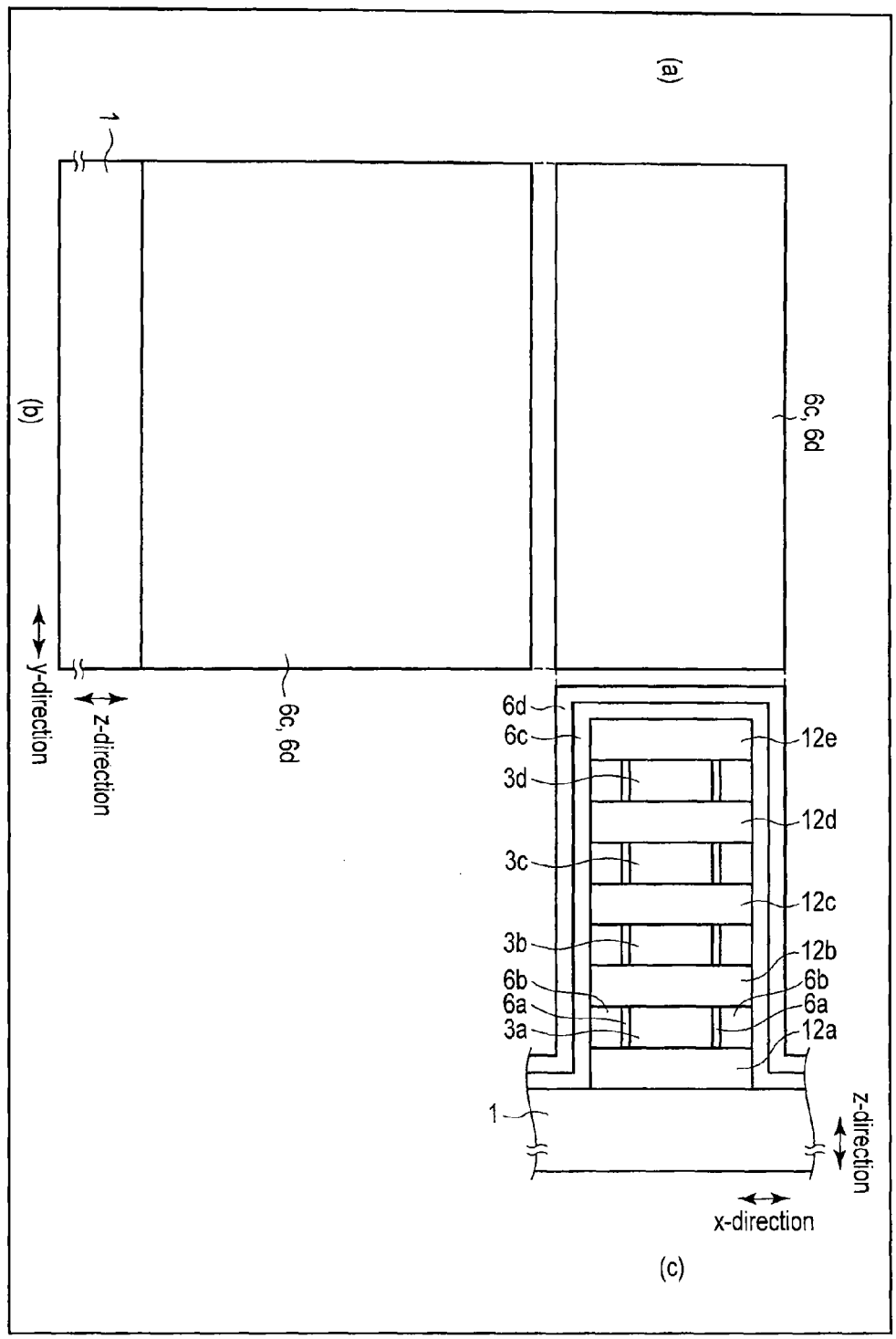

As shown in FIG. 15F, second gate insulating layer $6c$ and control gate electrode $6d$ that cover the fin-type stacked layer structure (including first to fourth charge storage layers $6b$) are then formed. A material such as aluminum oxide can be used as second gate insulating layer $6c$, and a material such as nickel silicide can be used as control gate electrode $6d$.

Figure 15G:
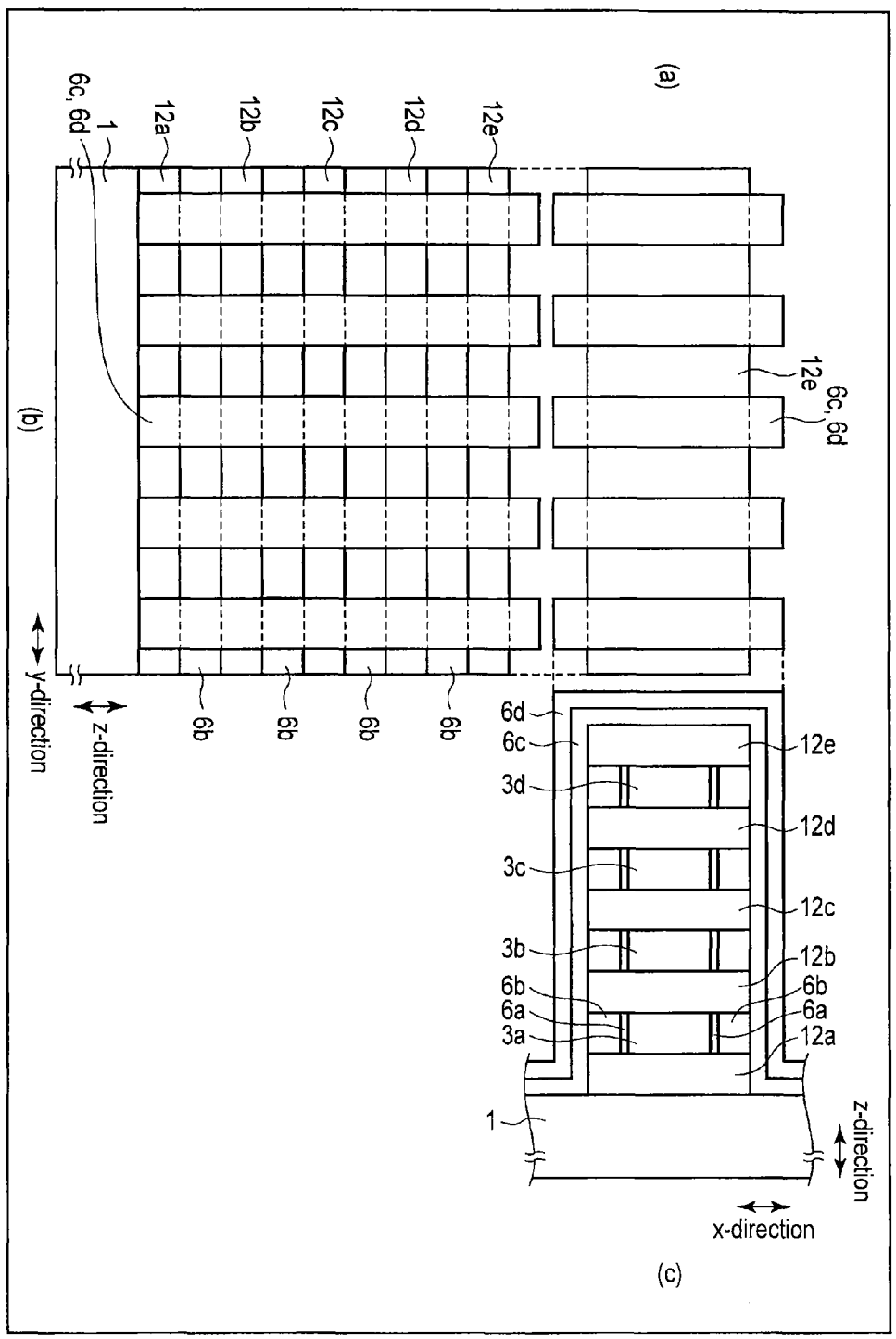

As shown in FIG. 15G, second gate insulating layer $6c$ and control gate electrode $6d$ are fabricated by the PEP and anisotropic dry etching, and control gate electrodes (word lines) $6d$, . . . are formed. Control gate electrodes (word lines) $6d$, . . . extend in the x-direction on the z-direction side of fifth temporary layer $12e$, and extend in the z-direction on the x-direction side of first to fourth charge storage layers $6b$.

Figure 15H:
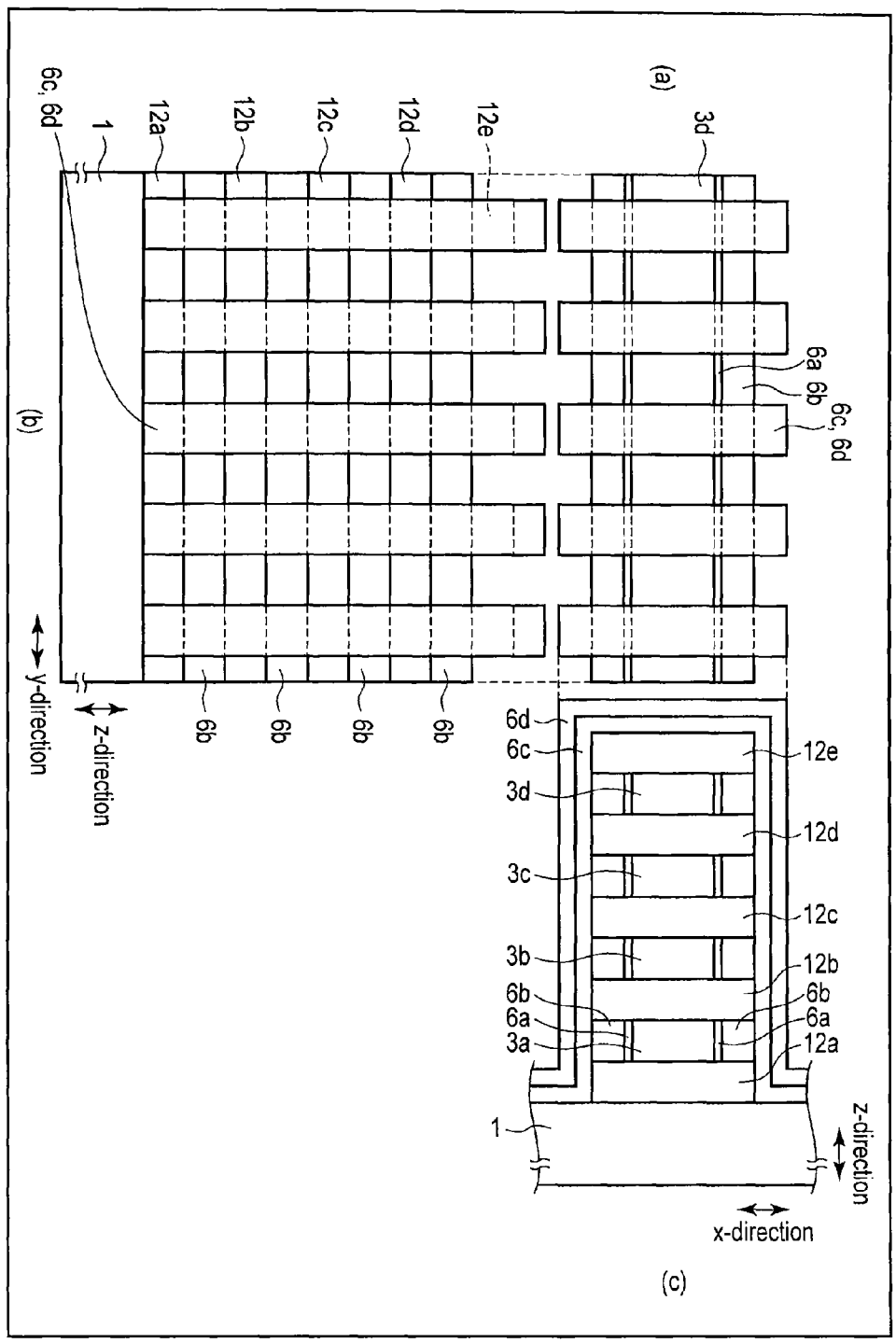

As shown in FIG. 15H, fifth temporary layer $12e$ is then selectively etched by anisotropic dry etching. At the same time, control gate electrodes $6d$, . . . function as masks for the anisotropic dry etching. Therefore, in parts that are not covered by control gate electrodes $6d$, . . . , fifth temporary layer $12e$ is selectively removed, and the side surfaces of fourth semiconductor layer $3d$ and fourth charge storage layer $6b$ in the z-direction are exposed.

Figure 15I:
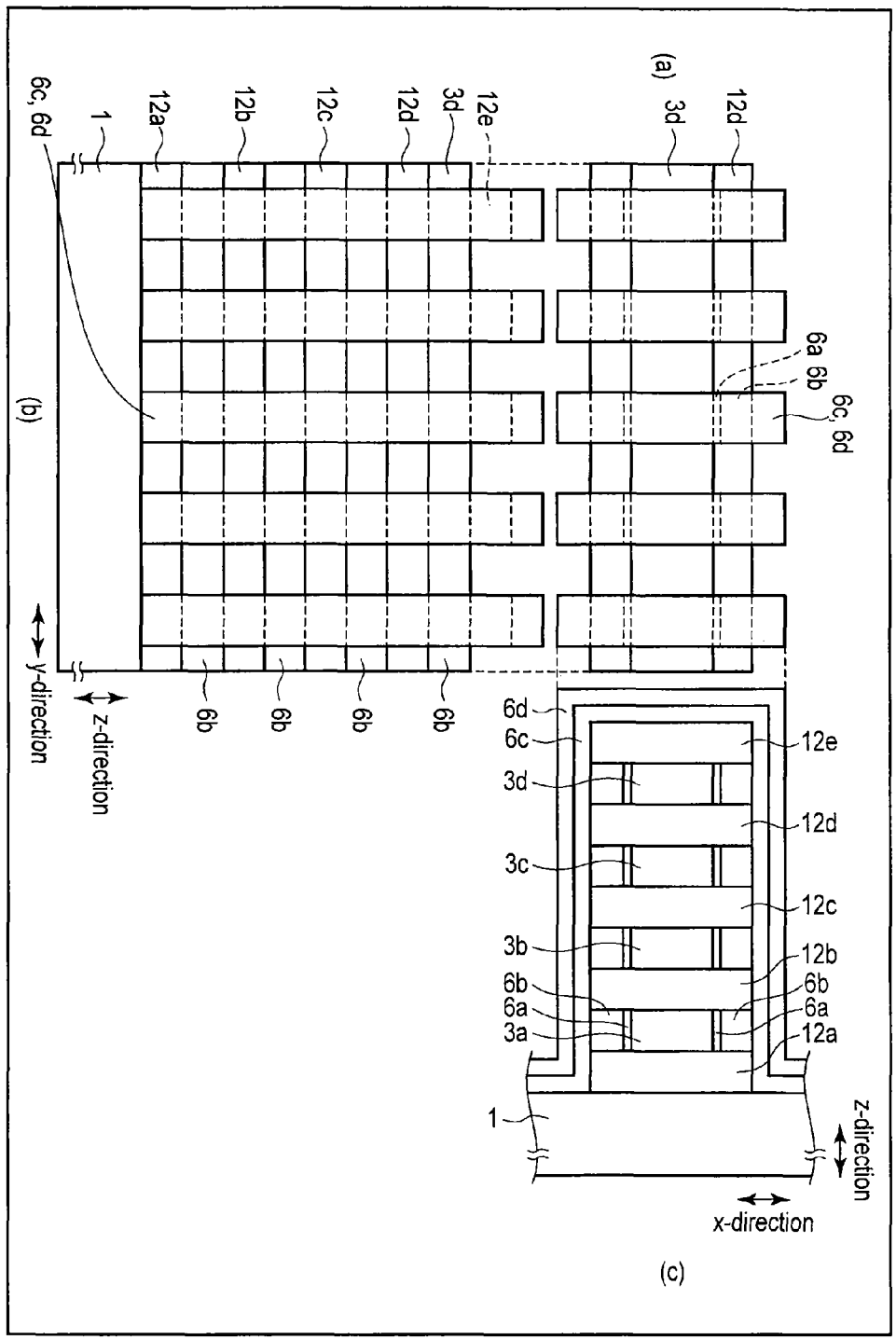

As shown in FIG. 15I, fourth charge storage layer $6b$ is then selectively etched by anisotropic dry etching. At the same time, control gate electrodes $6d$, . . . and fourth semiconductor layer $3d$ function as masks for the anisotropic dry etching.

Therefore, as the part of fourth charge storage layer $6b$ that is not covered by control gate electrodes $6d$, . . . is selectively removed, fourth charge storage layers $6b$, . . . separated in the y-direction are formed on the x-direction side of fourth semiconductor layer $3d$.

Figure 15J:
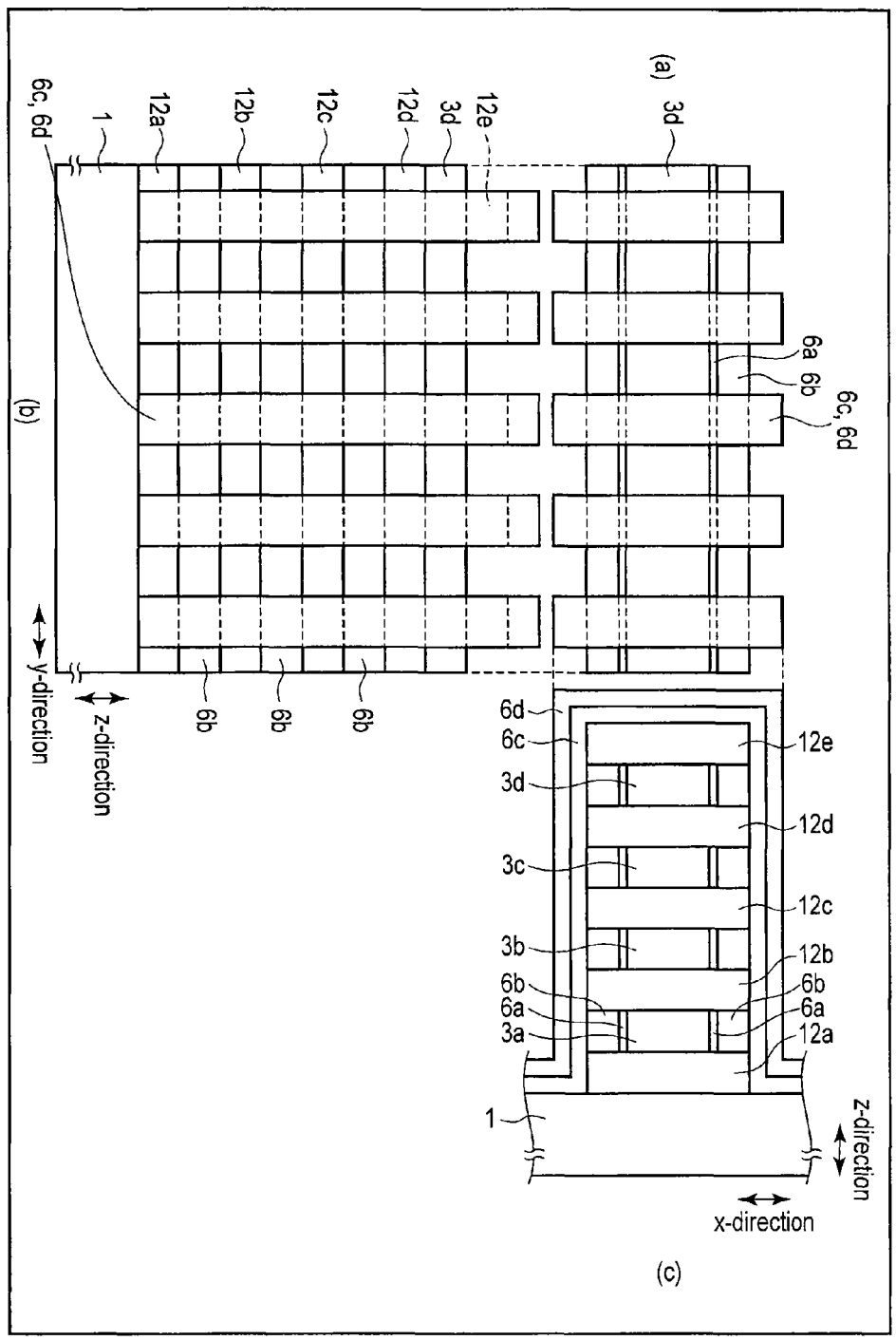

As shown in FIG. 15J, fourth temporary layer $12d$ is then selectively etched by anisotropic dry etching. At the same time, control gate electrodes $6d$, . . . and fourth semiconductor layer $3d$ function as masks for the anisotropic dry etching.

Therefore, in parts that are not covered by control gate electrodes $6d$, . . . and fourth semiconductor layer $3d$, fourth temporary layer $12d$ is selectively removed, and the side surface of third charge storage layer $6b$ in the z-direction is exposed.

As shown in FIG. 15K, third charge storage layer $6b$ is then selectively etched by anisotropic dry etching. At the same time, control gate electrodes $6d$, . . . and fourth semiconductor layer $3d$ function as masks for the anisotropic dry etching.

Therefore, as the part of third charge storage layer $6b$ that is not covered by control gate electrodes $6d$, . . . is selectively removed, third charge storage layers $6b$, . . . separated in the y-direction are formed on the x-direction side of second semiconductor layer $3b$.

Similarly, second charge storage layers $6b$, . . . separated in the y-direction are formed on the x-direction side of second semiconductor layer $3b$, and first charge storage layers $6b$, . . . separated in the y-direction are formed on the x-direction side of first semiconductor layer $3a$.

As shown in FIG. 15L, charge storage layers $6b$, . . . physically separated for the respective memory cells are formed by the process described above. This prevents a situation where a charge in a charge storage layer moves to another charge storage layer in first to fourth charge storage layers $6b$, . . . , so that satisfactory data retention characteristics can be obtained.

Figure 15M:
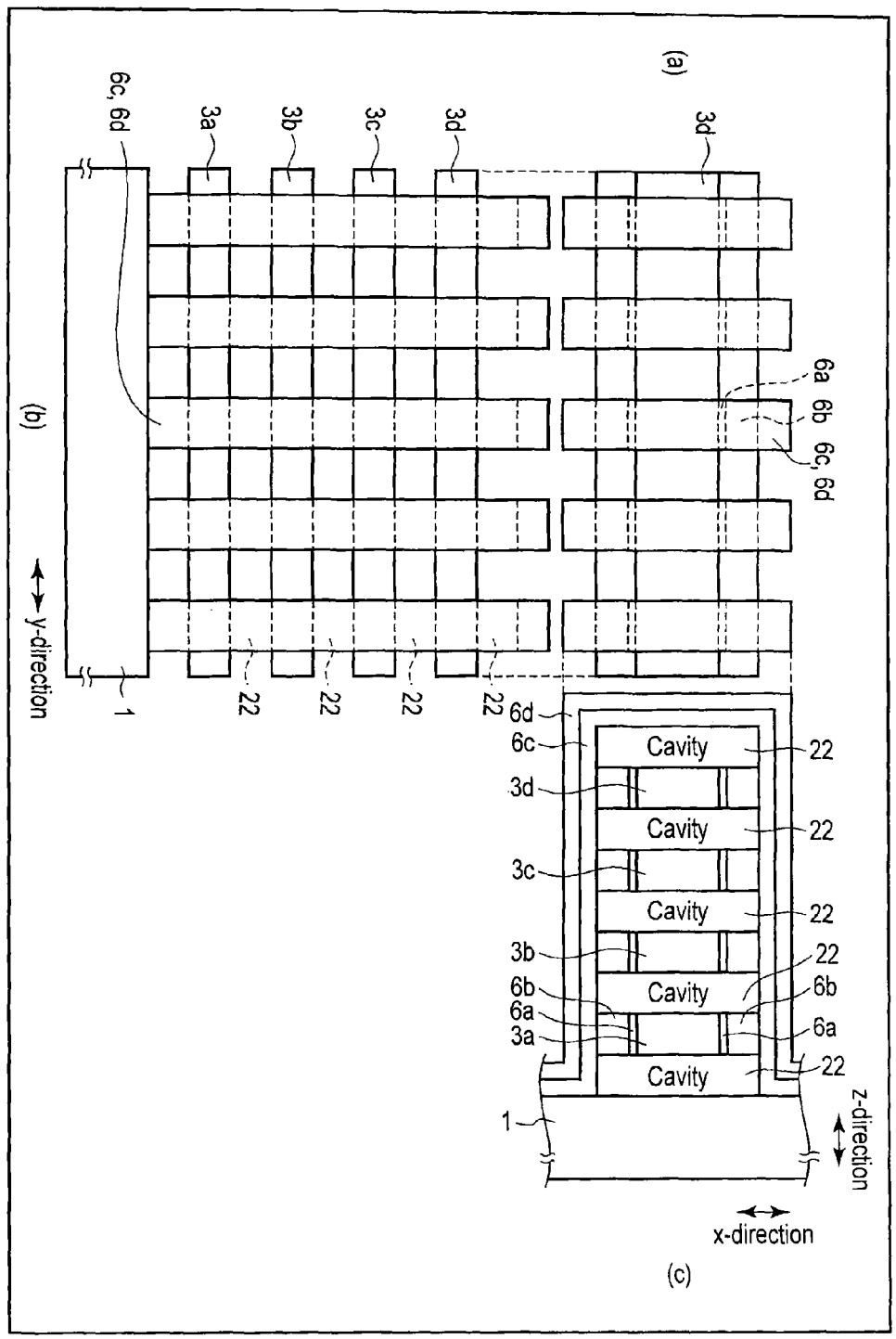

As shown in FIG. 15M, first to fifth temporary layers $12a$ to $12e$ are then selectively removed by isotropic dry etching, and cavities $22$, . . . are formed on upper and lower sides (z-direction sides) of first to fourth semiconductor layers $3a$ to $3d$.

In FIG. 15L, first to fifth temporary layers $12a$ to $12e$ can be easily removed by isotropic dry etching because the space between control gate electrodes $6d$, . . . and the space between first to fourth semiconductor layers $3a$ to $3d$ (first to fourth charge storage layers $6b$, . . . ) are exposed.

Figure 15N:
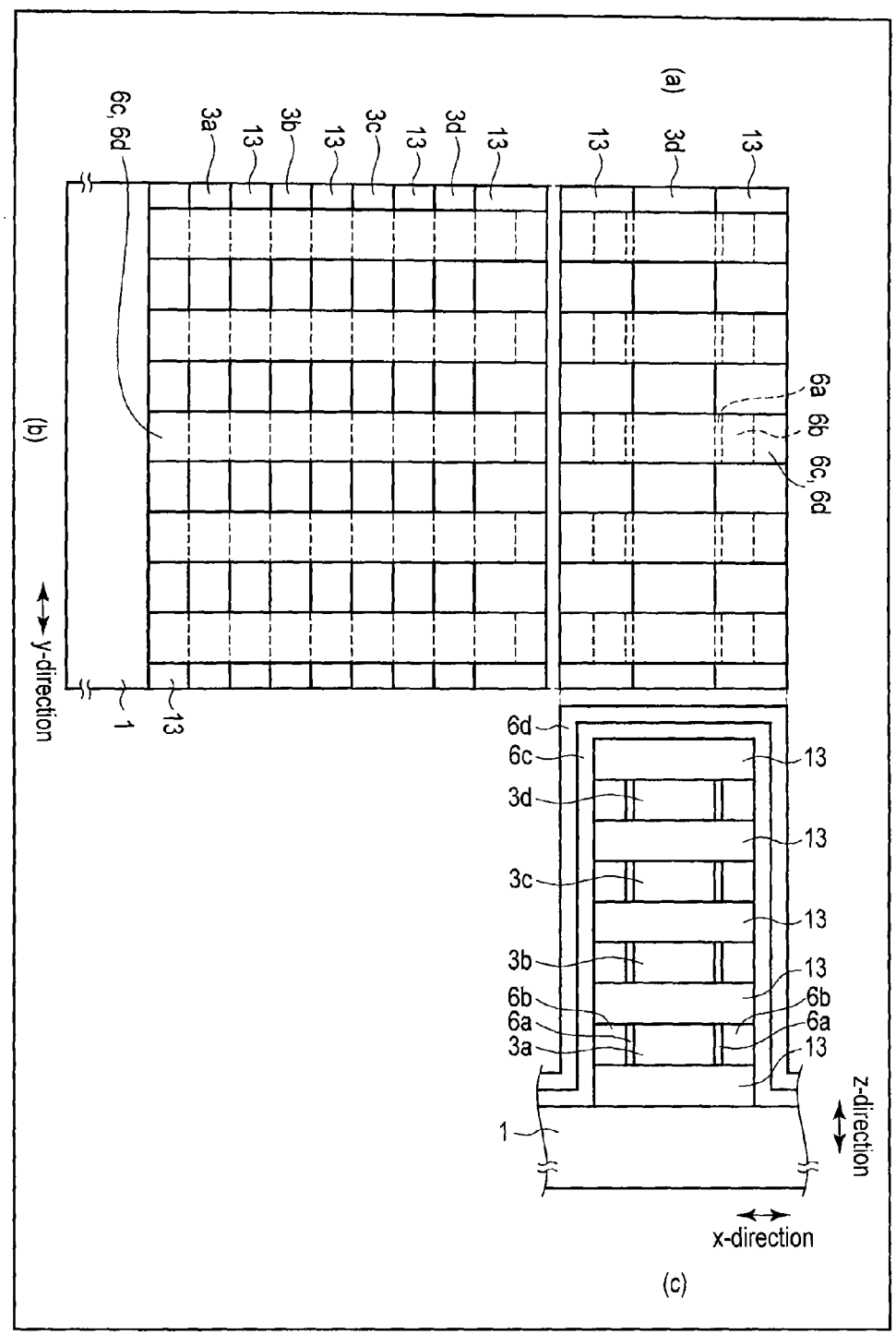

Although cavities $22$, . . . may be as they are, cavities $22$, . . . may be filled with insulating layers (e.g., silicon oxide) 13 as shown in FIG. 15N. In this case, insulating layers 13 may be porous insulating layers.

In the manufacturing method according to the present embodiment as well, as apparent from FIG. 15I to FIG. 15K, uppermost fourth semiconductor layer $3d$ functions as the etching mask during the etching to accomplish the independence of the charge storage layers.

Therefore, it is preferable that fourth semiconductor layer $3d$ is a dummy layer and that the width of fourth semiconductor layer $3d$ in the z-direction is greater than the width of each of first to third semiconductor layers $3a$ to $3c$ in the z-direction.

K. Summary

As described above, according to the first embodiment, a structure in which charge storage layers are independent for the respective memory cells is formed without a substantial increase in the number of processes, and it is thereby possible to provide high reliability of the three-dimensional stacked layer type semiconductor memory.

(2) Second Embodiment

A. Structure

Figure 16:
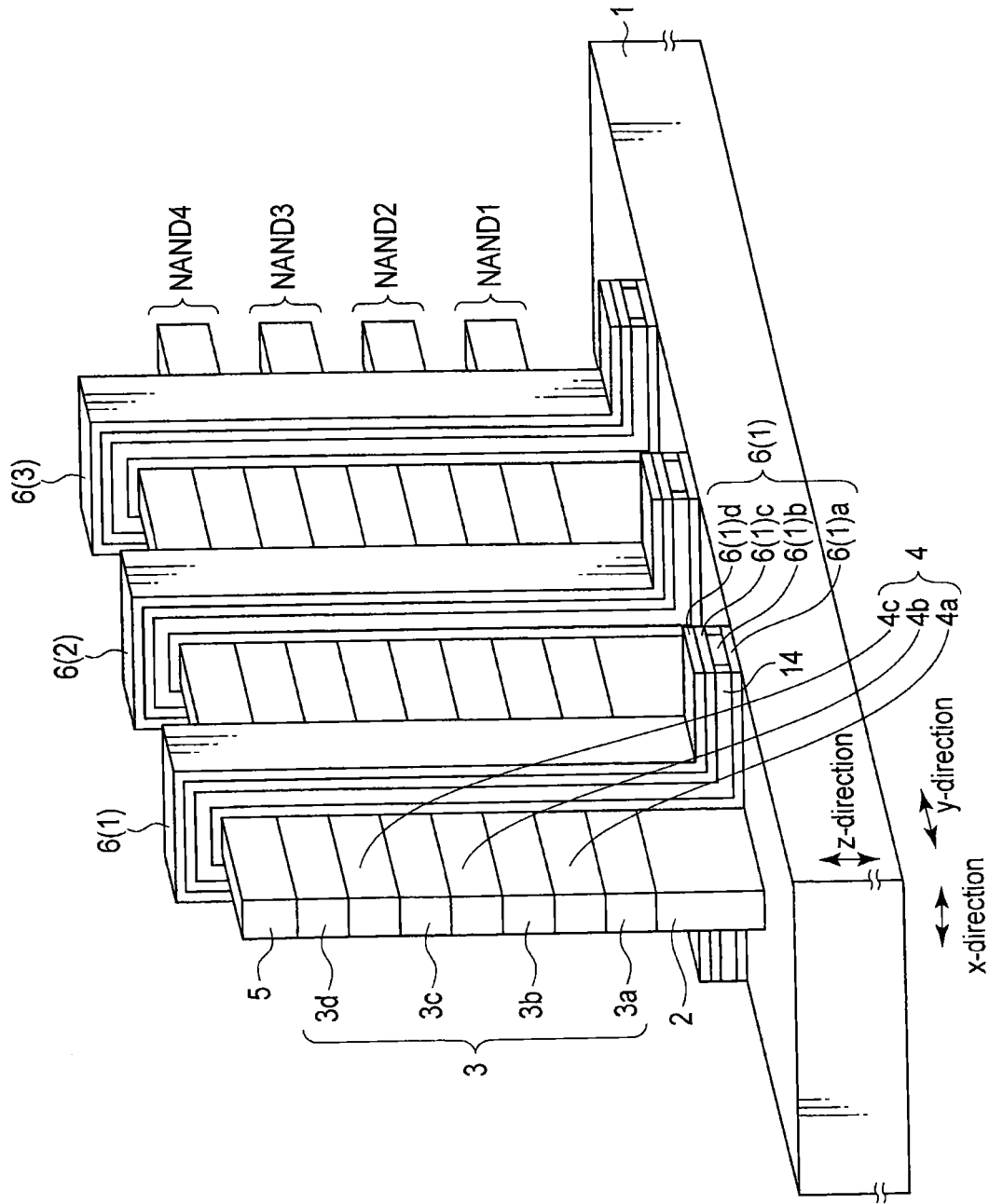
FIG. 16 is a view showing an overall structure of a second embodiment.
Figure 17:
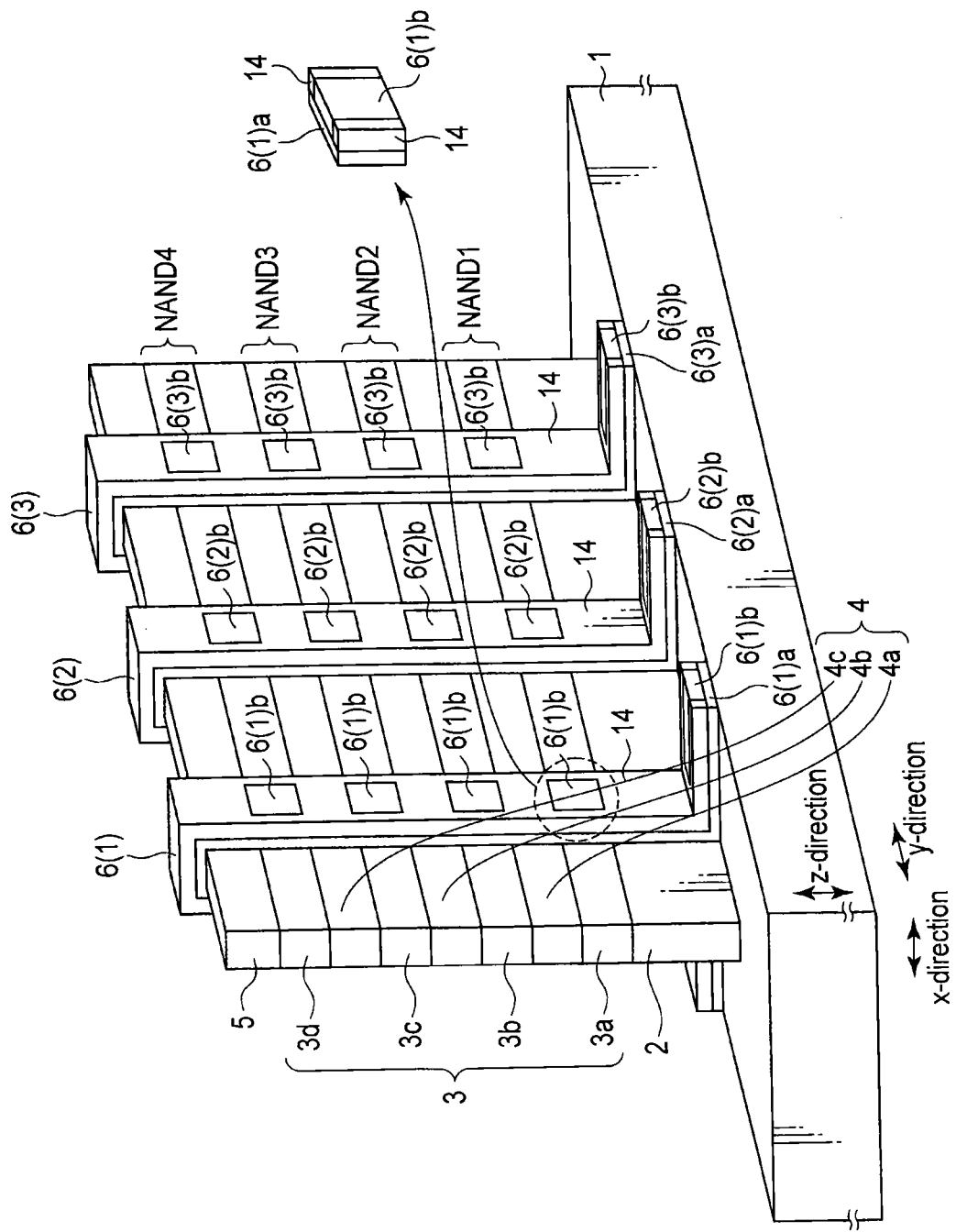
FIG. 17 is a view showing the structure of the second embodiment.

FIG. 16 shows a nonvolatile semiconductor memory device as the second embodiment. FIG. 17 shows a structure in which second gate insulating layer 6(1)c and control gate electrode 6(1)d are eliminated from the structure shown in FIG. 16.

Semiconductor substrate 1 is, for example, a silicon substrate. A fin-type stacked layer structure extending in a y-direction parallel to the surface of semiconductor substrate 1 is disposed on semiconductor substrate 1.

This fin-type stacked layer structure comprises first insulating layer 2, first semiconductor layer 3a, second insulating layer 4a, second semiconductor layer 3b, third insulating layer 4b, third semiconductor layer 3c, fourth insulating layer 4c, fourth semiconductor layer 3d, and fifth insulating layer 5 that are stacked in a z-direction perpendicular to the surface of semiconductor substrate 1.

First to fifth insulating layers 2, 4a to 4c, and 5 may be made of any insulator, and silicon oxide, for example, can be used. First to fourth semiconductor layers 3a to 3d are made of, for example, silicon.

On the x-direction side of first to fourth semiconductor layers 3 (3a, 3b, 3c, and 3d), stacked layer structure 6(1) in which first gate insulating layer 6(1)a, charge storage layer 6(1)b, second gate insulating layer 6(1)c, and control gate electrode 6(1)d are stacked in order in the x-direction is disposed.

First gate insulating layer 6(1)a is a tunnel insulating layer through which a tunnel current runs, and is made of, for example, silicon oxide. Charge storage layer 6(1)b is a layer for storing a charge, and its charge amount is controlled by the tunnel current.

Charge storage layer 6(1)b is made of an insulator or a conductor. When charge storage layer 6(1)a is an insulator (e.g., silicon nitride), a memory cell is a SONOS type. When charge storage layer 6(1)a is a conductor (e.g., conductive polysilicon), a memory cell is a floating gate type.

Charge storage layers 6(1)b are independent for the respective memory cells. In particular, four charge storage layers 6(1)b, . . . arranged in the z-direction are physically separated from one another by oxide (e.g., silicon oxynitride when charge storage layer 6(1)b is silicon nitride) 14 of the material that constitutes four charge storage layers 6(1)b, . . . .

Second gate insulating layer 6(1)c prevents a leakage current between charge storage layer 6(1)b and control gate electrode 6(1)d. Second gate insulating layer 6(1)c comprises, for example, a stacked layer structure or a material having a high dielectric constant to increase the coupling ratio of the memory cells and improve writing/erasing characteristics.

When the memory cell is the SONOS type, second gate insulating layer 6(1)c is generally called a block insulating layer. When the memory cell is the floating gate type, second gate insulating layer 6(1)c is generally called an inter-electrode insulating layer.

Control gate electrode 6(1)d functions as a word line, and extends in the x-direction on the z-direction side of fifth insulating layer 5 and extends in the z-direction on the x-direction side of first to fourth semiconductor layers 3 (3a, 3b, 3c, and 3d).

That is, control gate electrode 6(1)d covers four charge storage layers 6(1)b, . . . , and extends across the fin-type stacked layer structure in the x-direction.

Stacked layer structures 6(2) and 6(3) have the same structure as stacked layer structure 6(1).

By the device structure described above, a string of memory cells connected in series in the y-direction, that is, a NAND string is formed in each of first to fourth semiconductor layers 3 (3a, 3b, 3c, and 3d). Here, the NAND string formed in first semiconductor layer 3a is NAND1, the NAND string formed in second semiconductor layer 3b is NAND2, the NAND string formed in third semiconductor layer 3c is NAND3, and the NAND string formed in fourth semiconductor layer 3d is NAND4.

Charge storage layers 6(1)b of the memory cells that constitute these NAND strings are independent for the respective memory cells. That is, charge storage layers 6(1)b, . . . are physically separated from one another by oxide 14 of the material that constitutes four charge storage layers 6(1)b, . . . . Therefore, the reliability of the three-dimensional stacked layer type semiconductor memory can be improved.

B. Material Examples

Materials best suited to the generations of the semiconductor memories can be properly selected as the materials that constitute the elements of the device structure shown in FIG. 16 and FIG. 17.

Examples of materials for first gate insulating layer 6(1)a, charge storage layer 6(1)b, second gate insulating layer 6(1)c, and control gate electrode 6(1)d are the same as those according to the first embodiment and are therefore not described here.

C. Modification

Figure 18:
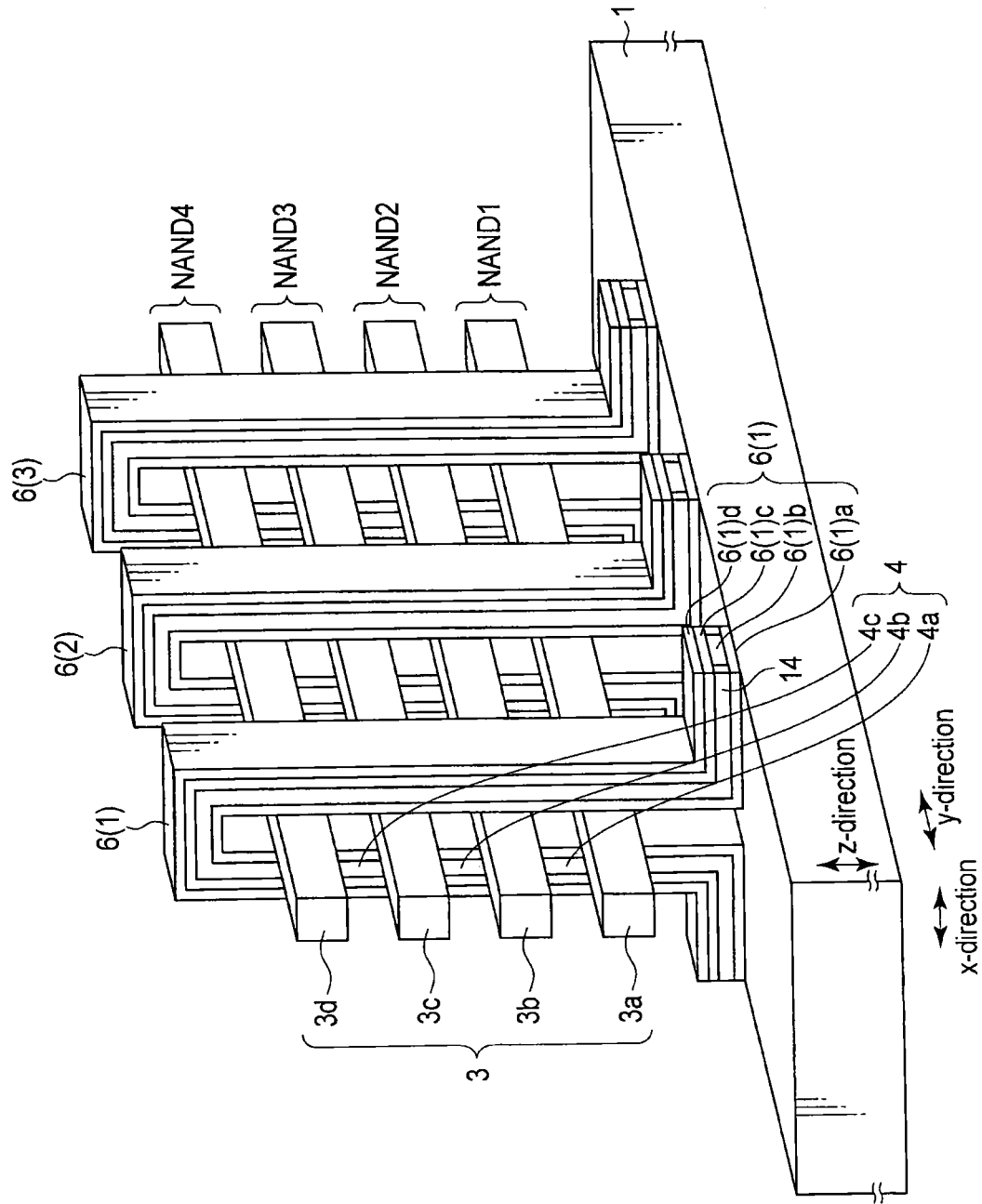
FIG. 18 is a view showing a modification of the second embodiment.

FIG. 18 shows a modification of the second embodiment.

This modification is characterized in that four charge storage layers 6 (6(1)b, . . . ) arranged in the z-direction are physically separated from one another by cavities (e.g., air gaps). That is, in this modification, the elements between first to fourth semiconductor layers 3 (3a, 3b, 3c, and 3d) are cavities.

When the memory cell is miniaturized, a parasitic capacitance generated between charge storage layers 6(1)b is increased, and wrong operation is caused by mutual interference. To prevent this, the space between charge storage layers 6(1)b is preferably a cavity having a low dielectric constant.

Although all of first to fifth insulating layers 2, 4a to 4c, and 5 in the second embodiment (FIG. 16 and FIG. 17) are changed to cavities in this modification, some of the insulating layers may be only changed to cavities. The cavity is preferably a complete cavity, but the insulator may partly remain in the cavity.

The cavity can be changed to a porous insulator.

D. Example of NAND Cell Unit

A NAND cell unit structure to which the second embodiment (FIG. 16 and FIG. 17) is applied can be the NAND cell unit structure shown in FIG. 5 to FIG. 7 or the NAND cell unit structure shown in FIG. 11 to FIG. 13. However, in these NAND cell unit structures, a NAND cell unit part needs to be changed to the structure shown in FIG. 16 and FIG. 17.

In the modification of the second embodiment (FIG. 18), the cell unit structure shown in FIG. 5 to FIG. 7 or the cell unit structure shown in FIG. 11 to FIG. 13 can be used. However, in these NAND cell unit structures, a NAND cell unit part needs to be changed to the structure shown in FIG. 18.

E. Manufacturing Method

A method of manufacturing the structures according to the second embodiment (FIG. 16 and FIG. 17) and its modification (FIG. 18) is described below with reference to FIG. 19A to FIG. 19E. In each of these drawings, (a) is a plan view, (b) is a side view from the x-direction, and (c) is a side view from the y-direction.

Figure 19A:
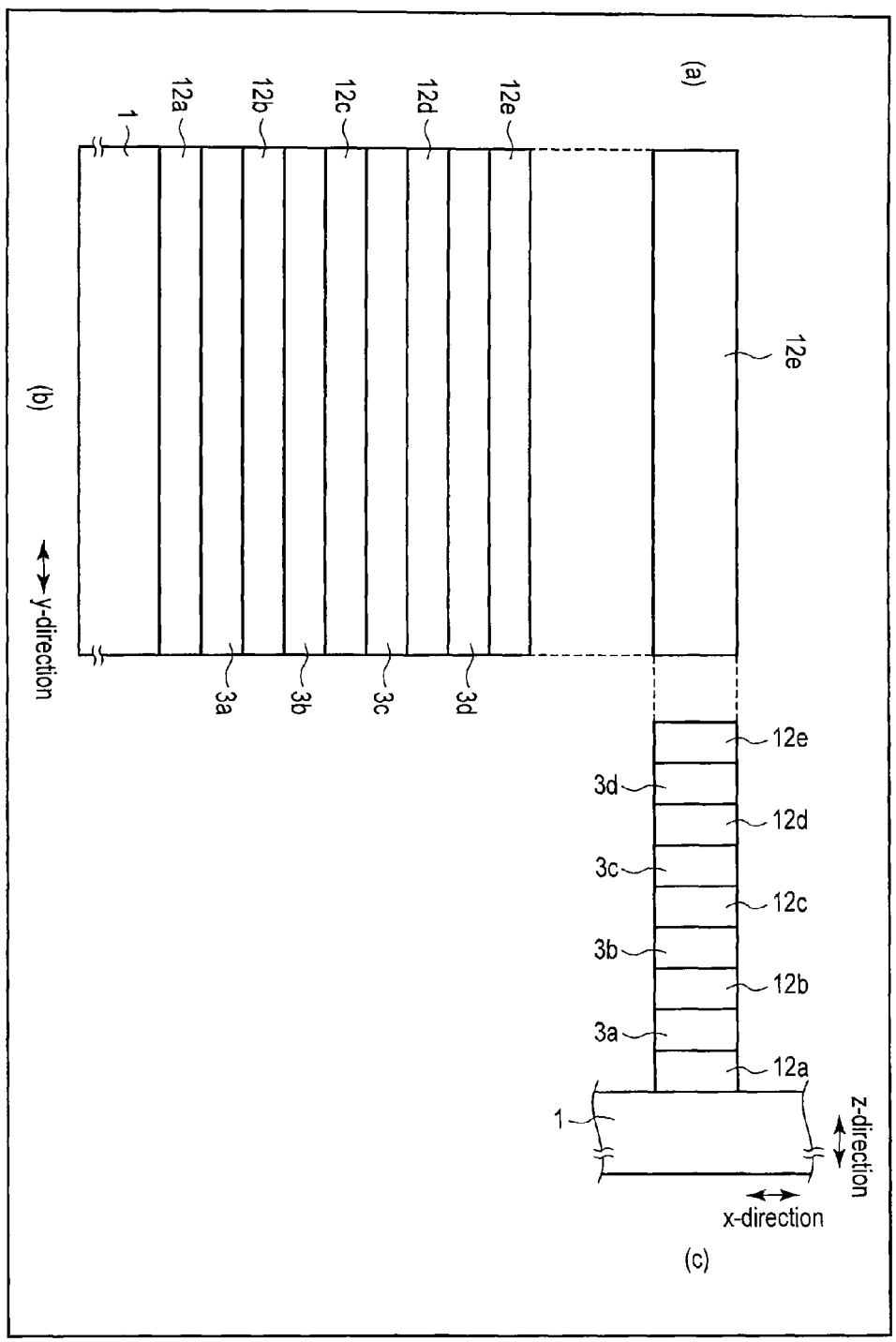
FIGS. 19A to 19E are diagrams, each showing a manufacturing method of the second embodiment.

First, as shown in FIG. 19A, first temporary layer 12a, first semiconductor layer 3a, second temporary layer 12b, second semiconductor layer 3b, third temporary layer 12c, third semiconductor layer 3c, fourth temporary layer 12d, fourth semiconductor layer 3d, and fifth temporary layer 12e are sequentially formed in the z-direction perpendicular to the surface of semiconductor substrate 1.

Here, semiconductor substrate 1 is, for example, a p-type silicon substrate having a plane direction (100) and a specific resistance of 10 to 20 Ωcm. First to fifth temporary layers 12a to 12e are made of silicon germanium. First to fourth semiconductor layers 3a to 3d are made of silicon.

In the case of a stacked layer structure of silicon and silicon germanium, these materials are alternately stacked by epitaxial growth, and monocrystalline silicon can be obtained. Thus, characteristic variations among first to fourth semiconductor layers (silicon channels) 3a to 3d are reduced, and the channel mobility of the silicon channels can be improved.

First to fifth temporary layers 12a to 12e and first to fourth semiconductor layers 3a to 3d are then fabricated by the PEP and anisotropic dry etching, and a fin-type stacked layer structure extending in the y-direction parallel to the surface of semiconductor substrate 1 is formed.

Figure 19B:
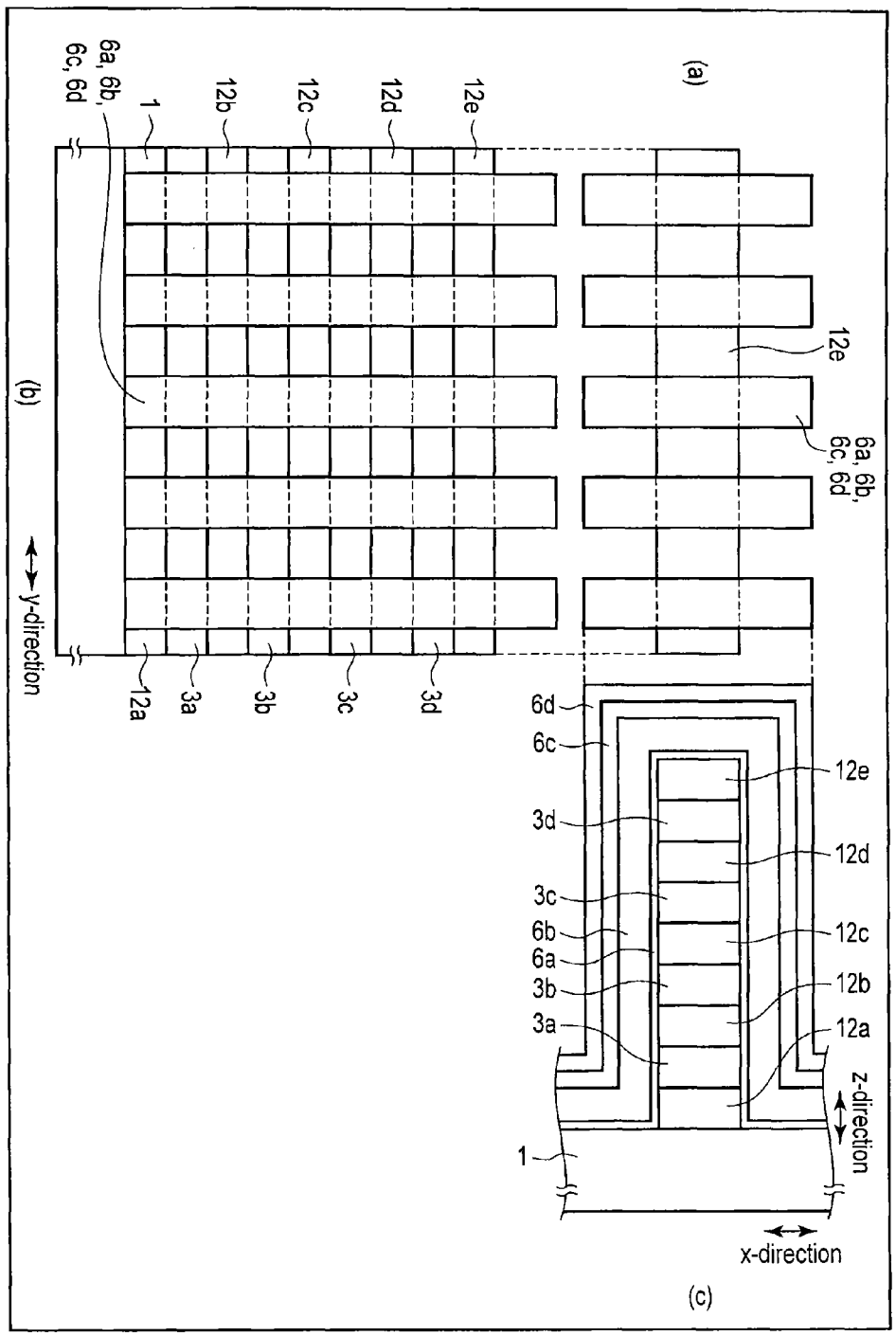

As shown in FIG. 19B, the side surfaces of first to fourth semiconductor layers 3a to 3d in the x-direction, the side surfaces of first to fourth temporary layers 12a to 12d in the x-direction, and the side surfaces of fifth temporary layer 12e in the x-direction and the z-direction are then thermally oxidized, and first gate insulating layers (e.g., silicon oxide) 6a are formed on the side surfaces of first to fourth semiconductor layers 3a to 3d in the x-direction.

Combined charge storage layer 6b covering the fin-type stacked layer structure (first gate insulating layers 6a), second gate insulating layer 6c, and control gate electrode 6d are then sequentially formed.

A material such as silicon nitride or conductive polysilicon can be used as combined charge storage layer 6b. A material such as aluminum oxide can be used as second gate insulating layer 6c, and a material such as nickel silicide can be used as control gate electrode 6d.

First gate insulating layer 6a, combined charge storage layer 6b, second gate insulating layer 6c, and control gate electrode 6d are fabricated by the PEP and anisotropic dry etching, and control gate electrodes (word lines) 6d, . . . are formed. Control gate electrodes (word lines) 6d, . . . extend in the x-direction on the z-direction side of fifth temporary layer 12e, and extend in the z-direction on the x-direction side of first to fourth charge storage layers 6b.

In this stage, first gate insulating layer 6a, combined charge storage layer 6b, and second gate insulating layer 6c have the same shape as control gate electrode 6d, and are covered by control gate electrode 6d.

Figure 19C:
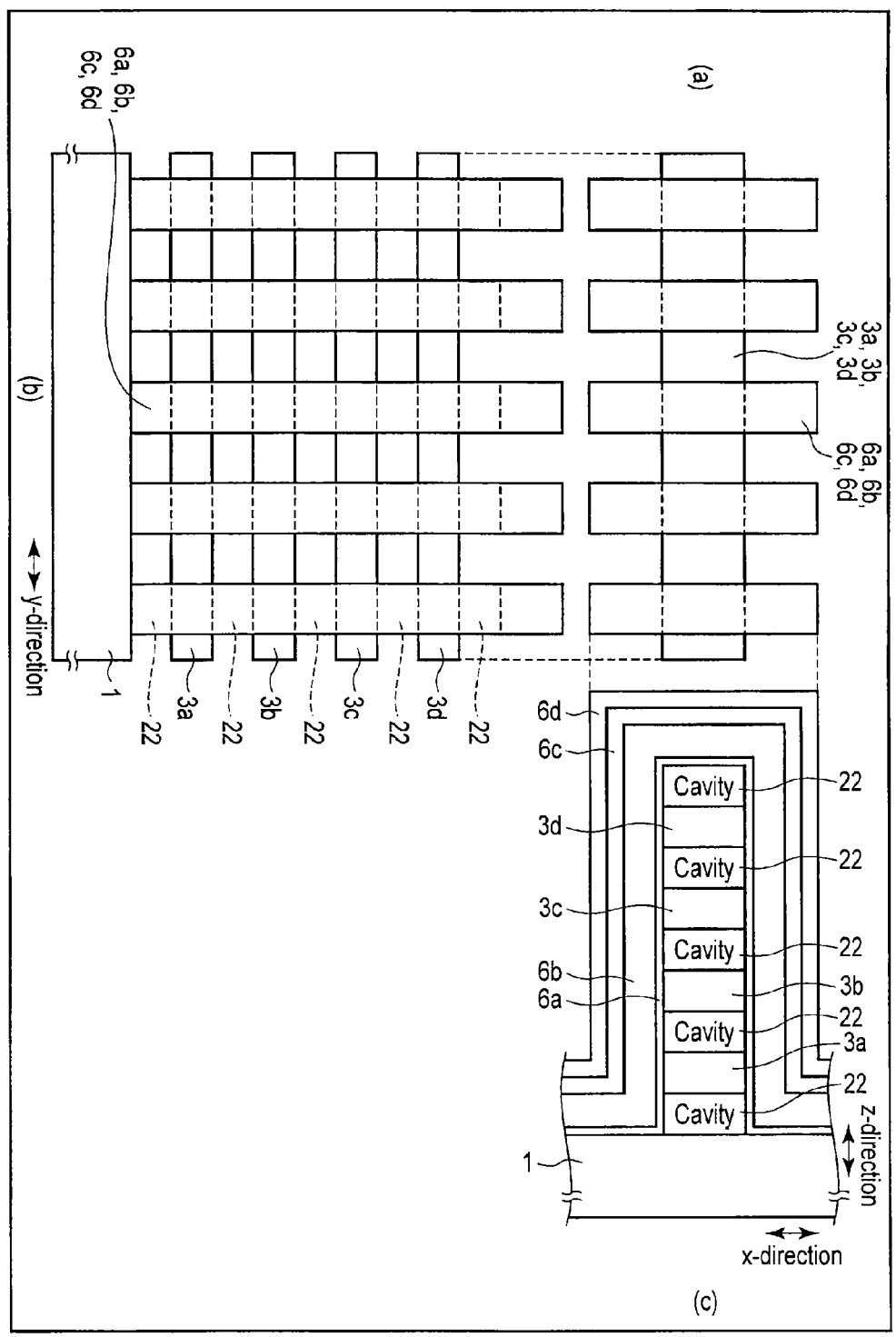

As shown in FIG. 19C, first to fifth temporary layers 12a to 12e are then selectively removed by isotropic dry etching, and cavities 22, . . . are formed on upper and lower sides (z-direction sides) of first to fourth semiconductor layers 3a to 3d.

In FIG. 19B, first to fifth temporary layers 12a to 12e can be easily removed by isotropic dry etching because the space between control gate electrodes 6d, . . . and the space between first to fourth semiconductor layers 3a to 3d (first to fourth charge storage layers 6b, . . . ) are exposed.

Figure 19D:
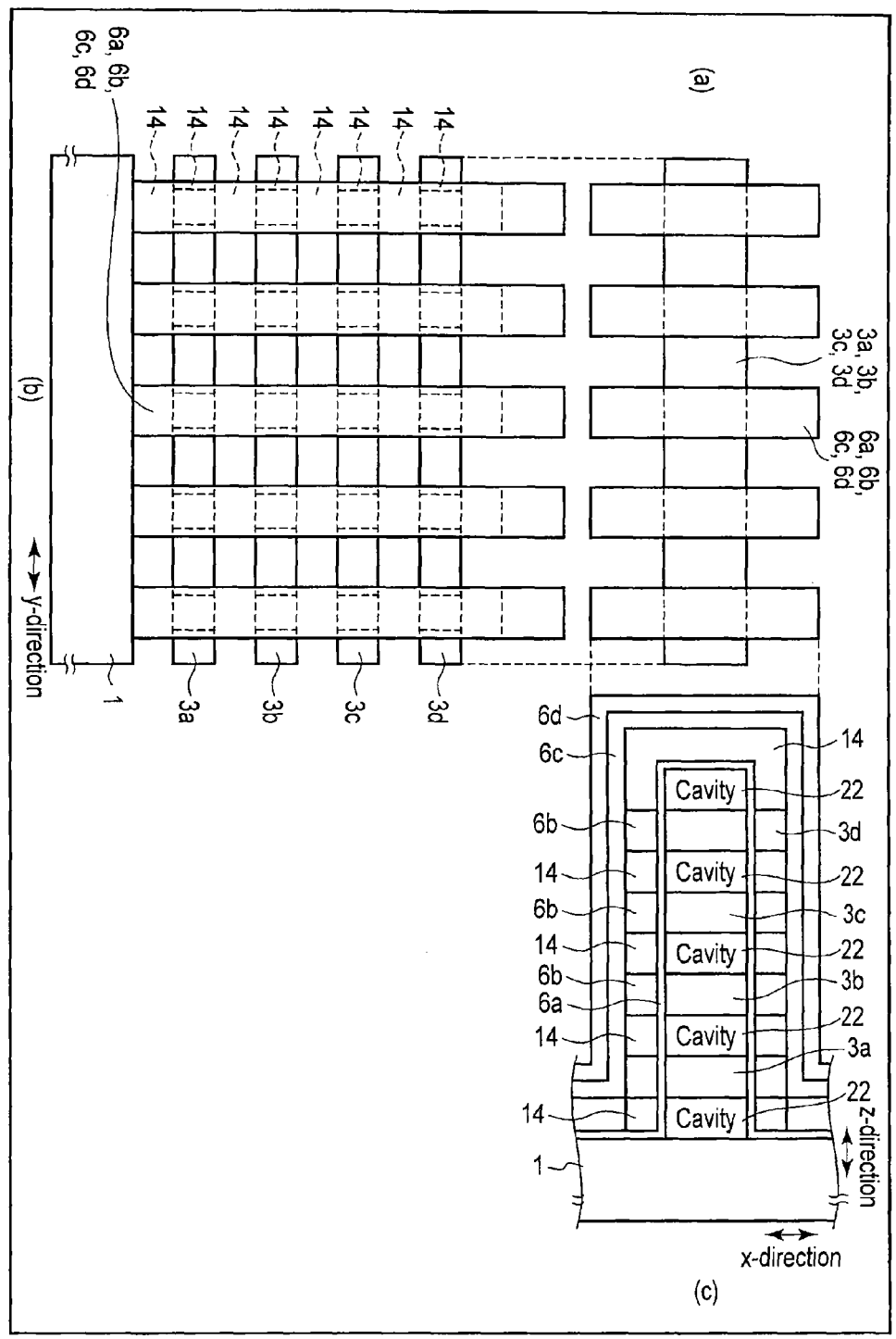

As shown in FIG. 19D, combined charge storage layer 6b is selectively oxidized from the regions in which first to fifth temporary layers 12a to 12e are removed.

For example, by annealing in an atmosphere containing oxygen, the oxidizing of combined charge storage layer 6b is carried out from the regions in which first to fifth temporary layers 12a to 12e are removed.

At this moment, combined charge storage layer 6b is not oxidized between first to fourth semiconductor layers 3a to 3d and control gate electrode 6d. Therefore, combined charge storage layer 6b is changed to charge storage layers 6b, . . . physically separated from one another by oxide 14 of combined charge storage layer 6b.

Here, the side surfaces of charge storage layers 6b, . . . in the x-direction are covered by first to fourth semiconductor layers 3a to 3d and control gate electrode 6d, and the side surfaces of charge storage layers 6b, . . . in the y-direction and the z-direction are covered by oxide 14 of combined charge storage layer 6b.

This effectively prevents the diffusion of an impurity such as carbon to charge storage layers 6b, . . . in the subsequent process, for example, in the process of forming an interlayer insulating layer.

Figure 19E:
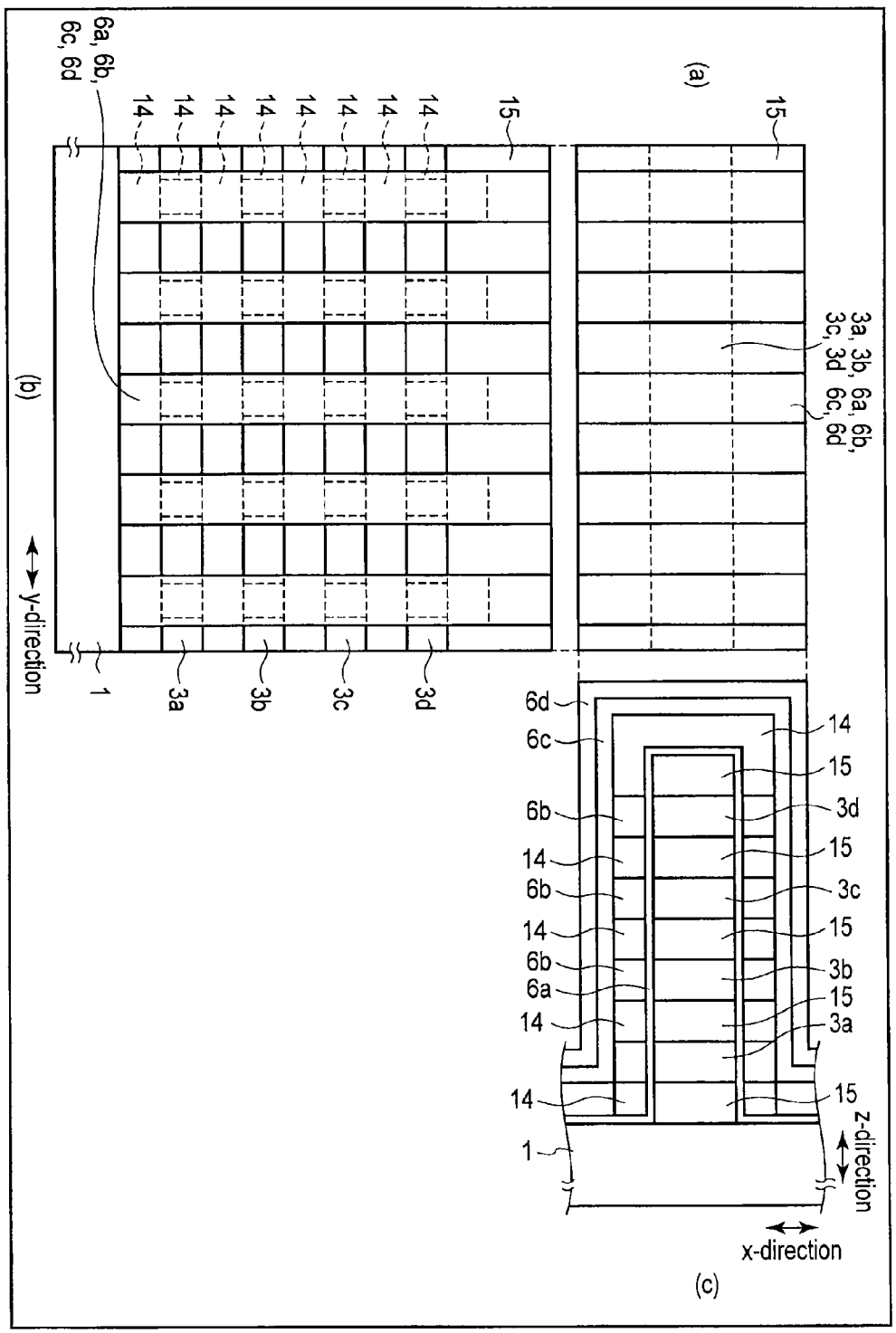

In the meantime, although cavities 22, . . . may be as they are, cavities 22, . . . may be filled with insulating layers (e.g., silicon oxide) 15 as shown in FIG. 19E. In this case, insulating layers 15 may be porous insulating layers.

F. Summary

As described above, according to the second embodiment, a structure in which charge storage layers are independent for the respective memory cells is formed without a substantial increase in the number of processes, and it is thereby possible to provide high reliability of the three-dimensional stacked layer type semiconductor memory.

(3) Third Embodiment

A. Structure

Figure 21:
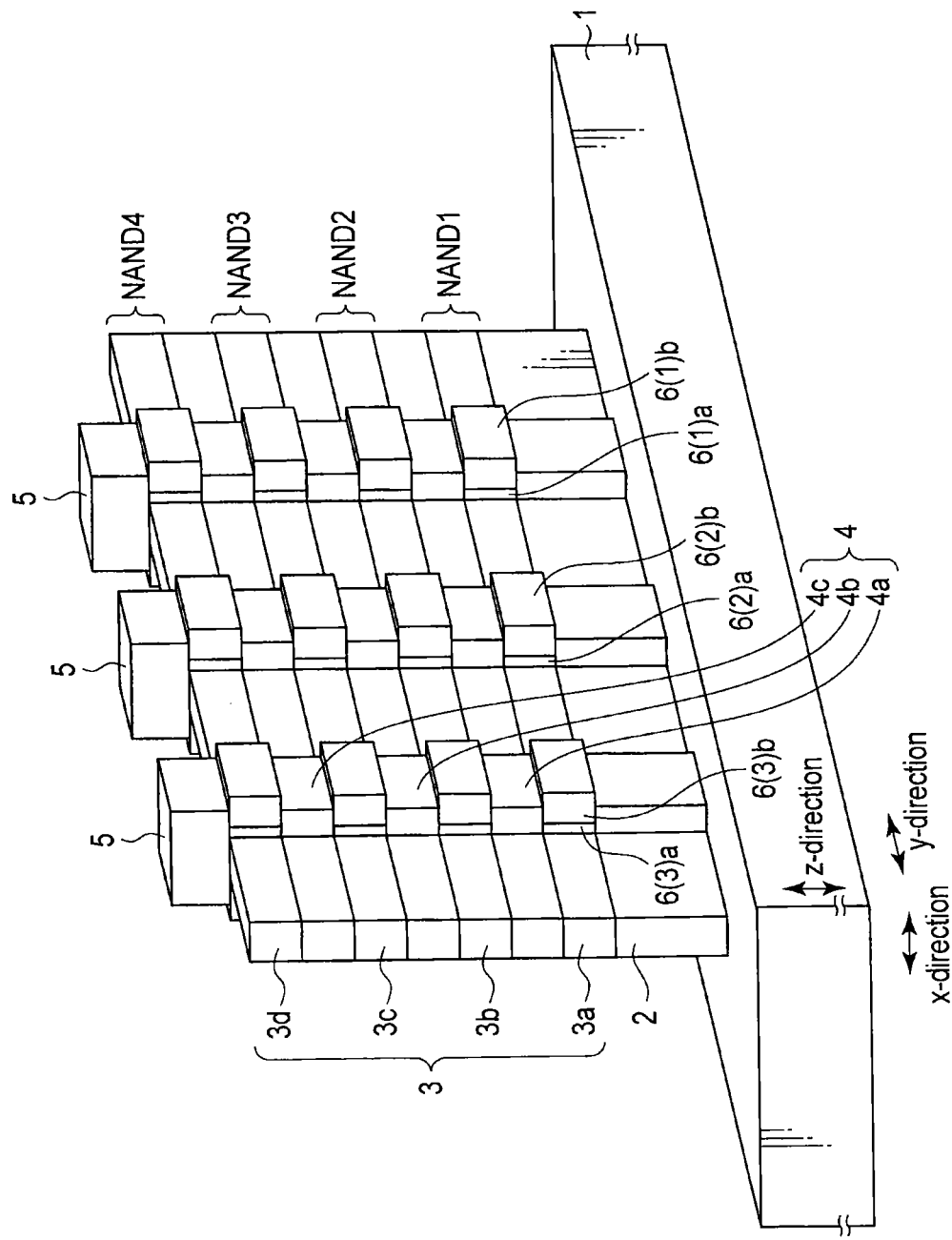
FIG. 21 is a view showing the structure of the third embodiment.

FIG. 20 shows a nonvolatile semiconductor memory device as the third embodiment. FIG. 21 shows a structure in which second gate insulating layer 6(1)c and control gate electrode 6(1)d are eliminated from the structure shown in FIG. 20.

Semiconductor substrate 1 is, for example, a silicon substrate. A fin-type stacked layer structure extending in a y-direction parallel to the surface of semiconductor substrate 1 is disposed on semiconductor substrate 1.

This fin-type stacked layer structure comprises first insulating layer 2, first semiconductor layer 3a, second insulating layer 4a, second semiconductor layer 3b, third insulating layer 4b, third semiconductor layer 3c, fourth insulating layer 4c, fourth semiconductor layer 3d, and fifth insulating layer 5 that are stacked in a z-direction perpendicular to the surface of semiconductor substrate 1.

First to fifth insulating layers 2, 4a to 4c, and 5 may be made of any insulator, and silicon oxide, for example, can be used. First to fourth semiconductor layers 3a to 3d are made of, for example, silicon.

On the x-direction side of first to fourth semiconductor layers 3 (3a, 3b, 3c, and 3d), stacked layer structure 6(1) in which first gate insulating layer 6(1)a, charge storage layer 6(1)b, second gate insulating layer 6(1)c, and control gate electrode 6(1)d are stacked in order in the x-direction is disposed.

First gate insulating layer 6(1)a is a tunnel insulating layer through which a tunnel current runs, and is made of, for example, silicon oxide. Charge storage layer 6(1)b is a layer for storing a charge, and its charge amount is controlled by the tunnel current.

Charge storage layer 6(1)b is made of an insulator or a conductor. When charge storage layer 6(1)a is an insulator (e.g., silicon nitride), a memory cell is a SONOS type. When charge storage layer 6(1)a is a conductor (e.g., conductive polysilicon), a memory cell is a floating gate type.

Charge storage layers 6(1)b are independent for the respective memory cells. In particular, four charge storage layers 6(1)b, . . . arranged in the z-direction are physically separated from one another by elements between first to fourth semiconductor layers 3 (3a, 3b, 3c, and 3d), in the present embodiment, by second to fourth insulating layers 4 (4a, 4b, and 4c).

Second gate insulating layer 6(1)c prevents a leakage current between charge storage layer 6(1)b and control gate electrode 6(1)d. Second gate insulating layer 6(1)c comprises, for example, a stacked layer structure or a material having a high dielectric constant to increase the coupling ratio of the memory cells and improve writing/erasing characteristics.

When the memory cell is the SONOS type, second gate insulating layer 6(1)c is generally called a block insulating layer. When the memory cell is the floating gate type, second gate insulating layer 6(1)c is generally called an inter-electrode insulating layer.

Control gate electrode 6(1)d functions as a word line, and extends in the x-direction on the z-direction side of fifth insulating layer 5 and extends in the z-direction on the x-direction side of first to fourth semiconductor layers 3 (3a, 3b, 3c, and 3d).

That is, control gate electrode 6(1)d covers four charge storage layers 6(1)b, . . . , and extends across the fin-type stacked layer structure in the x-direction.

Here, the side surfaces of four charge storage layers 6(1)b, . . . in the x-direction project as compared with the x-direction side surfaces of first to fifth insulating layers 2, 4a to 4c, and 5 located above and under charge storage layers 6(1)b, . . . . Therefore, control gate electrode 6(1)d covers the side surfaces of four charge storage layers 6(1)b, . . . in the x-direction and their side surfaces in the z-direction, so that writing/erasing characteristics can be improved by the improvement of the coupling ratio of the memory cells.

Stacked layer structures 6(2) and 6(3) have the same structure as stacked layer structure 6(1).

By the device structure described above, a string of memory cells connected in series in the y-direction, that is, a NAND string is formed in each of first to fourth semiconductor layers 3 (3a, 3b, 3c, and 3d). Here, the NAND string formed in first semiconductor layer 3a is NAND1, the NAND string formed in second semiconductor layer 3b is NAND2, the NAND string formed in third semiconductor layer 3c is NAND3, and the NAND string formed in fourth semiconductor layer 3d is NAND4.

Charge storage layers 6(1)b of the memory cells that constitute these NAND strings are independent for the respective memory cells. That is, charge storage layers 6(1)b, . . . are physically separated from one another by second to fourth insulating layers 4 (4a, 4b, and 4c). Therefore, the reliability of the three-dimensional stacked layer type semiconductor memory can be improved.

B. Material Examples

Materials best suited to the generations of the semiconductor memories can be properly selected as the materials that constitute the elements of the device structure shown in FIG. 20 and FIG. 21.

Examples of materials for first gate insulating layer 6(1)a, charge storage layer 6(1)b, second gate insulating layer 6(1)c, and control gate electrode 6(1)d are the same as those according to the first embodiment and are therefore not described here.

C. First Modification

Figure 22:
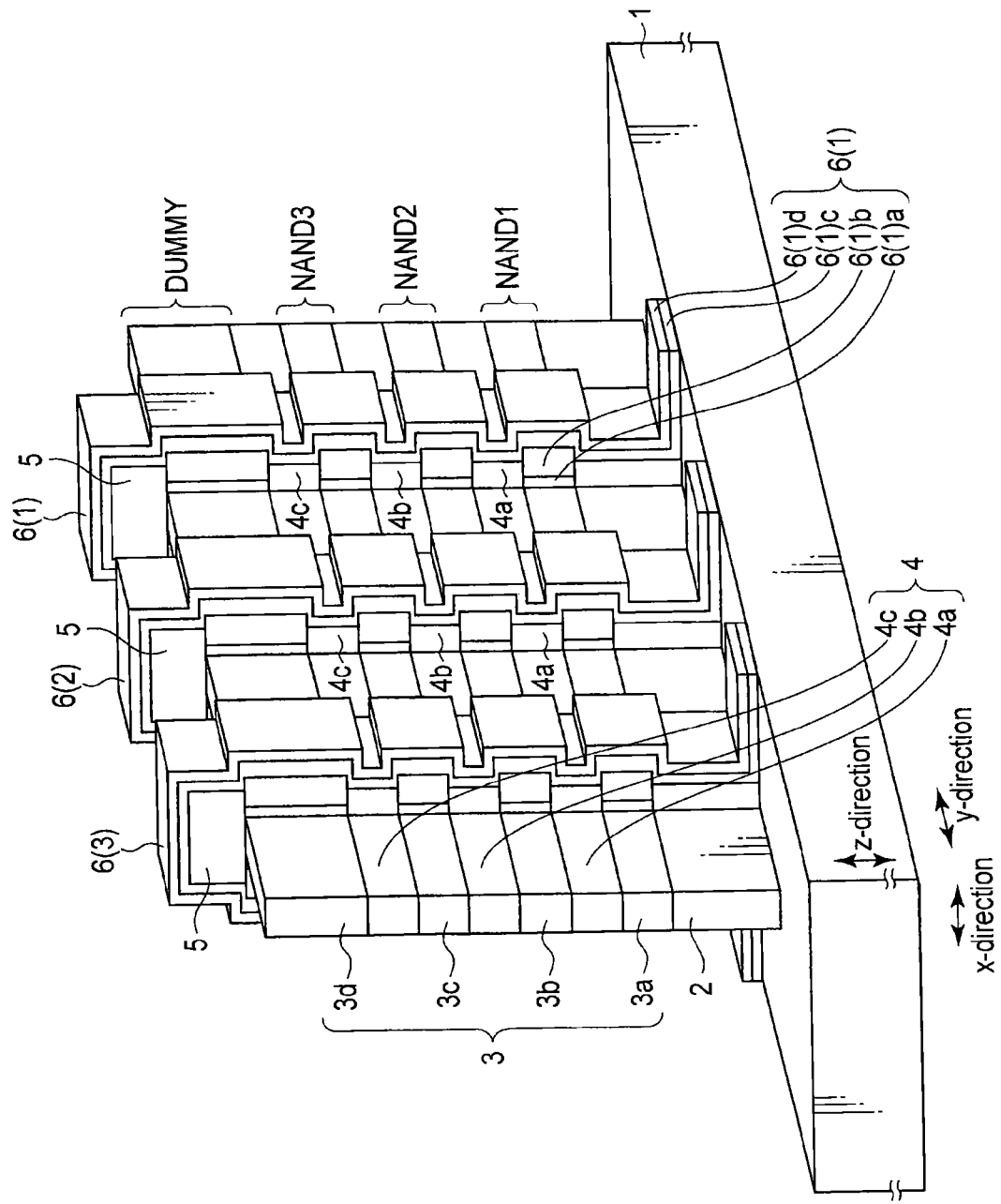
FIG. 22 is a view showing a first modification of the third embodiment.

FIG. 22 shows a first modification of the third embodiment.

The first modification is characterized in that the uppermost layer among first to fourth semiconductor layers 3 (3a, 3b, 3c, and 3d), that is, fourth semiconductor layer 3d is dummy layer DUMMY in which dummy cells as non-memory cells are formed.

Fourth semiconductor layer 3d as an uppermost layer is used as an etching mask in one step of a manufacturing method described later, and therefore tends to be damaged. Thus, the NAND string formed in fourth semiconductor layer 3d is not used as a memory cell, and is a dummy cell as a non-memory cell.

In this case, in order to improve the function of fourth semiconductor layer 3d as a mask, the width of fourth semiconductor layer 3d in the z-direction is preferably greater than the width of first to third semiconductor layers 3a, 3b, and 3c in the z-direction.

D. Second Modification

Figure 23:
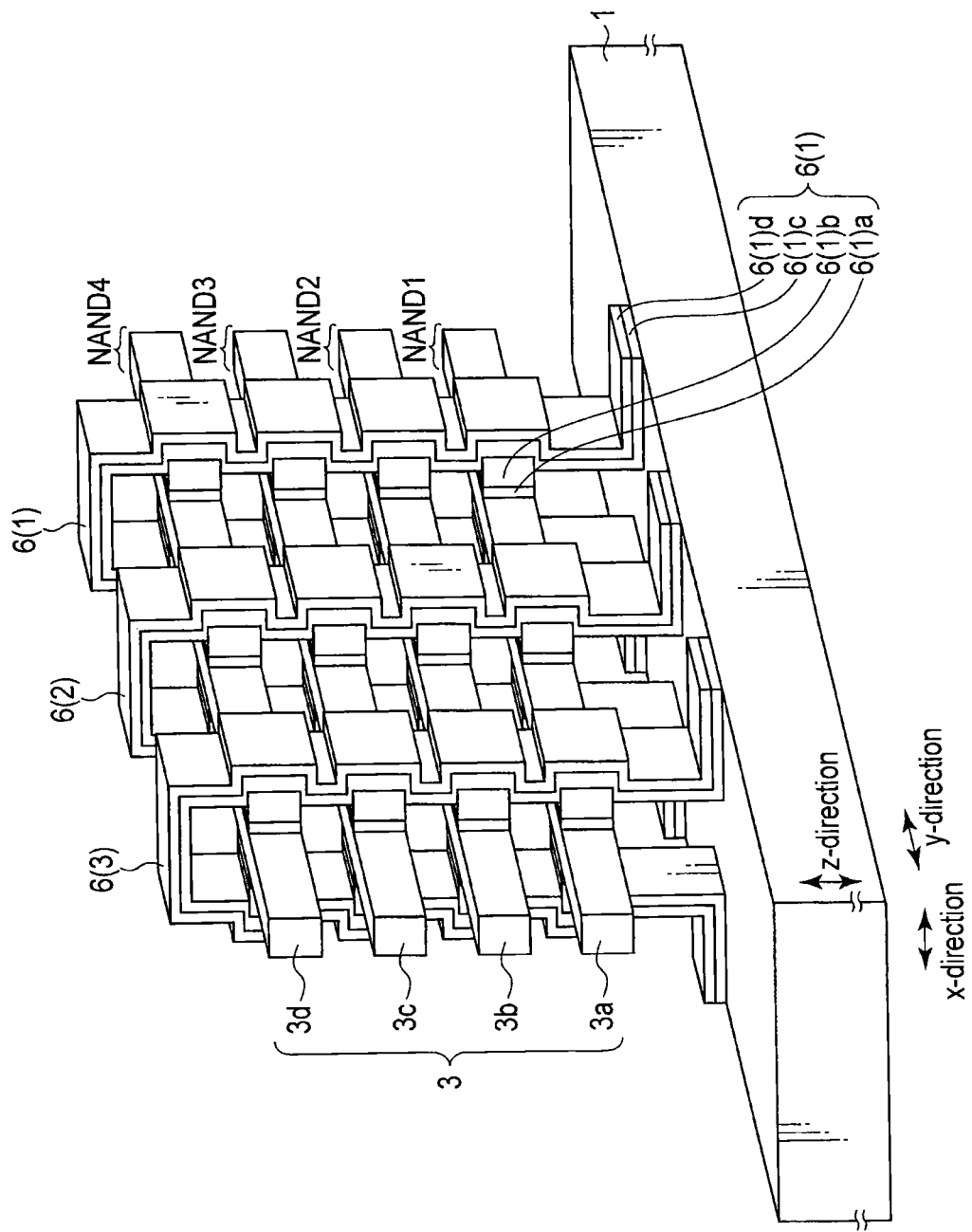
FIG. 23 is a view showing a second modification of the third embodiment.

FIG. 23 shows a second modification of the third embodiment.

The second modification is characterized in that four charge storage layers 6(1)b, . . . arranged in the z-direction are physically separated from one another by cavities (e.g., air gaps). That is, in the second modification, the elements between first to fourth semiconductor layers 3 (3a, 3b, 3c, and 3d) are cavities.

When the memory cell is miniaturized, a parasitic capacitance generated between charge storage layers 6(1)b is increased, and wrong operation is caused by mutual interference. To prevent this, the space between charge storage layers 6(1)b is preferably a cavity having a low dielectric constant.

Although all of first to fifth insulating layers 2, 4a to 4c, and 5 in the third embodiment (FIG. 20 and FIG. 21) are changed to cavities in this modification, some of the insulating layers may be only changed to cavities. The cavity is preferably a complete cavity, but the insulator may partly remain in the cavity.

The cavity can be changed to a porous insulator.

D. Example of NAND Cell Unit

A NAND cell unit structure to which the third embodiment (FIG. 20 and FIG. 21) is applied can be the NAND cell unit structure shown in FIG. 5 to FIG. 7 or the NAND cell unit structure shown in FIG. 11 to FIG. 13.

A NAND cell unit structure to which the first modification (FIG. 22) is applied can be the NAND cell unit structure shown in FIG. 8 to FIG. 10 or the NAND cell unit structure shown in FIG. 11 to FIG. 13.

A NAND cell unit structure to which the second modification (FIG. 23) is applied can be the NAND cell unit structure shown in FIG. 5 to FIG. 7, the NAND cell unit structure shown in FIG. 8 to FIG. 10, or the NAND cell unit structure shown in FIG. 11 to FIG. 13.

However, in these NAND cell unit structures, a NAND cell unit part needs to be changed to the structure shown in FIG. 20 to FIG. 23.

E. Manufacturing Method

The structures according to the third embodiment (FIG. 20 and FIG. 21) and the first modification (FIG. 22) can be manufactured in the same way as shown FIG. 14A to FIG. 14L. The structure according to the second modification (FIG. 23) can be manufactured in the same way as shown FIG. 15A to FIG. 15N.

A method of manufacturing the structures according to the third embodiment (FIG. 20 and FIG. 21) is described below with reference to FIG. 24A to FIG. 24M. In each of these drawings, (a) is a plan view, (b) is a side view from the x-direction, and (c) is a side view from the y-direction.

Figure 24A:
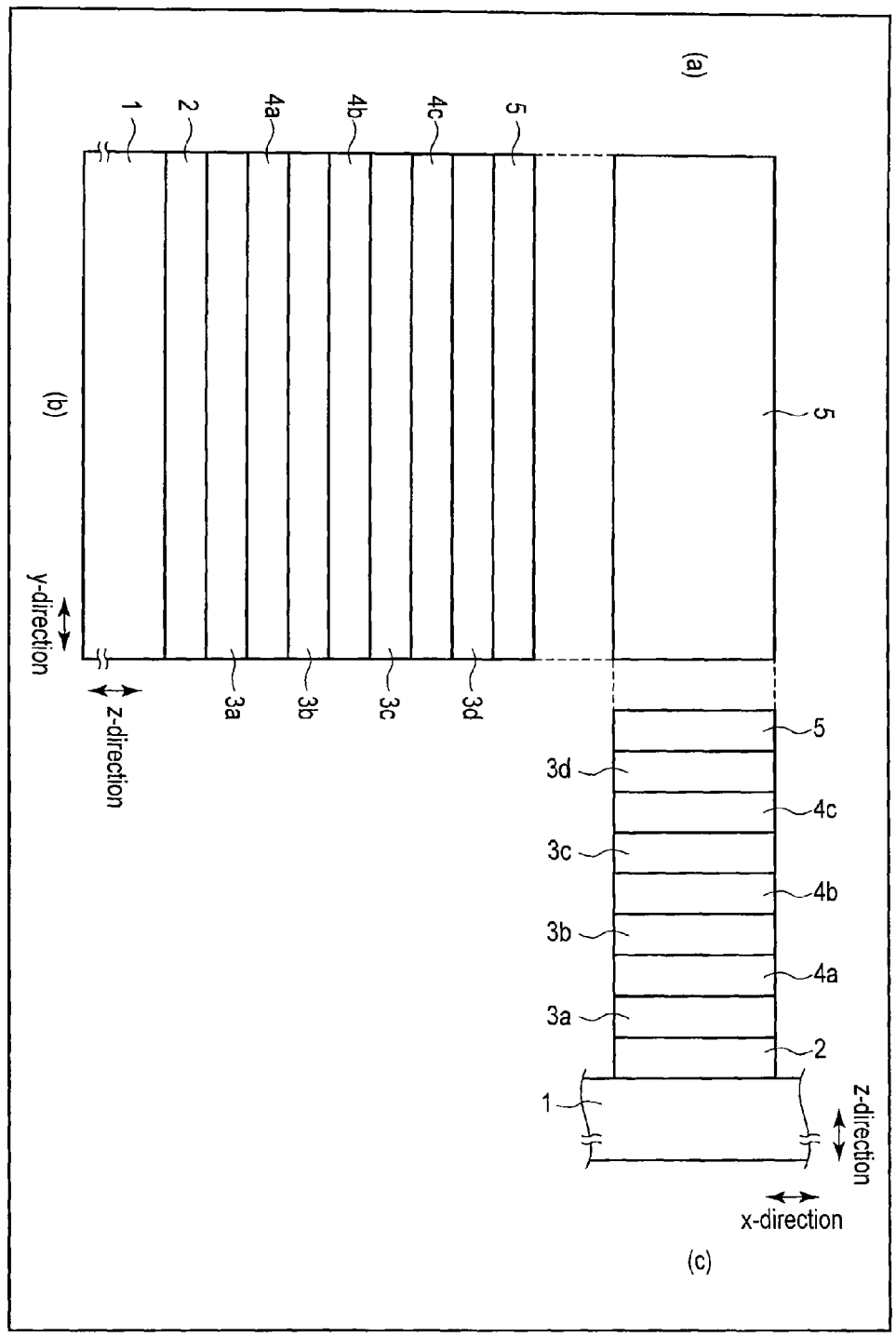

First, as shown in FIG. 24A, first insulating layer 2, first semiconductor layer 3a, second insulating layer 4a, second semiconductor layer 3b, third insulating layer 4b, third semiconductor layer 3c, fourth insulating layer 4c, fourth semiconductor layer 3d, and fifth insulating layer 5 are sequentially formed in the z-direction perpendicular to the surface of semiconductor substrate 1.

Here, semiconductor substrate 1 is, for example, a p-type silicon substrate having a plane direction (100) and a specific resistance of 10 to 20 Ωcm. First to fifth insulating layers 2, 4a to 4c, and 5 are made of silicon oxide. First to fourth semiconductor layers 3a to 3d are made of silicon.

First to fifth insulating layers 2, 4a to 4c, and 5 and first to fourth semiconductor layers 3a to 3d are then fabricated by the PEP and anisotropic dry etching, and a fin-type stacked layer structure extending in the y-direction parallel to the surface of semiconductor substrate 1 is formed.

Figure 24B:
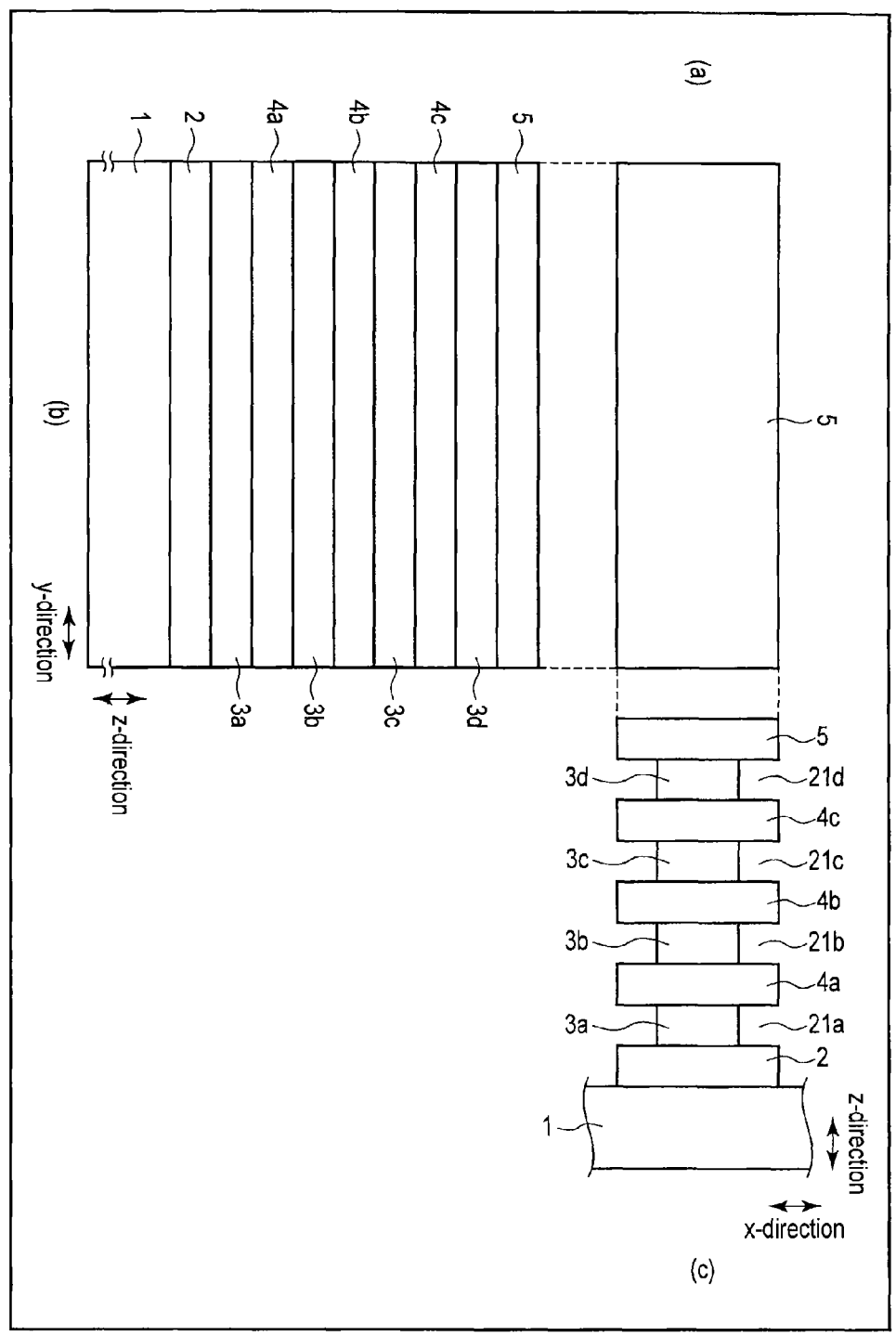

As shown in FIG. 24B, the side surfaces of first to fourth semiconductor layers 3a to 3d in the x-direction are then selectively etched in the x-direction by isotropic dry etching. As a result, the side surfaces of first to fourth semiconductor layers 3a to 3d in the x-direction are set back, and first to fourth recesses 21a to 21d extending in the y-direction are formed.

Figure 24C:
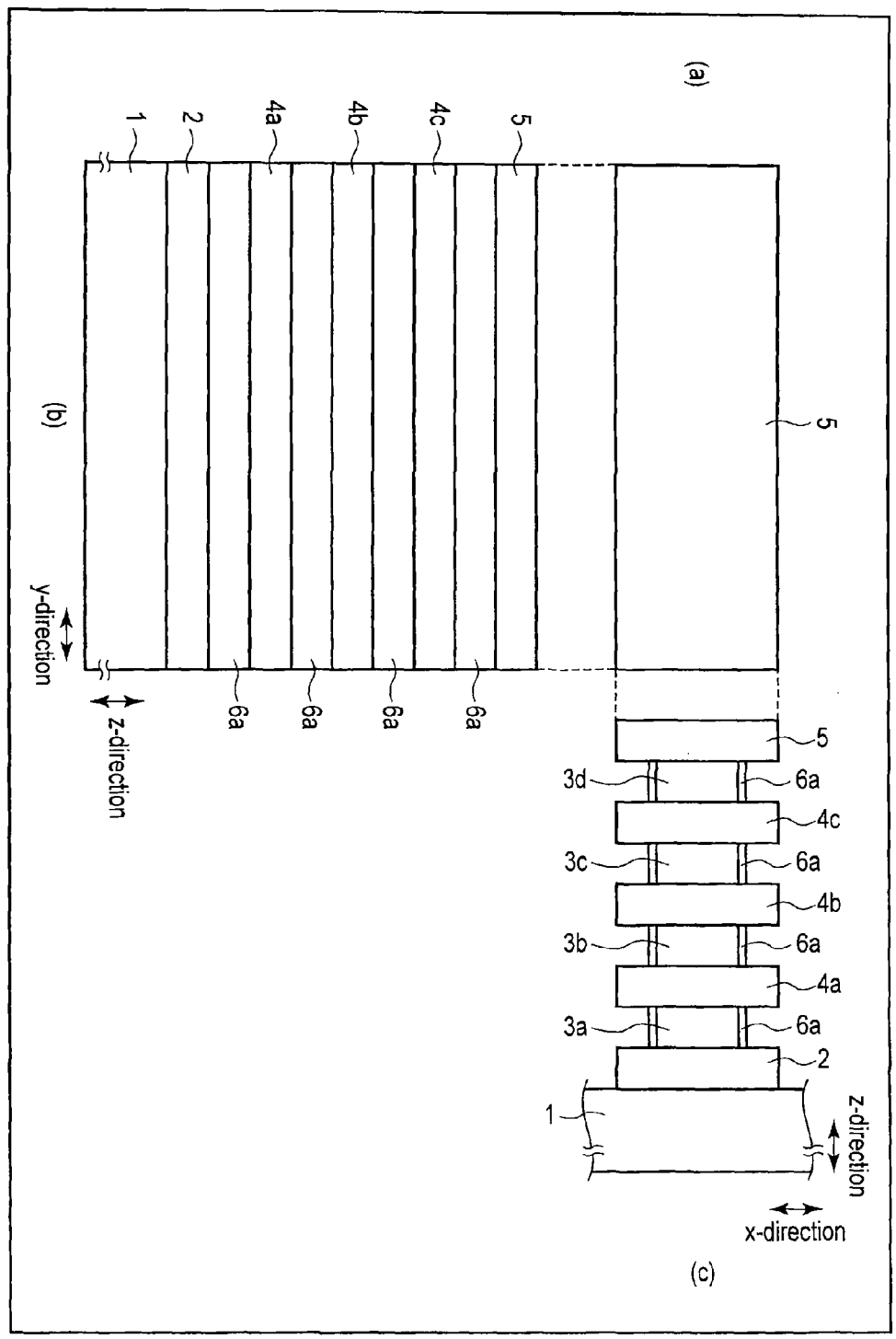

As shown in FIG. 24C, the side surfaces of first to fourth semiconductor layers 3a to 3d in the x-direction are then thermally oxidized, and first gate insulating layers (e.g., silicon oxide) 6a are formed on the side surfaces of first to fourth semiconductor layers 3a to 3d in the x-direction.

Figure 24D:
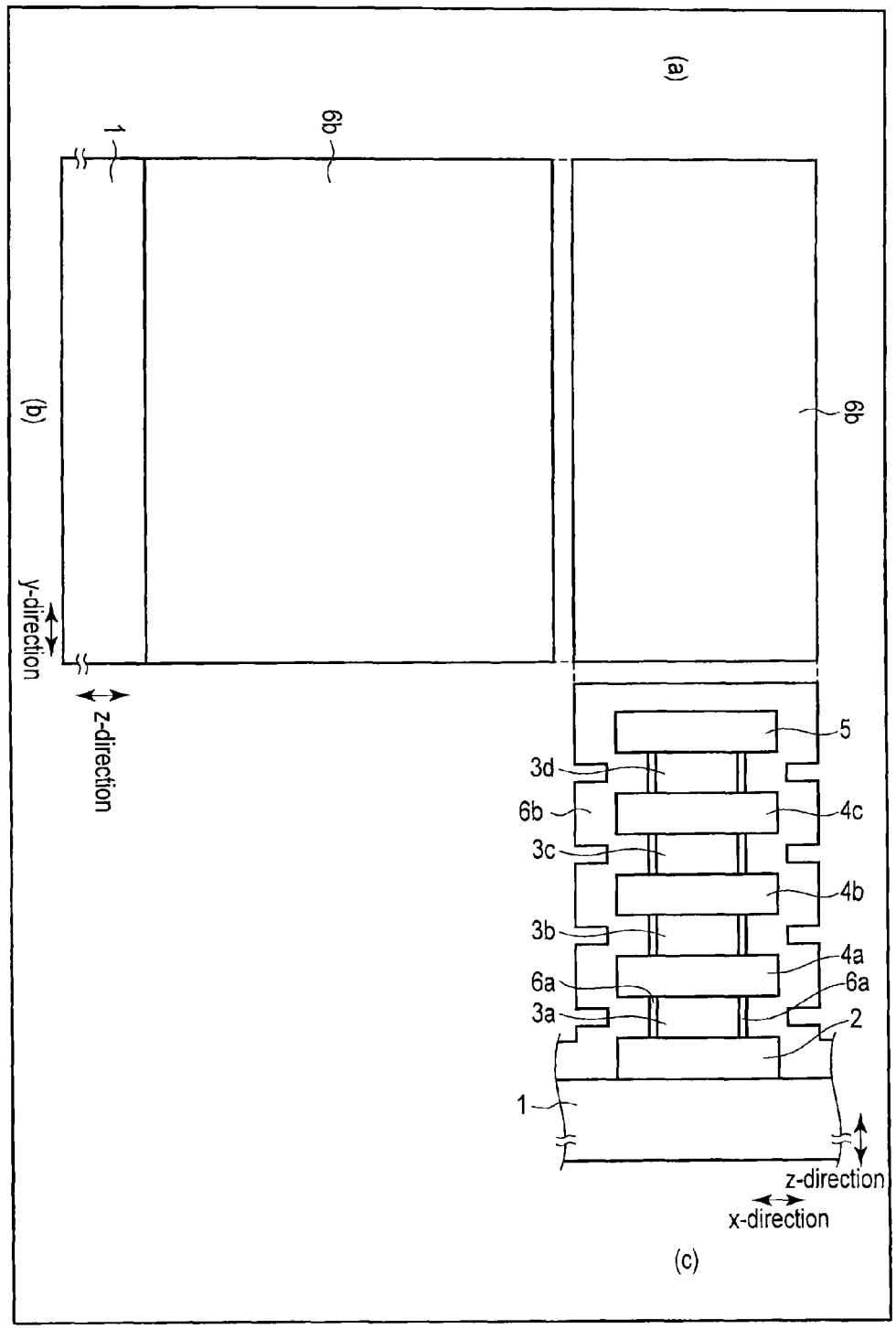

As shown in FIG. 24D, charge storage layer 6b covering the fin-type stacked layer structure is then formed. A material such as silicon nitride or conductive polysilicon can be used as charge storage layer 6b.

Figure 24E:
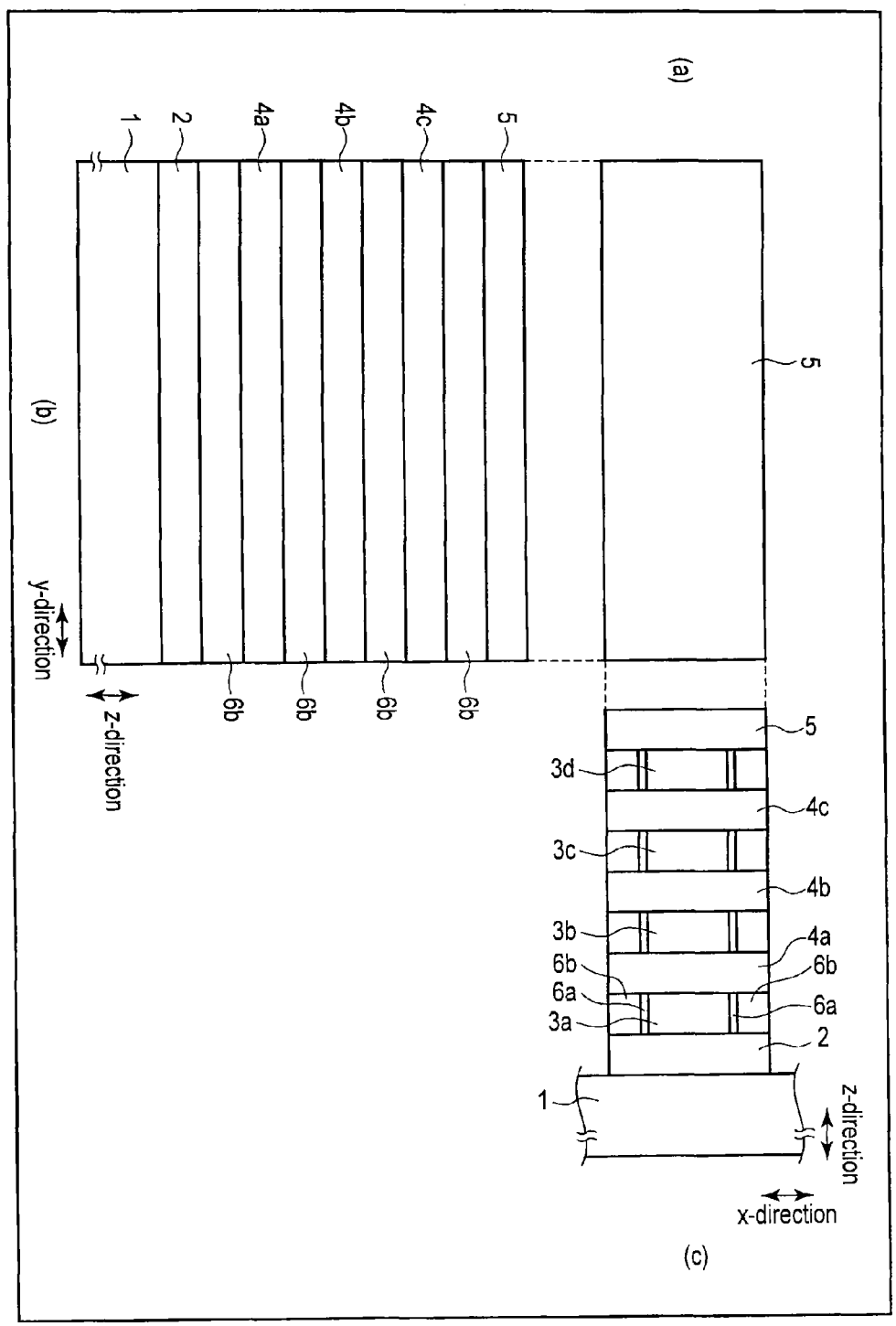

As shown in FIG. 24E, charge storage layer 6b is then selectively etched by anisotropic dry etching. As a result, charge storage layer 6b only remains in first to fourth recesses 21a to 21d on the side surfaces of first to fourth semiconductor layers 3a to 3d in the x-direction.

That is, fifth insulating layer 5 is exposed when uppermost charge storage layer 6b is removed. Therefore, fifth insulating layer 5 is used as a mask to further etch charge storage layer 6b, and first to fourth charge storage layers 6b are then formed in first to fourth recesses 21a to 21d, respectively.

Here, as fifth insulating layer 5 functions as a mask for etching charge storage layer 6b, the width of fifth insulating layer 5 in the z-direction may be greater than the width of each of first to fourth insulating layers 2, 4a to 4c in the z-direction.

If the function of fifth insulating layer 5 as the mask is regarded as important, fifth insulating layer 5 may be formed by a method and a material different from first to fourth insulating layers 2, 4a to 4c (e.g., a stacked layer structure of different insulating layers).

At this point, first to fourth charge storage layers 6b are separated in the z-direction.

Figure 24F:
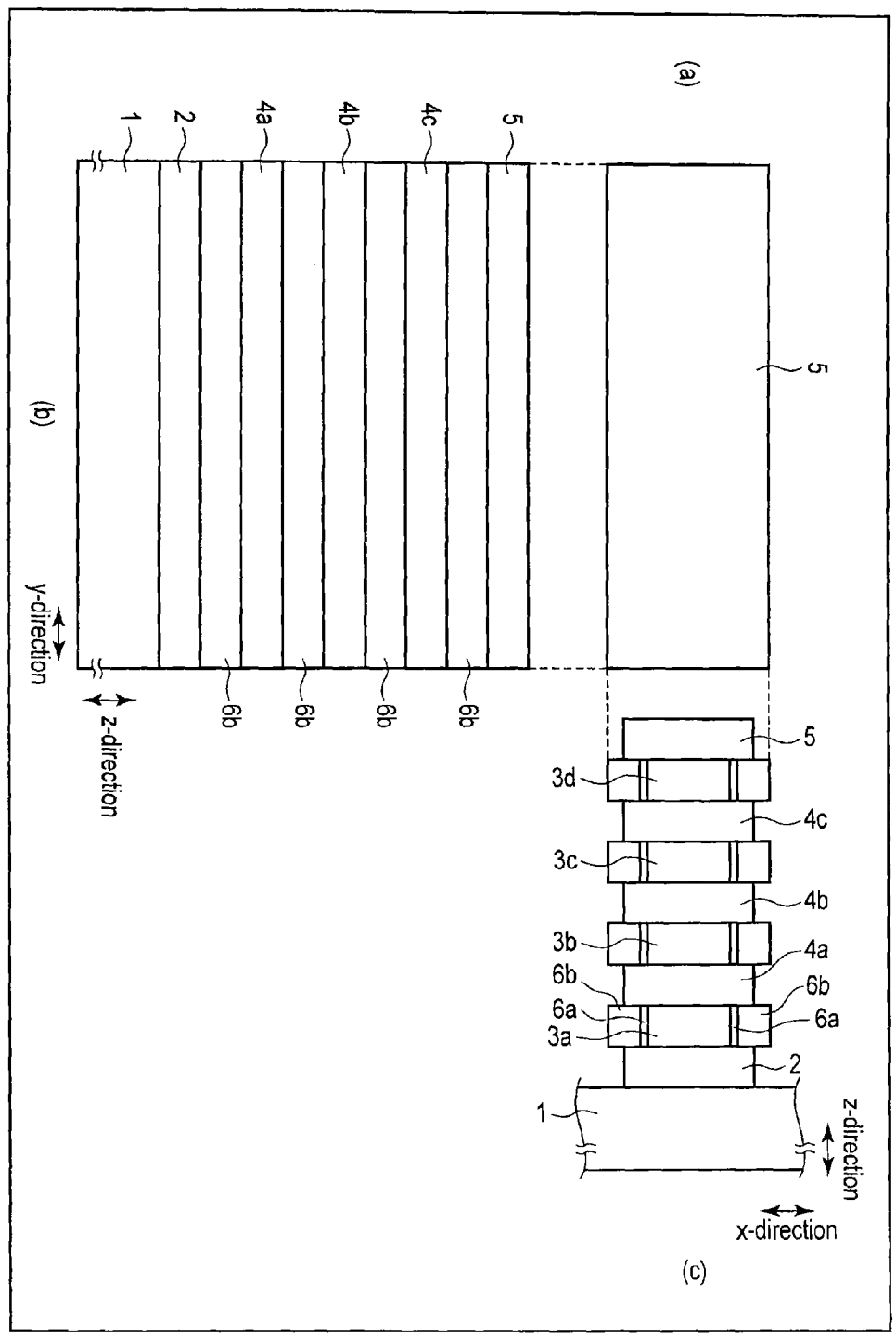

As shown in FIG. 24F, first to fifth insulating layers 2, 4a to 4c, and 5 are then selectively etched by isotropic dry etching. Accordingly, the side surfaces of first to fifth insulating layers 2, 4a to 4c, and 5 in the x-direction are set back in the x-direction, and the side surface of charge storage layer 6b in the x-direction projects as compared with the side surfaces of first to fifth insulating layers 2, 4a to 4c, and 5 in the x-direction.

Figure 24G:
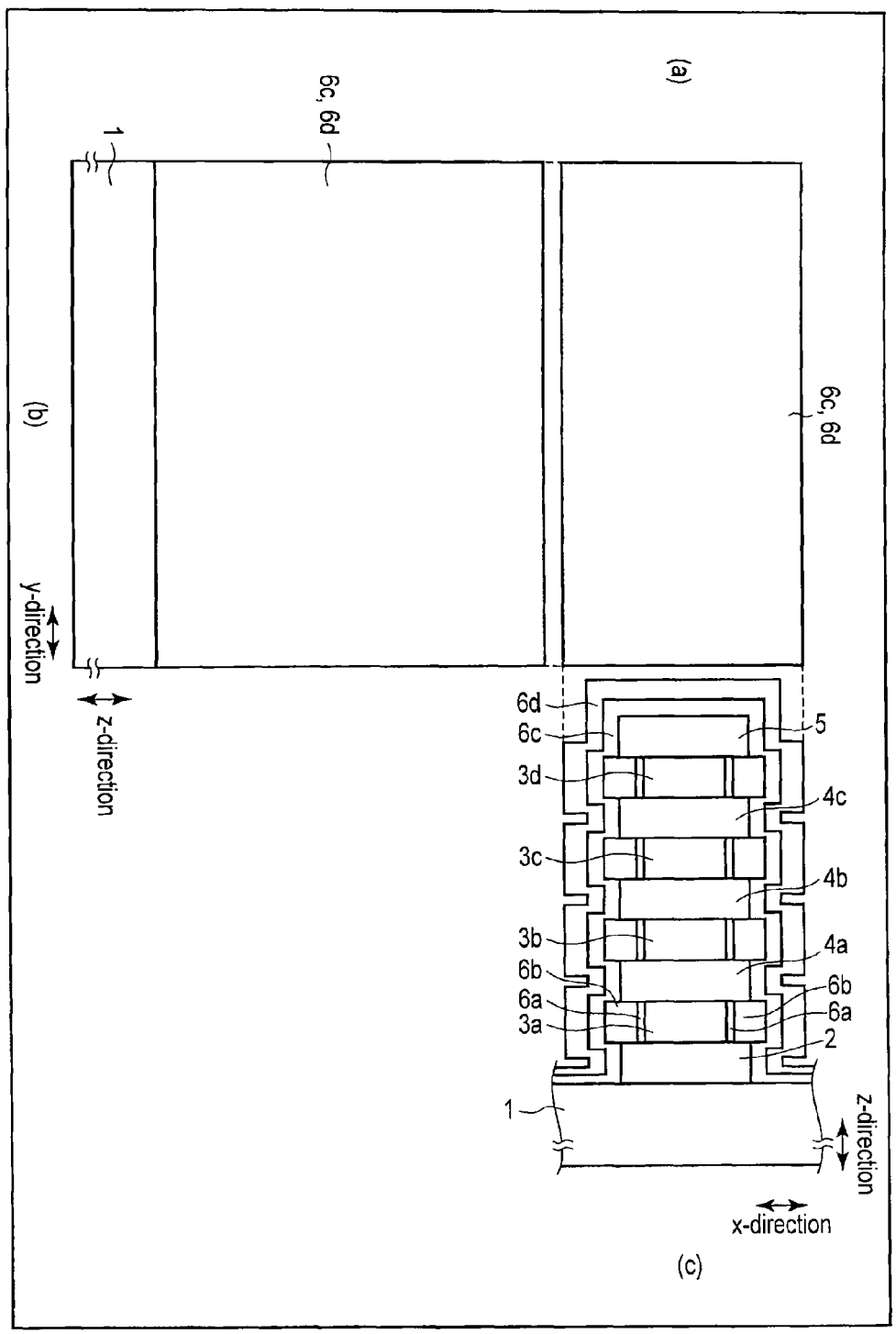

As shown in FIG. 24G, second gate insulating layer 6c and control gate electrode 6d that cover the fin-type stacked layer structure (including first to fourth charge storage layers 6b) are then formed. A material such as aluminum oxide can be used as second gate insulating layer 6c, and a material such as nickel silicide can be used as control gate electrode 6d.

Figure 24H:
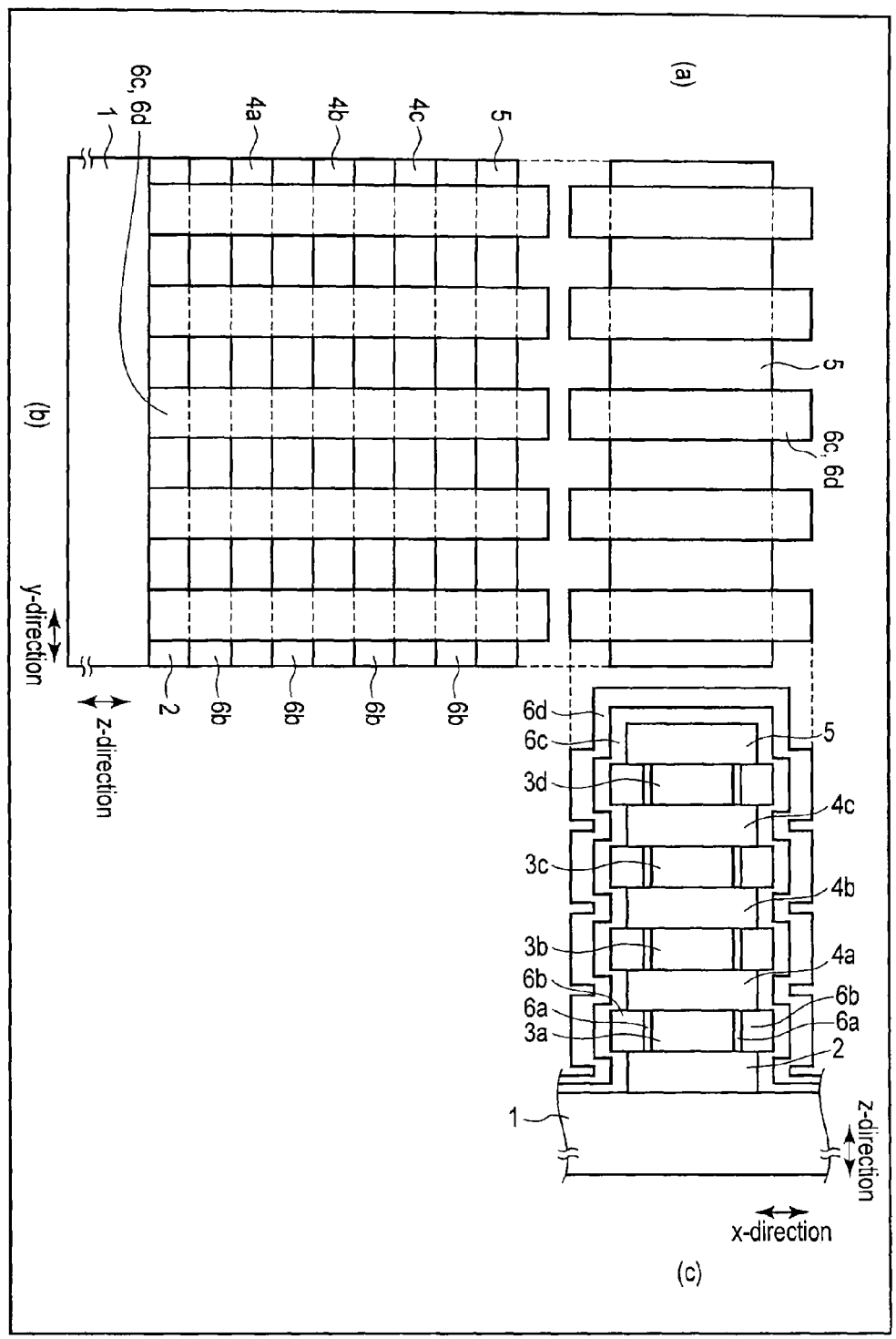
Figure 241:
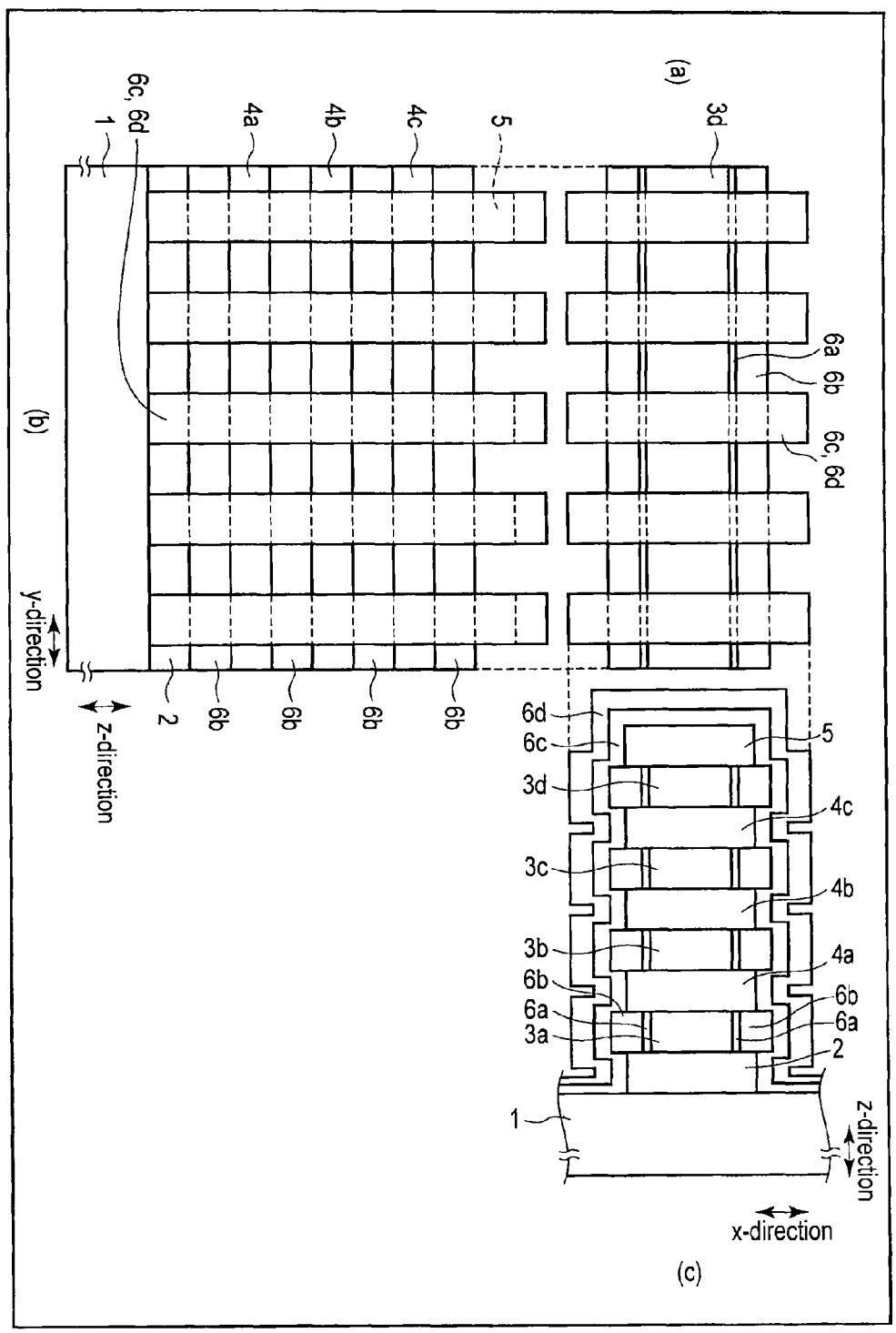

As shown in FIG. 24H, second gate insulating layer 6c and control gate electrode 6d are fabricated by the PEP and anisotropic dry etching, and control gate electrodes (word lines) 6d, . . . are formed. Control gate electrodes (word lines) 6d, . . . extend in the x-direction on the z-direction side of fifth insulating layer 5, and extend in the z-direction on the x-direction side of first to fourth charge storage layers 6b.

Here, control gate electrodes (word lines) 6d, . . . cover the side surfaces of first to fourth charge storage layers 6b in the x-direction and at least part of their side surfaces in the z-direction. Therefore, the coupling ratio of the memory cells can be improved.

As shown in FIG. 24I, fifth insulating layer 5 is then selectively etched by anisotropic dry etching. At the same time, control gate electrodes 6d, . . . function as masks for the anisotropic dry etching. Therefore, in parts that are not covered by control gate electrodes 6d, . . . , fifth insulating layer 5 is selectively removed, and the side surfaces of fourth semiconductor layer 3d and fourth charge storage layer 6b in the z-direction are exposed.

Figure 24J:
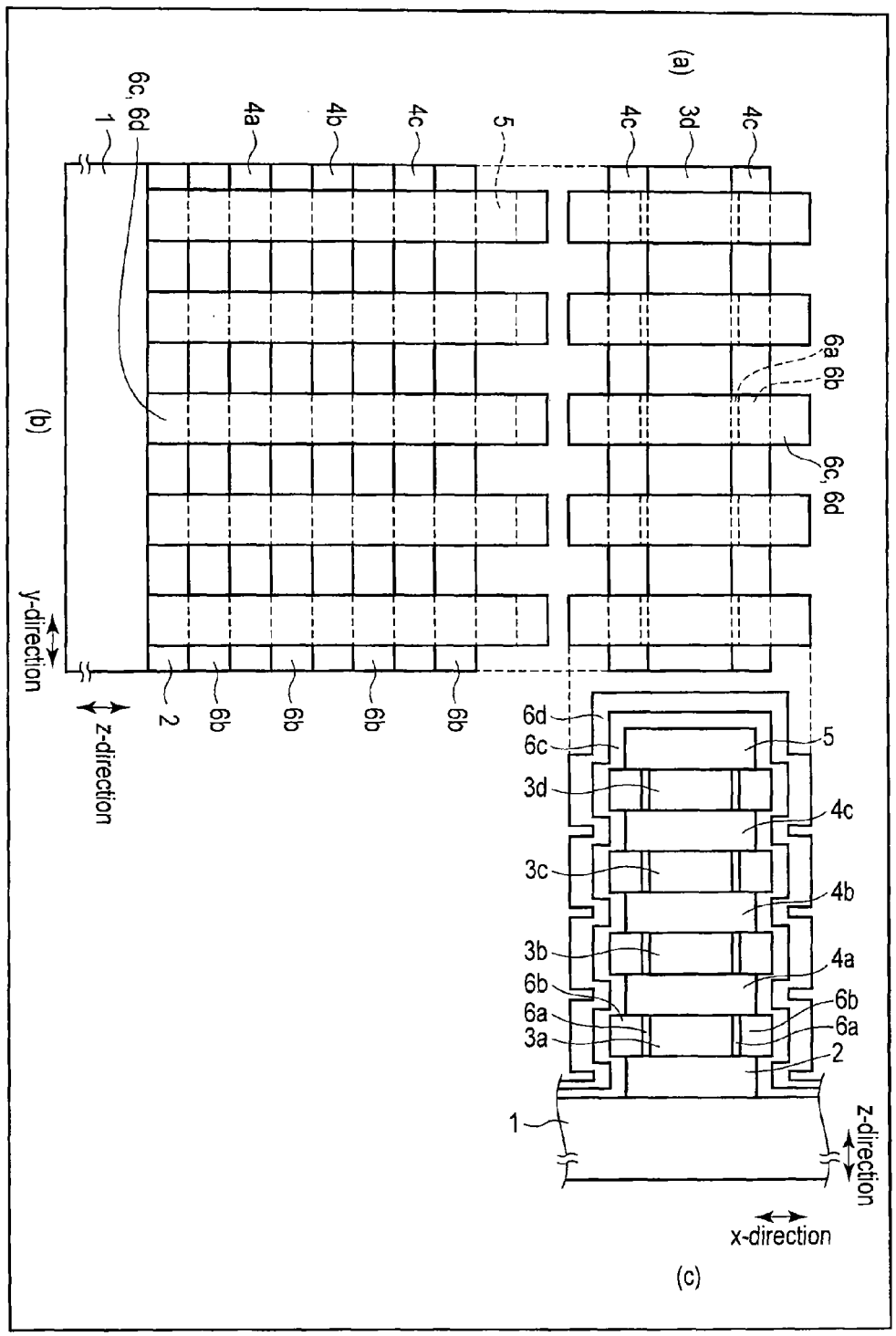

As shown in FIG. 24J, fourth charge storage layer 6b is then selectively etched by anisotropic dry etching. At the same time, control gate electrodes 6d, . . . and fourth semiconductor layer 3d function as masks for the anisotropic dry etching.

Therefore, as the part of fourth charge storage layer 6b that is not covered by control gate electrodes 6d, . . . is selectively removed, fourth charge storage layers 6b, . . . separated in the y-direction are formed on the x-direction side of fourth semiconductor layer 3d.

Figure 24K:
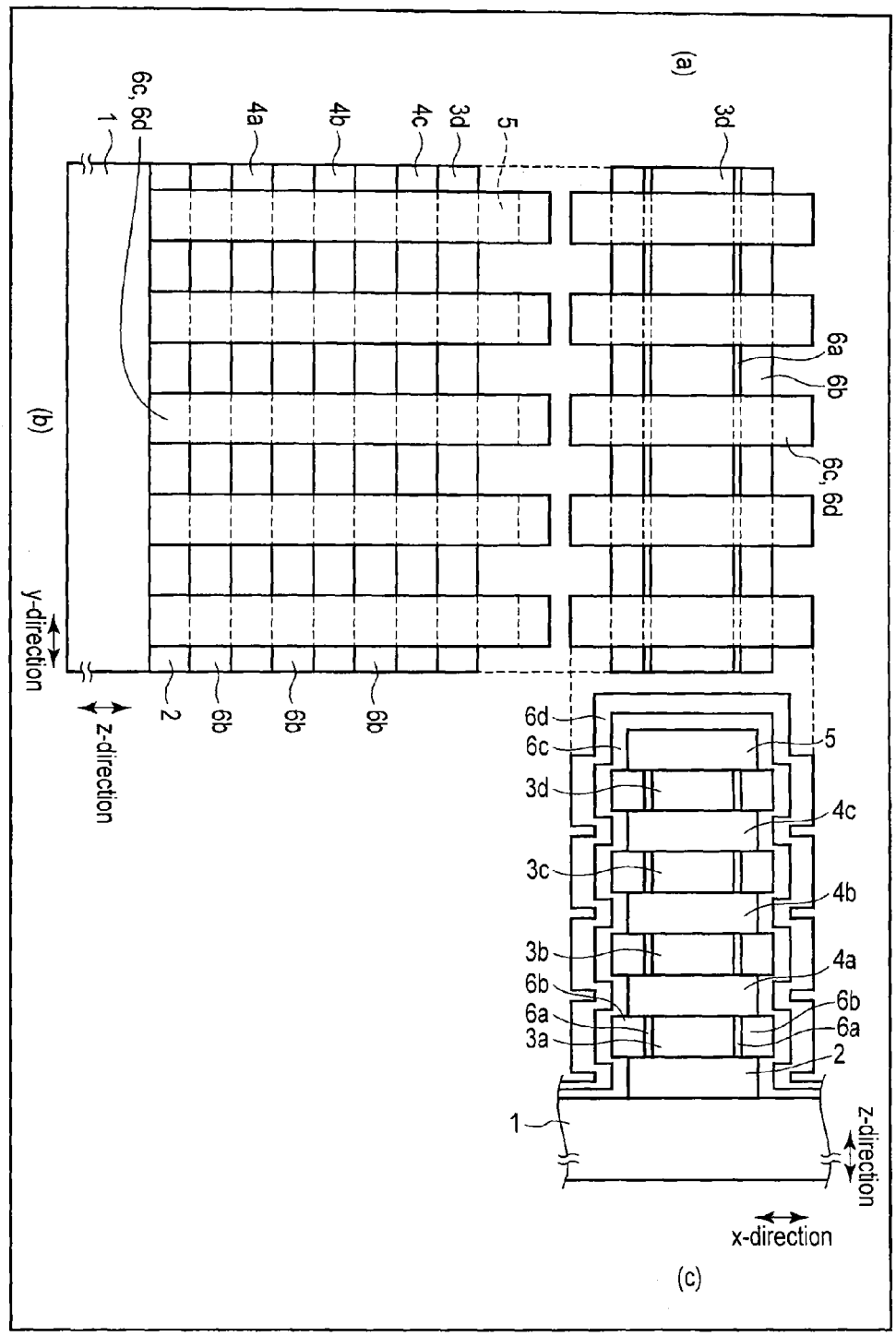

As shown in FIG. 24K, fourth insulating layer 4c is then selectively etched by anisotropic dry etching. At the same time, control gate electrodes 6d, . . . and fourth semiconductor layer 3d function as masks for the anisotropic dry etching.

Therefore, in parts that are not covered by control gate electrodes 6d, . . . and fourth semiconductor layer 3d, fourth insulating layer 4c is selectively removed, and the side surface of third charge storage layer 6b in the z-direction is exposed.

Figure 24L:
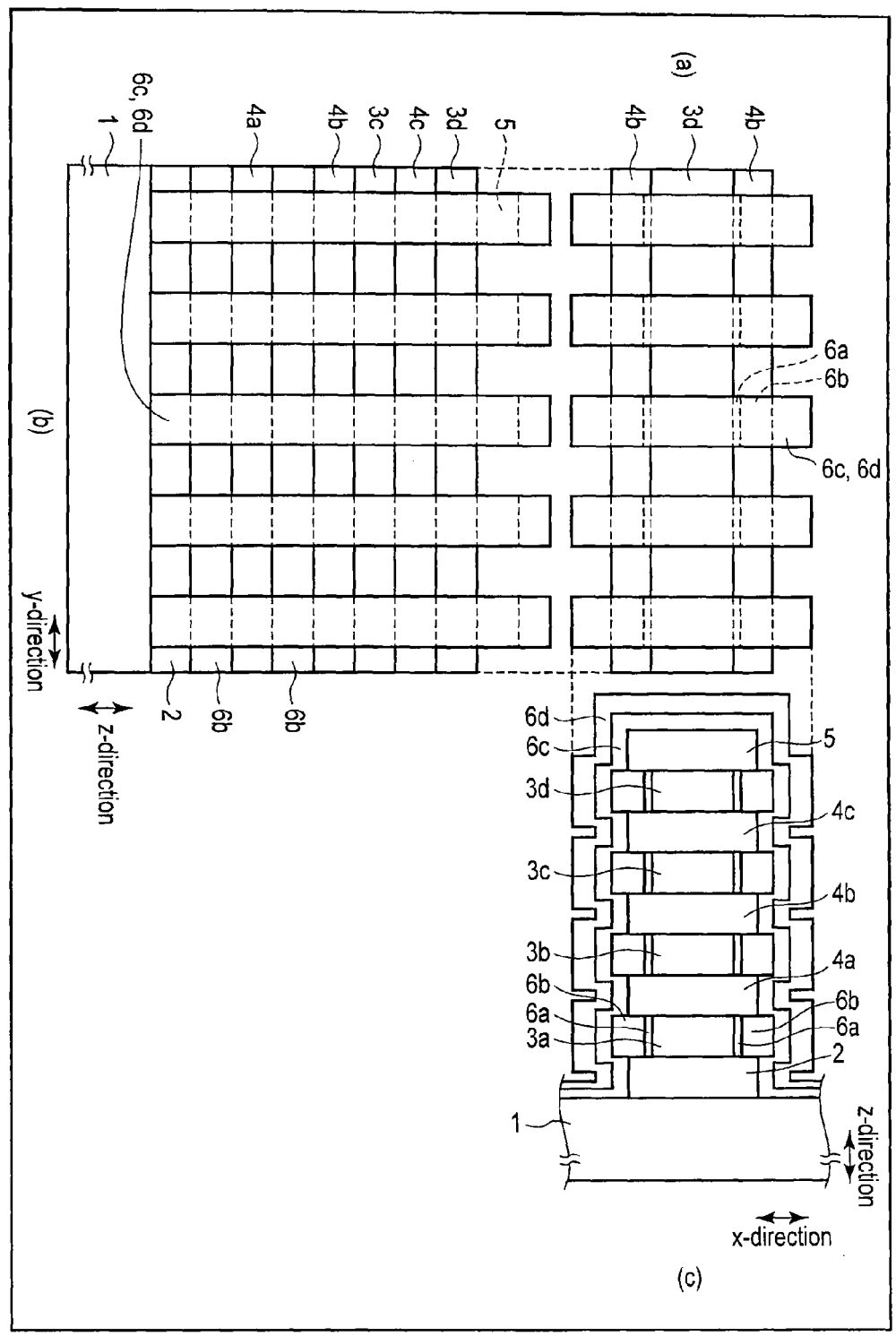

As shown in FIG. 24L, third charge storage layer 6b is then selectively etched by anisotropic dry etching. At the same time, control gate electrodes 6d, . . . and fourth semiconductor layer 3d function as masks for the anisotropic dry etching.

Therefore, as the part of third charge storage layer 6b that is not covered by control gate electrodes 6d, . . . is selectively removed, third charge storage layers 6b, . . . separated in the y-direction are formed on the x-direction side of third semiconductor layer 3c.

Similarly, second charge storage layers 6b, . . . separated in the y-direction are formed on the x-direction side of second semiconductor layer 3b, and first charge storage layers 6b, . . . separated in the y-direction are formed on the x-direction side of first semiconductor layer 3a.

Figure 24M:
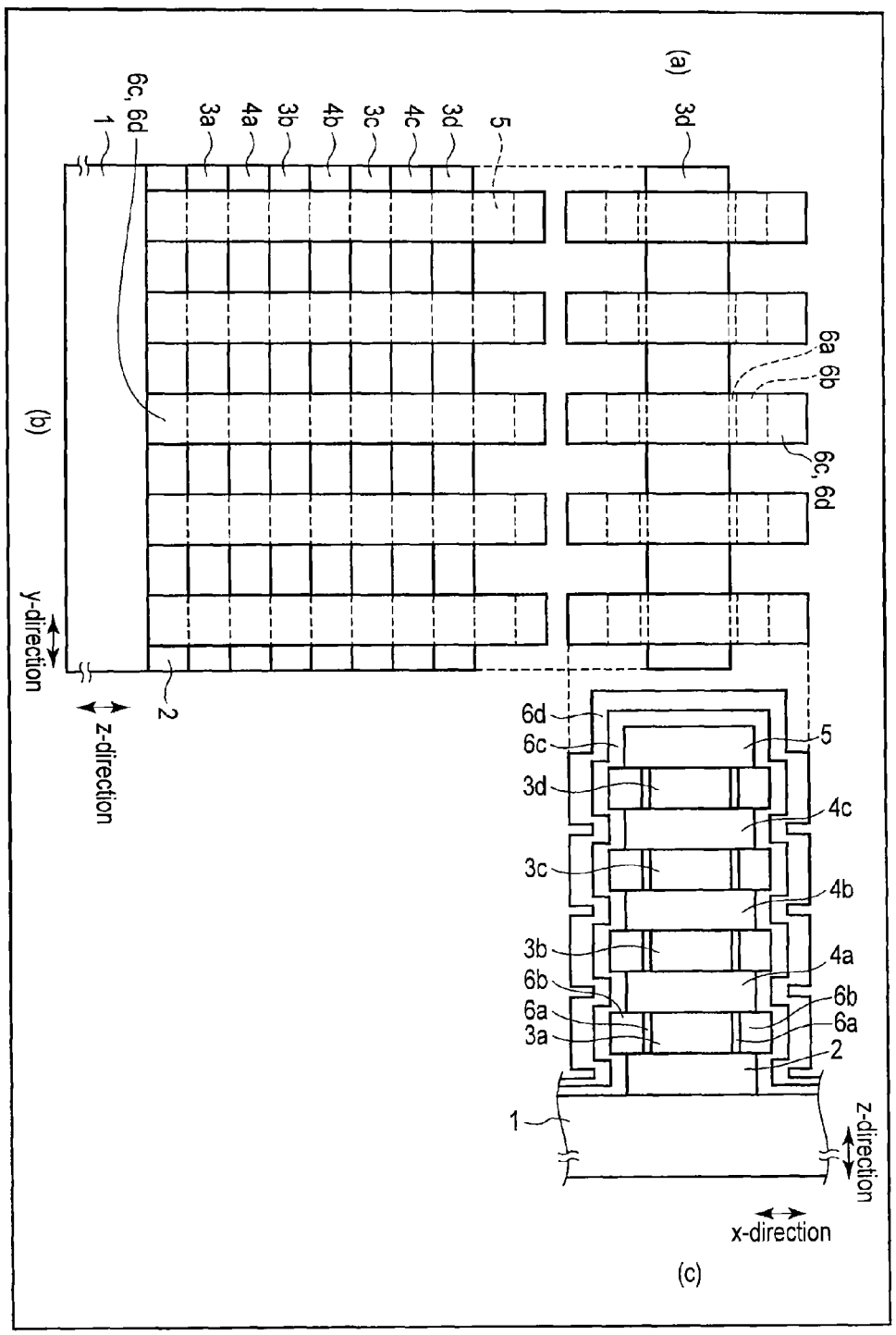

As shown in FIG. 24M, charge storage layers 6b, . . . physically separated for the respective memory cells are formed by the process described above. This prevents a situation where a charge in a charge storage layer moves to another charge storage layer in first to fourth charge storage layers 6b, . . . , so that satisfactory data retention characteristics can be obtained.

In the manufacturing method according to the present embodiment, as apparent from FIG. 24J to FIG. 24L, uppermost fourth semiconductor layer 3d functions as the etching mask during the etching to accomplish the independence of the charge storage layers.

Therefore, it is preferable that fourth semiconductor layer 3d is a dummy layer and that the width of fourth semiconductor layer 3d in the z-direction is greater than the width of each of first to third semiconductor layers 3a to 3c in the z-direction.

G. Summary

As described above, according to the third embodiment, a structure in which charge storage layers are independent for the respective memory cells is formed without a substantial increase in the number of processes, and it is thereby possible to provide high reliability of the three-dimensional stacked layer type semiconductor memory.

3. Others (Fourth Embodiment)

All of the embodiments described above concern a double gate type memory cell in which the charge storage layers are located on both sides of the fin-type stacked layer structure in the x-direction. However, in all of these embodiments, insulating layer 19 can be provided in the fin-type stacked layer structure, and a three-dimensional stacked layer type semiconductor memory having a single gate type memory cell can be formed, as shown in FIG. 25.

Such a structure allows the improvement in the degree of integration of the memory cells and higher capacity of the memory.

Figure 25:
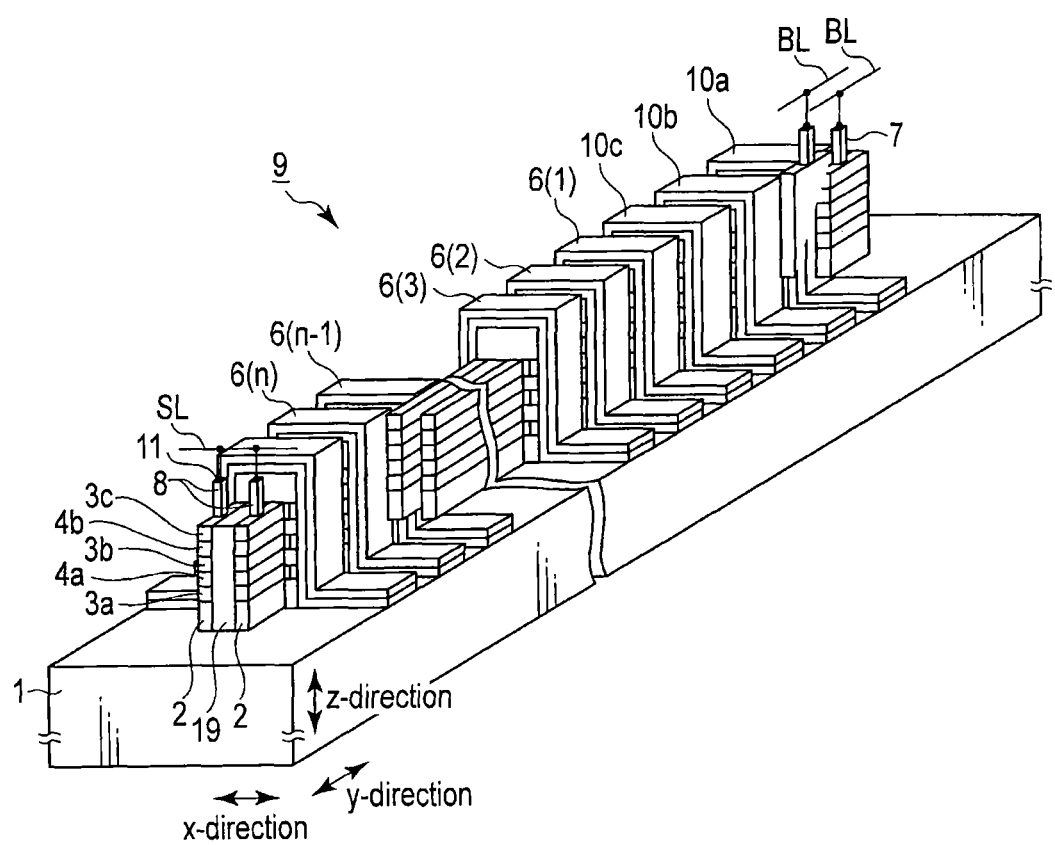
FIG. 25 is a view showing an overall structure of a fourth embodiment.

The same elements in FIG. 25 as those in FIG. 11 are provided with the same reference marks and are thus not described in detail.

4. Conclusion

According to the embodiment, a structure in which charge storage layers are independent for the respective memory cells is formed without a substantial increase in the number of processes, and it is thereby possible to provide high reliability of the three-dimensional stacked layer type semiconductor memory.

The embodiment is industrially enormously advantageous to, for example, a file memory capable of high-speed random writing, a mobile terminal capable of high-speed downloading, a mobile player capable of high-speed downloading, a semiconductor memory for broadcasting devices, a drive recorder, a home video, a high-capacity buffer memory for communication, and a semiconductor memory for a security camera.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   first to n-th semiconductor layers (n is a natural number equal to or more than 2) which are stacked in a first direction perpendicular to a surface of the semiconductor substrate and which extend in a second direction parallel to the surface of the semiconductor substrate;
   an electrode which extends in the first direction along side surfaces of the first to n-th semiconductor layers, the side surfaces of the first to n-th semiconductor layers exposing in a third direction perpendicular to the first and second directions; and
   first to n-th charge storage layers located between the first to n-th semiconductor layers and the electrode respectively,
   wherein the first to n-th charge storage layers are separated from each other in areas between the first to n-th semiconductor layers.

2. The device of claim 1,
   wherein the uppermost layer among the first to n-th semiconductor layers is a dummy layer in which dummy cells as non-memory cells are provided.

3. The device of claim 2,
   wherein a width of the uppermost layer in the first direction is wider than a width of the semiconductor layer except the uppermost layer in the first direction.

4. The device of claim 1,
   wherein the first to n-th charge storage layers are separated by insulators between the first to n-th semiconductor layers.

5. The device of claim 1,
   wherein the first to n-th charge storage layers comprise materials respectively, and the first to n-th charge storage layers are separated by oxides of the materials.

6. The device of claim 1,
   wherein the first to n-th charge storage layers are separated by cavities between the first to n-th semiconductor layers.

7. The device of claim 1,
   wherein the first to n-th charge storage layers are silicon nitride, and are separated by silicon oxynitride.

8. The device of claim 1,
   wherein the first to n-th charge storage layers are covered with the electrode and are independently each other.

9. A nonvolatile semiconductor memory device comprising:
   a semiconductor substrate;
   semiconductor layers which are stacked in a first direction perpendicular to a surface of the semiconductor substrate and which extend in a second direction parallel to the surface of the semiconductor substrate; and
   memory strings which use the semiconductor layers as channels respectively,
   wherein the memory strings comprises electrodes which extend in the first direction along side surfaces of the semiconductor layers and charge storage layers located between the semiconductor layers and the electrodes respectively,
   the side surfaces of the semiconductor layers are exposed in a third direction perpendicular to the first and second directions, and the charge storage layers are separated from each other in areas between the semiconductor layers.

10. The device of claim 9,
wherein the uppermost layer among the semiconductor layers is a dummy layer in which dummy cells as non-memory cells are provided.

11. The device of claim 10,
wherein a width of the uppermost layer in the first direction is wider than a width of the semiconductor layer except the uppermost layer in the first direction.

12. The device of claim 10,
wherein the charge storage layers are separated by insulators between the semiconductor layers.

13. The device of claim 9,
wherein the first to n-th charge storage layers comprise materials respectively, and the first to n-th charge storage layers are separated by oxides of the materials.

14. The device of claim 9,
wherein the charge storage layers are separated by cavities between the semiconductor layers.

15. The device of claim 9,
wherein the charge storage layers are silicon nitride, and are separated by silicon oxynitride.

16. The device of claim 9,
wherein the charge storage layers are covered with the electrodes and are independently each other.

* * * * *